United States Patent
Rajashekhar et al.

(10) Patent No.: US 10,804,291 B1
(45) Date of Patent: Oct. 13, 2020

(54) THREE-DIMENSIONAL MEMORY DEVICE USING EPITAXIAL SEMICONDUCTOR CHANNELS AND A BURIED SOURCE LINE AND METHOD OF MAKING THE SAME

(71) Applicant: SANDISK TECHNOLOGIES LLC, Addison, TX (US)

(72) Inventors: Adarsh Rajashekhar, Santa Clara, CA (US); Fei Zhou, San Jose, CA (US); Rahul Sharangpani, Fremont, CA (US); Raghuveer S. Makala, Campbell, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/407,310

(22) Filed: May 9, 2019

(51) Int. Cl.
| | |
|---|---|
| H01L 27/115 | (2017.01) |
| H01L 27/11582 | (2017.01) |
| H01L 27/1157 | (2017.01) |
| H01L 27/11556 | (2017.01) |
| H01L 27/11524 | (2017.01) |
| H01L 27/1158 | (2017.01) |
| H01L 27/11565 | (2017.01) |
| H01L 27/11519 | (2017.01) |
| H01L 27/11568 | (2017.01) |
| H01L 27/11521 | (2017.01) |

(Continued)

(52) U.S. Cl.
CPC .... *H01L 27/11582* (2013.01); *H01L 27/1157* (2013.01); *H01L 27/1158* (2013.01); *H01L 27/11524* (2013.01); *H01L 27/11556* (2013.01); *H01L 27/11519* (2013.01); *H01L 27/11521* (2013.01); *H01L 27/11526* (2013.01); *H01L 27/11529* (2013.01); *H01L 27/11553* (2013.01); *H01L 27/11565* (2013.01); *H01L 27/11568* (2013.01); *H01L 27/11578* (2013.01)

(58) Field of Classification Search
None
See application file for complete search history.

(56) References Cited

U.S. PATENT DOCUMENTS

| | | |
|---|---|---|
| 5,915,167 A | 6/1999 | Leedy |
| 9,230,980 B2 | 1/2016 | Rabkin et al. |

(Continued)

OTHER PUBLICATIONS

Endoh, T. et al., "Novel Ultra High Density Flash Memory with A Stacked-Surrounding Gate Transistor (S-GT) Structured Cell," IEDM Proc., pp. 33-36, (2001).

(Continued)

*Primary Examiner* — Minh Loan Tran
(74) *Attorney, Agent, or Firm* — The Marbury Law Group PLLC

(57) ABSTRACT

A three-dimensional memory device includes an alternating stack of insulating layers and electrically conductive layers located over a single crystalline semiconductor layer, a single crystal epitaxial source semiconductor layer located between the single crystalline semiconductor layer and the alternating stack and epitaxially aligned to the single crystalline semiconductor layer, and a memory stack structure vertically extending through the alternating stack and containing a memory film and an epitaxial vertical semiconductor channel including a single crystal semiconductor material that is epitaxially aligned to the epitaxial source semiconductor layer at an interface.

20 Claims, 42 Drawing Sheets

(51) Int. Cl.
*H01L 27/11526* (2017.01)
*H01L 27/11578* (2017.01)
*H01L 27/11529* (2017.01)
*H01L 27/11553* (2017.01)

(56) References Cited

U.S. PATENT DOCUMENTS

| | | | |
|---|---|---|---|
| 9,627,395 | B2 | 4/2017 | Zhang et al. |
| 9,799,670 | B2 | 10/2017 | Nishikawa et al. |
| 9,831,266 | B2 | 11/2017 | Kai et al. |
| 9,870,945 | B2 | 1/2018 | Pachamuthu et al. |
| 9,911,748 | B2 * | 3/2018 | Nishikawa ........ H01L 29/41741 |
| 9,917,100 | B2 | 3/2018 | Zhang et al. |
| 9,985,098 | B2 | 5/2018 | Matsumoto et al. |
| 10,008,570 | B2 | 6/2018 | Yu et al. |
| 10,020,363 | B2 | 7/2018 | Ogawa et al. |
| 10,115,681 | B1 | 10/2018 | Ariyoshi |
| 10,121,794 | B2 | 11/2018 | Gunji-Yoneoka et al. |
| 10,199,359 | B1 | 2/2019 | Sakakibara et al. |
| 10,224,340 | B2 | 3/2019 | Hada et al. |
| 10,283,513 | B1 * | 5/2019 | Zhou ............... H01L 21/823487 |
| 10,403,638 | B2 * | 9/2019 | Lee .................. H01L 27/11582 |
| 10,593,693 | B2 * | 3/2020 | Yamazaki ............. H01L 27/249 |
| 2015/0076586 | A1 | 3/2015 | Rabkin et al. |
| 2016/0035742 | A1 | 2/2016 | Kanakamedala et al. |
| 2016/0268209 | A1 | 9/2016 | Pachamuthu et al. |
| 2016/0307908 | A1 | 10/2016 | Sharangpani et al. |
| 2017/0092654 | A1 | 3/2017 | Nishikawa et al. |
| 2017/0148800 | A1 | 5/2017 | Nishikawa et al. |
| 2017/0148810 | A1 | 5/2017 | Kai et al. |
| 2017/0148811 | A1 | 5/2017 | Zhang et al. |
| 2017/0365613 | A1 | 12/2017 | Gunji-Yoneoka et al. |
| 2018/0122904 | A1 | 5/2018 | Matsumoto et al. |
| 2018/0122905 | A1 | 5/2018 | Ogawa et al. |
| 2018/0122906 | A1 | 5/2018 | Yu et al. |
| 2018/0366486 | A1 | 12/2018 | Hada et al. |
| 2018/0374866 | A1 | 12/2018 | Makala et al. |
| 2019/0043830 | A1 | 12/2019 | Sakakibara et al. |

OTHER PUBLICATIONS

U.S. Appl. No. 15/888,714, filed Feb. 5, 2018, SanDisk Technologies LLC.
U.S. Appl. No. 15/997,194, filed Jun. 4, 2018, SanDisk Technologies LLC.
U.S. Appl. No. 16/023,035, filed Jun. 28, 2018, SanDisk Technologies LLC.
U.S. Appl. No. 16/196,026, filed Nov. 20, 2018, SanDisk Technologies LLC.
U.S. Appl. No. 16/200,115, filed Nov. 26, 2018, SanDisk Technologies LLC.
U.S. Appl. No. 16/290,277, filed Mar. 1, 2019, SanDisk Technologies LLC.
U.S. Appl. No. 16/291,673, filed Mar. 4, 2019, SanDisk Technologies LLC.
Notification of Transmittal of the International Search Report and Written Opinion of the International Search Authority for International Patent Application No. PCT/US2019/068640, dated Apr. 27, 2020, 8 pages.

* cited by examiner

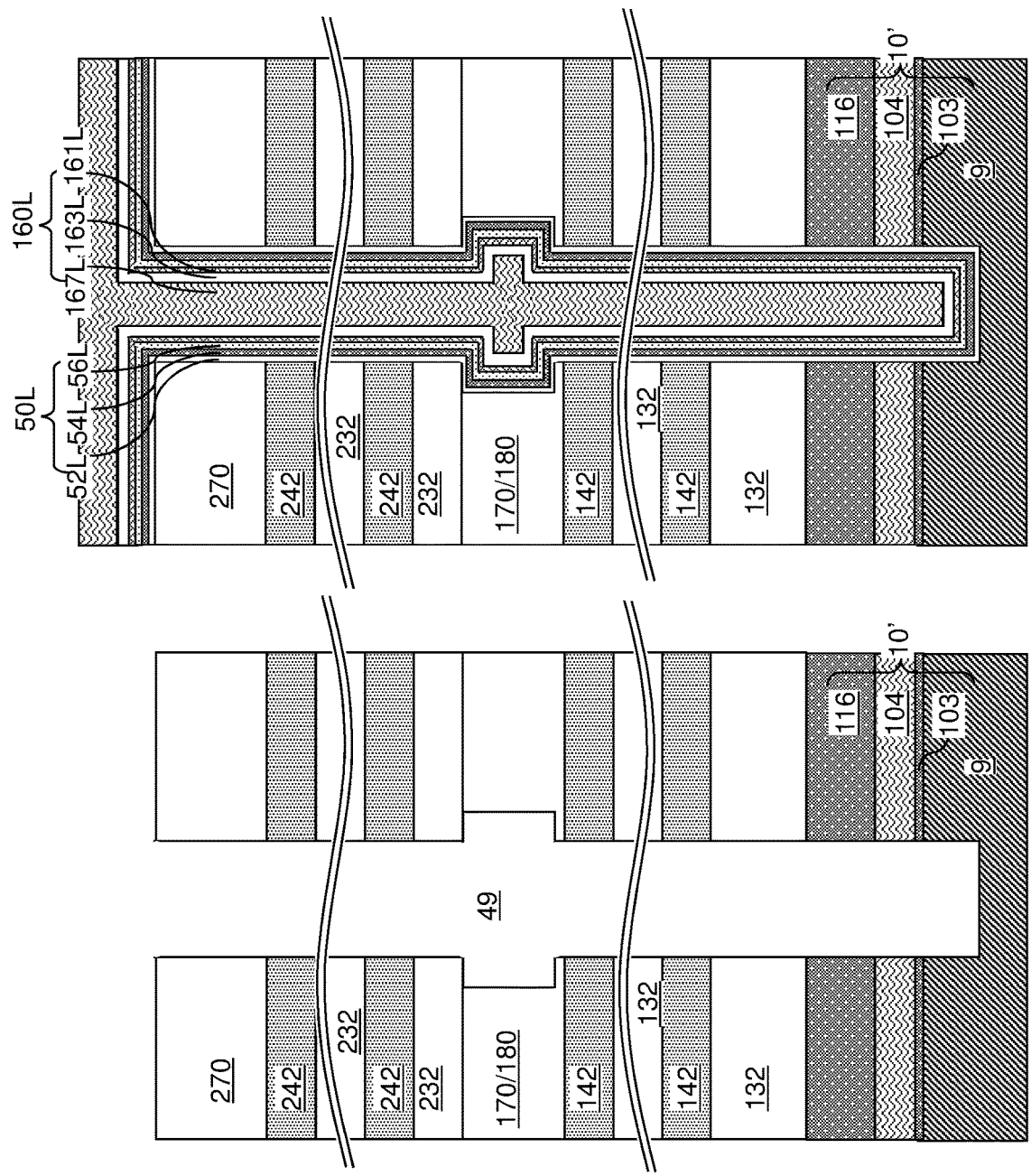

THREE-DIMENSIONAL MEMORY DEVICE USING EPITAXIAL SEMICONDUCTOR CHANNELS AND A BURIED SOURCE LINE AND METHOD OF MAKING THE SAME

FIELD

The present disclosure relates generally to the field of semiconductor devices, and in particular, to a three-dimensional memory device using epitaxial semiconductor channels and a buried source line and methods of manufacturing the same.

BACKGROUND

A three-dimensional memory device including three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an embodiment of the present disclosure, a three-dimensional memory device includes an alternating stack of insulating layers and electrically conductive layers located over a single crystalline semiconductor layer, a single crystal epitaxial source semiconductor layer located between the single crystalline semiconductor layer and the alternating stack and epitaxially aligned to the single crystalline semiconductor layer, and a memory stack structure vertically extending through the alternating stack and containing a memory film and an epitaxial vertical semiconductor channel including a single crystal semiconductor material that is epitaxially aligned to the epitaxial source semiconductor layer at an interface.

According to another embodiment of the present disclosure, a method of forming a three-dimensional semiconductor device is provided, which comprises: forming a source-level sacrificial layer over a single crystalline semiconductor layer; forming an alternating stack of insulating layers and sacrificial material layers over the source-level sacrificial layer; forming a memory opening through the alternating stack; forming an in-process memory opening fill structure comprising a memory film and a sacrificial fill structure in the memory opening; forming a source cavity by removing the source-level sacrificial layer selective to a material in the in-process memory opening fill structure; forming an epitaxial source semiconductor layer in the source cavity by growing a first epitaxial semiconductor material in the source cavity using a first selective epitaxy process; forming a memory cavity by removing the sacrificial fill structure selective to the memory film and the epitaxial source semiconductor layer; forming an epitaxial vertical semiconductor channel in the memory cavity by growing a second epitaxial semiconductor material from surfaces of the epitaxial source material layer through the memory cavity; and replacing the sacrificial material layers with electrically conductive layers.

BRIEF DESCRIPTION OF THE DRAWINGS

FIGS. 8A-8C illustrate sequential vertical cross-sectional views of a memory opening during formation of a sacrificial memory opening fill structure according to an embodiment of the present disclosure.

DETAILED DESCRIPTION

Figure 1:
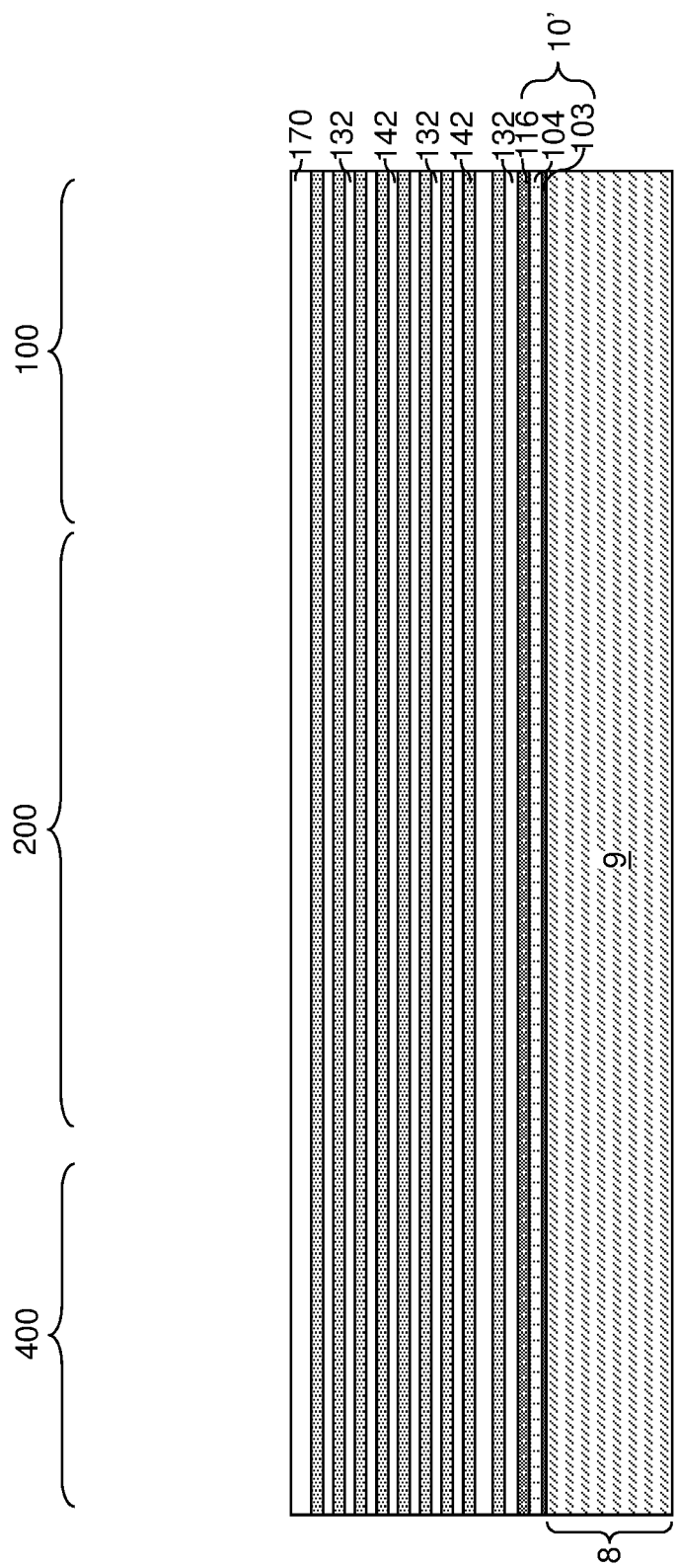
FIG. 1 is a vertical cross-sectional view of an exemplary structure after formation of in-process source-level material layers and a first-tier alternating stack of first insulting layers and first spacer material layers over a single crystalline semiconductor layer according to an embodiment of the present disclosure.

As the number of word line levels increases in a 3D NAND memory device increases, the length of a vertical semiconductor channel of each memory stack structure increases, thereby reducing the on-current for the vertical field effect transistor including the vertical semiconductor channel. Reduction of the on-current for vertical field effect transistors poses a significant challenge to scaling of the 3D NAND stacked memory device for future generations. As discussed above, the embodiments of the present disclosure are directed to a three-dimensional memory device including replacement crystalline channels and methods of making the same, the various aspects of which are discussed in detail hereinbelow. The embodiments provide a memory stack structure capable of providing a higher on-current for memory stack structures of a 3D NAND memory device.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. As used herein, a first element located "on" a second element may be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0 \times 10^{-5}$ S/m to $1.0 \times 10^5$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^7$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to provide electrical conductivity greater than $1.0 \times 10^5$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^7$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The substrate may include integrated circuits fabricated thereon, such as driver circuits for a memory device The various three-dimensional memory devices of the present disclosure include a monolithic three-dimensional NAND string memory device, and may be fabricated using the various embodiments described herein. The monolithic three-dimensional NAND string may be located in a monolithic, three-dimensional array of NAND strings located over the substrate. At least one memory cell in the first device level of the three-dimensional array of NAND strings may be located over another memory cell in the second device level of the three-dimensional array of NAND strings.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many external commands as the total number of dies therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Referring to FIG. 1, an exemplary structure according to an embodiment of the present disclosure is illustrated, which includes a substrate 8 containing a single crystalline semiconductor layer 9. In one embodiment, the single crystalline semiconductor layer 9 may comprise an entirety of a semiconductor wafer or an entirety of a top semiconductor material layer of a semiconductor-on-insulator (SOI) wafer. For example, the single crystalline semiconductor layer 9 may include a single crystalline silicon layer having a Miller index (100), (110), or (111) surface orientation. In one embodiment, the substrate 8 may be a commercially available semiconductor (e.g., single crystal silicon) wafer.

In-process source-level material layers 10' (e.g., layers 103, 104 and 116) may be formed on a top surface of the single crystalline semiconductor layer 9. The in-process source-level material layers 10' may contain a source-level layer stack that includes, from bottom to top, a source-level sacrificial liner 103, a source-level sacrificial layer 104, and a source-level dielectric layer 116.

The source-level sacrificial liner 103 may include a material that may function as an etch stop material during removal of the source-level sacrificial layer 104. For example, the source-level sacrificial liner 103 may include silicon oxide, silicon nitride, and/or a dielectric metal oxide. In one embodiment, the source-level sacrificial liner 103 may include a silicon nitride layer having a thickness in a range from 2 nm to 20 nm, although lesser and greater thicknesses may also be used.

The source-level sacrificial layer 104 may include a sacrificial material that may be removed selective to the source-level sacrificial liner 103 and the source-level dielectric layer 116. In one embodiment, the source-level sacrificial layer 104 may include a semiconductor material such as undoped amorphous silicon or a silicon-germanium alloy with an atomic concentration of germanium greater than 20%. In another embodiment, the source-level sacrificial layer 104 may include a metallic material that may be removed selective to the materials of the source-level sacrificial liner 103 and the source-level dielectric layer 116. For example, the source-level sacrificial layer 104 may include titanium nitride, tantalum nitride, or tungsten nitride. In yet another embodiment, the source-level sacrificial layer 104 may include a dielectric material such as porous or non-porous organosilicate glass or borosilicate glass. The thickness of the source-level sacrificial layer 104 may be in a range from 30 nm to 400 nm, such as from 60 nm to 200 nm, although lesser and greater thicknesses may also be used.

The source-level dielectric layer 116 may include a material that may function as an etch stop material during removal of the source-level sacrificial layer 104. For example, the source-level dielectric layer 116 may include silicon oxide, silicon nitride, and/or a dielectric metal oxide. In one embodiment, the source-level dielectric layer 116 may include a silicon nitride layer or a silicon oxide layer having a thickness in a range from 20 nm to 600 nm, although lesser and greater thicknesses may also be used.

An alternating stack of first material layers and second material layers may be subsequently formed. Each first material layer may include a first material, and each second material layer may include a second material that is different from the first material. In embodiments in which at least another alternating stack of material layers is subsequently formed over the alternating stack of the first material layers and the second material layers, the alternating stack is herein referred to as a first-tier alternating stack. The level of the first-tier alternating stack is herein referred to as a first-tier level, and the level of the alternating stack to be subsequently formed immediately above the first-tier level is herein referred to as a second-tier level, etc.

The first-tier alternating stack may include first insulting layers 132 as the first material layers, and first spacer material layers as the second material layers. In one embodiment, the first spacer material layers may be sacrificial material layers that are subsequently replaced with electrically conductive layers. In another embodiment, the first spacer material layers may be electrically conductive layers that are not subsequently replaced with other layers. While the present disclosure is described using embodiments in which sacrificial material layers are replaced with electrically conductive layers, embodiments in which the spacer material layers are formed as electrically conductive layers (thereby obviating the need to perform replacement processes) are expressly contemplated herein.

In one embodiment, the first material layers and the second material layers may be first insulating layers 132 and first sacrificial material layers 142, respectively. In one embodiment, each first insulating layer 132 may include a first insulating material, and each first sacrificial material layer 142 may include a first sacrificial material. An alternating plurality of first insulating layers 132 and first sacrificial material layers 142 may be formed over the in-process source-level material layers 10'. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness throughout, or may have different thicknesses. The second elements may have the same thickness throughout, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first-tier alternating stack (132, 142) may include first insulating layers 132 composed of the first material, and first sacrificial material layers 142 composed of the second material, which is different from the first material. The first material of the first insulating layers 132 may be at least one insulating material. Insulating materials that may be used for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 may be silicon oxide.

The second material of the first sacrificial material layers 142 may be a sacrificial material that may be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 may be subsequently replaced with electrically conductive electrodes which may function, for example, as control gate electrodes of a vertical NAND device. In one embodiment, the first sacrificial material layers 142 may be material layers that comprise silicon nitride.

In one embodiment, the first insulating layers 132 may include silicon oxide, and sacrificial material layers may include silicon nitride sacrificial material layers. The first material of the first insulating layers 132 may be deposited, for example, by chemical vapor deposition (CVD). For example, if silicon oxide is used for the first insulating layers 132, tetraethylorthosilicate (TEOS) may be used as the precursor material for the CVD process. The second material of the first sacrificial material layers 142 may be formed, for example, CVD or atomic layer deposition (ALD).

The thicknesses of the first insulating layers 132 and the first sacrificial material layers 142 may be in a range from 20 nm to 50 nm, although lesser and greater thicknesses may be used for each first insulating layer 132 and for each first sacrificial material layer 142. The number of repetitions of the pairs of a first insulating layer 132 and a first sacrificial material layer 142 may be in a range from 2 to 1,024, and typically from 8 to 256, although a greater number of repetitions may also be used. In one embodiment, each first sacrificial material layer 142 in the first-tier alternating stack (132, 142) may have a uniform thickness that is substantially invariant within each respective first sacrificial material layer 142.

A first insulating cap layer 170 may be subsequently formed over the first alternating stack (132, 142). The first insulating cap layer 170 may include a dielectric material, which may be any dielectric material that may be used for the first insulating layers 132. In one embodiment, the first insulating cap layer 170 may include the same dielectric material as the first insulating layers 132. The thickness of the first insulating cap layer 170 may be in a range from 20 nm to 300 nm, although lesser and greater thicknesses may also be used.

Figure 2:
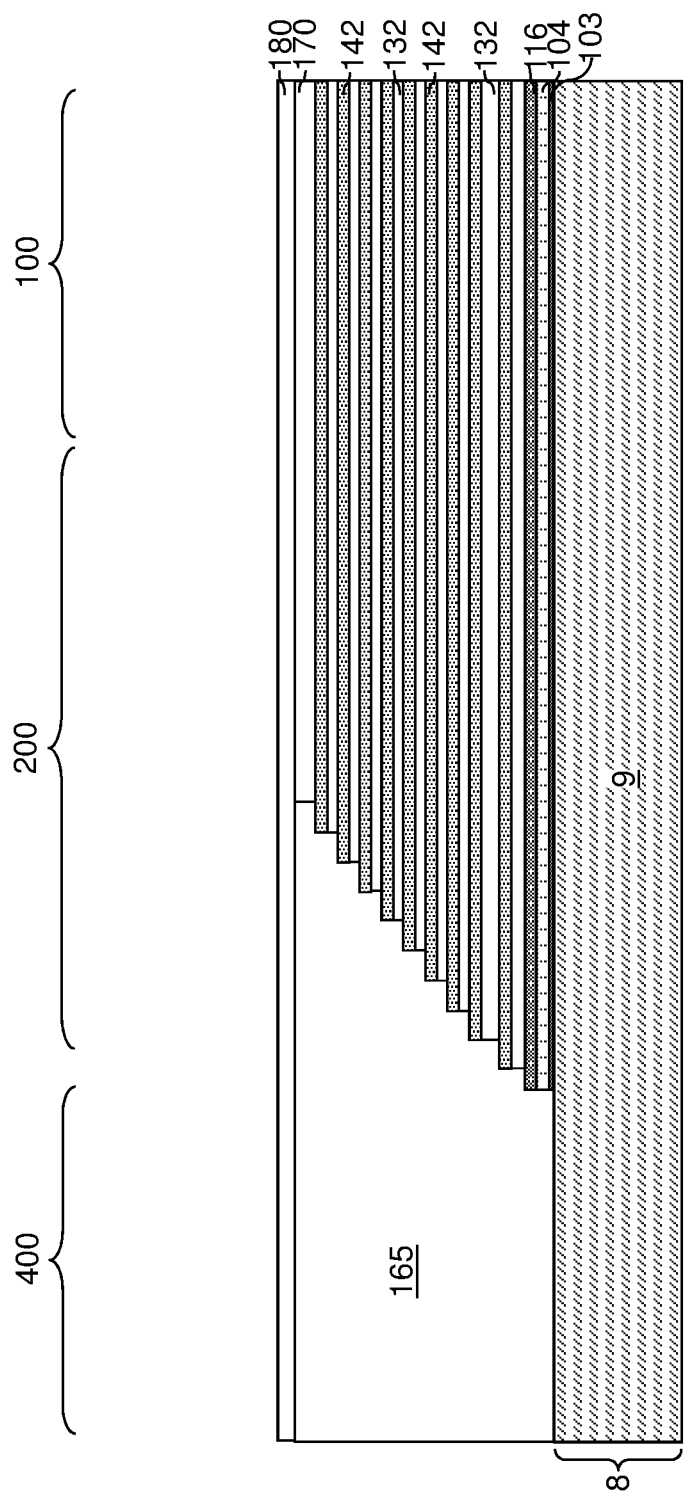
FIG. 2 is a vertical cross-sectional view of the exemplary structure after patterning a first-tier staircase region, a first retro-stepped dielectric material portion, and an inter-tier dielectric layer according to an embodiment of the present disclosure.

Referring to FIG. 2, the first insulating cap layer 170 and the first-tier alternating stack (132, 142) may be patterned to form first stepped surfaces in the staircase region 200 adjacent to a peripheral device region 400. The staircase region 200 may include a respective first stepped area in which the first stepped surfaces may be formed, and a second stepped area in which additional stepped surfaces may be subsequently formed in a second-tier structure (to be subsequently formed over a first-tier structure) and/or additional tier structures. The first stepped surfaces may be formed, for example, by forming a mask layer (not shown) with an opening therein, etching a cavity within the levels of the first insulating cap layer 170, and iteratively expanding the etched area and vertically recessing the cavity by etching each pair of a first insulating layer 132 and a first sacrificial material layer 142 located directly underneath the bottom surface of the etched cavity within the etched area. In one embodiment, top surfaces of the first sacrificial material layers 142 may be physically exposed at the first stepped surfaces. The cavity overlying the first stepped surfaces is herein referred to as a first stepped cavity.

A dielectric fill material (such as undoped silicate glass or doped silicate glass) may be deposited to fill the first stepped cavity. Excess portions of the dielectric fill material may be removed from above the horizontal plane including the top surface of the first insulating cap layer 170. A remaining portion of the dielectric fill material that fills the region overlying the first stepped surfaces constitute a first retro-stepped dielectric material portion 165. As used herein, a "retro-stepped" element refers to an element that has stepped surfaces and a horizontal cross-sectional area that increases monotonically as a function of a vertical distance from a top surface of a substrate on which the element is present. The first-tier alternating stack (132, 142) and the first retro-stepped dielectric material portion 165 collectively constitute a first-tier structure, which is an in-process structure that is subsequently modified.

An inter-tier dielectric layer 180 may be optionally deposited over the first-tier structure (132, 142, 170, 165). The inter-tier dielectric layer 180 may include a dielectric material such as silicon oxide. In one embodiment, the inter-tier dielectric layer 180 may include a doped silicate glass having a greater etch rate than the material of the first insulating layers 132 (which may include an undoped silicate glass). For example, the inter-tier dielectric layer 180 may include phosphosilicate glass. The thickness of the inter-tier dielectric layer 180 may be in a range from 30 nm to 300 nm, although lesser and greater thicknesses may also be used.

Figure 3A:
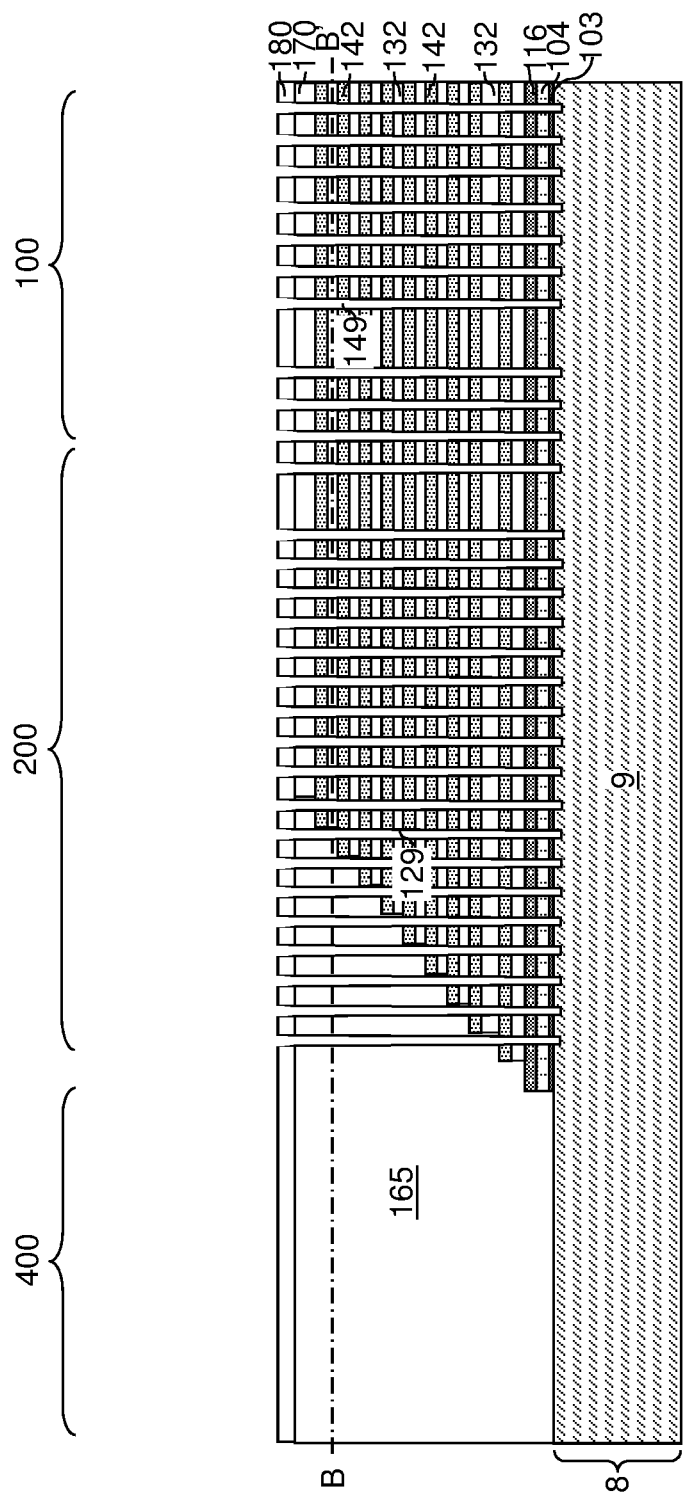
FIG. 3A is a vertical cross-sectional view of the exemplary structure after formation of first-tier memory openings and first-tier support openings according to an embodiment of the present disclosure.
Figure 3B:
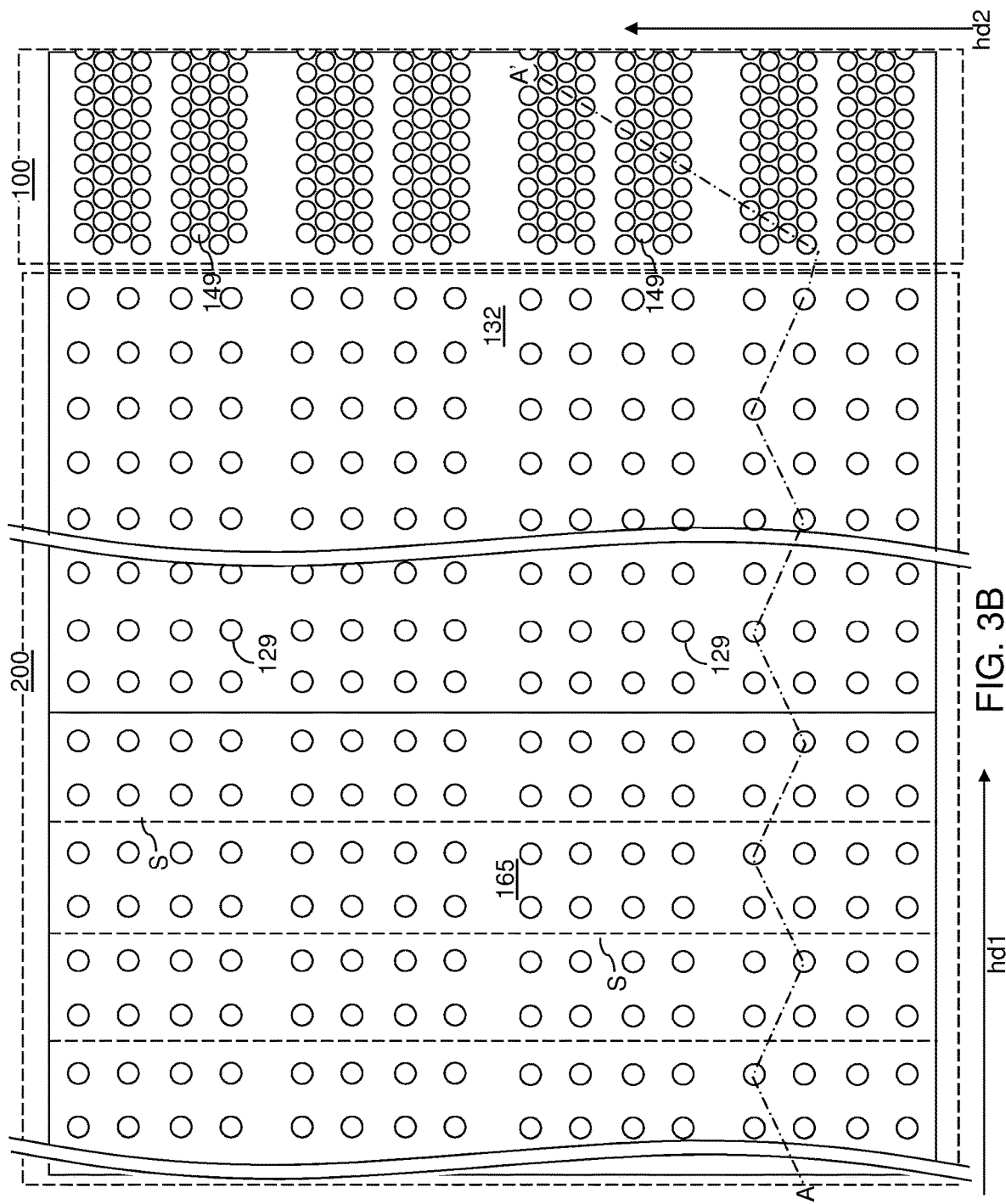
FIG. 3B is a horizontal cross-sectional view of the exemplary structure of FIG. 3A. The hinged vertical plane A-A' corresponds to the plane of the vertical cross-sectional view of FIG. 3A.

Referring to FIGS. 3A and 3B, various first-tier openings (149, 129) may be formed through the inter-tier dielectric layer 180 and the first-tier structure (132, 142, 170, 165) and into the in-process source-level material layers 10' and a top surface of the single crystalline semiconductor layer 9. A photoresist layer (not shown) may be applied over the inter-tier dielectric layer 180, and may be lithographically patterned to form various openings therethrough. The pattern of openings in the photoresist layer may be transferred through the inter-tier dielectric layer 180 and the first-tier structure (132, 142, 170, 165) and into the in-process source-level material layers 10' by a first anisotropic etch process to form the various first-tier openings (149, 129) concurrently, i.e., during the first isotropic etch process. The various first-tier openings (149, 129) may include first-tier memory openings 149 and first-tier support openings 129. Locations of steps S in the first alternating stack (132, 142) are illustrated as dotted lines in FIG. 4B.

The first-tier memory openings 149 may be openings that are formed in the memory array region 100 through each layer within the first alternating stack (132, 142) and may be subsequently used to form memory stack structures therein. The first-tier memory openings 149 may be formed in clusters of first-tier memory openings 149 that are laterally spaced apart along the second horizontal direction hd2. Each cluster of first-tier memory openings 149 may be formed as a two-dimensional array of first-tier memory openings 149.

The first-tier support openings 129 may be openings that are formed in the staircase region 200, and are subsequently used to form support pillar structures. A subset of the first-tier support openings 129 that is formed through the first retro-stepped dielectric material portion 165 may be formed through a respective horizontal surface of the first stepped surfaces.

In one embodiment, the first anisotropic etch process may include an initial step in which the materials of the first-tier alternating stack (132, 142) are etched concurrently with the material of the first retro-stepped dielectric material portion 165. The chemistry of the initial etch step may alternate to optimize etching of the first and second materials in the first-tier alternating stack (132, 142) while providing a comparable average etch rate to the material of the first retro-stepped dielectric material portion 165. The first anisotropic etch process may use, for example, a series of reactive ion etch processes or a single reaction etch process (e.g., $CF_4/O_2/Ar$ etch). The sidewalls of the various first-tier openings (149, 129) may be substantially vertical, or may be tapered.

After etching through the alternating stack (132, 142) and the first retro-stepped dielectric material portion 165, the chemistry of a terminal portion of the first anisotropic etch process may be selected to etch through the in-process source-level material layers 10' and into an upper portion of the single crystalline semiconductor layer 9. A top surface of the single crystalline semiconductor layer 9 may be physically exposed at the bottom of each of the first-tier memory openings 149 and the first-tier support openings 129. The photoresist layer may be subsequently removed, for example, by ashing.

Optionally, the portions of the first-tier memory openings 149 and the first-tier support openings 129 at the level of the inter-tier dielectric layer 180 may be laterally expanded by an isotropic etch. In this case, the inter-tier dielectric layer 180 may comprise a dielectric material (such as borosilicate glass) having a greater etch rate than the first insulating layers 132 (that may include undoped silicate glass) in dilute hydrofluoric acid. An isotropic etch (such as a wet etch using HF) may be used to expand the lateral dimensions of the first-tier memory openings 149 at the level of the inter-tier dielectric layer 180. The portions of the first-tier memory openings 149 located at the level of the inter-tier dielectric layer 180 may be optionally widened to provide a larger landing pad for second-tier memory openings to be subsequently formed through a second-tier alternating stack (to be subsequently formed prior to formation of the second-tier memory openings).

Figure 4:
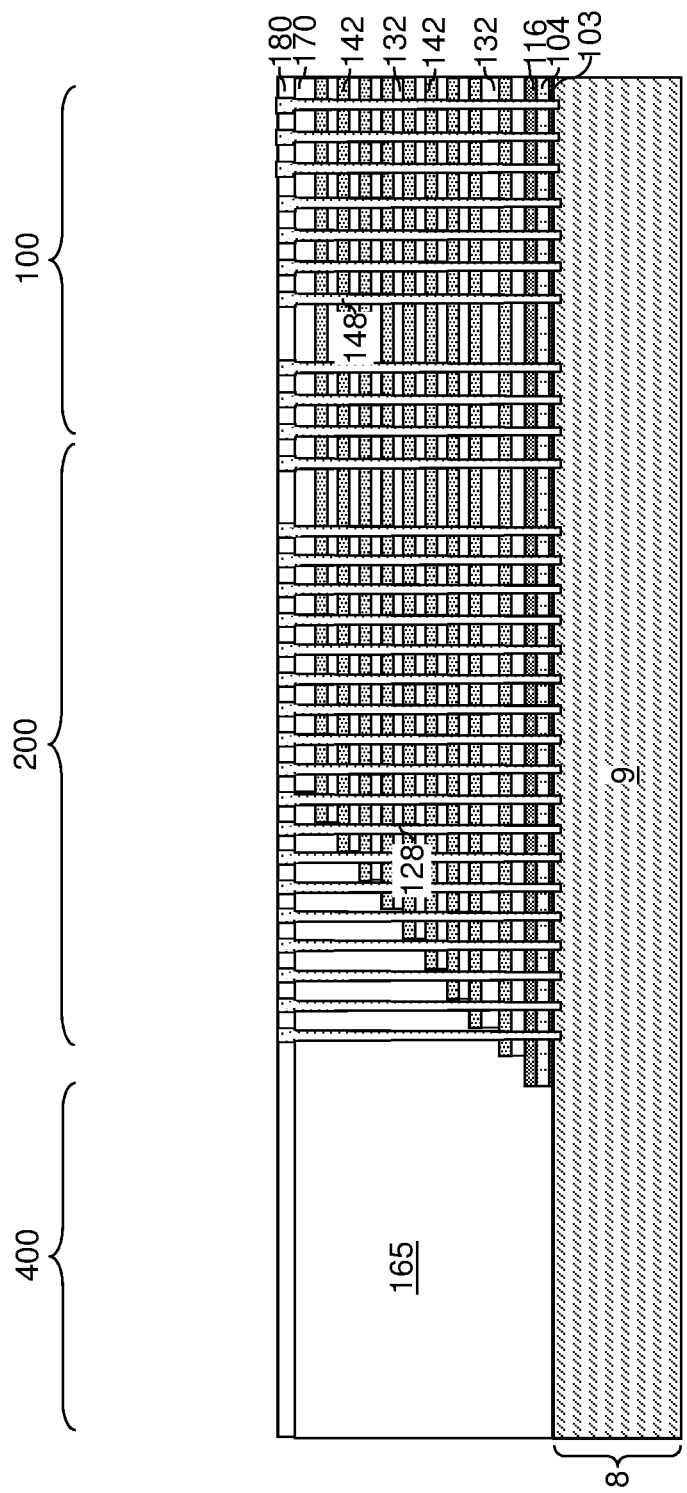
FIG. 4 is a vertical cross-sectional view of the exemplary structure after formation of various sacrificial fill structures according to an embodiment of the present disclosure.

Referring to FIG. 4, sacrificial first-tier opening fill portions (148, 128) may be formed in the various first-tier openings (149, 129). For example, a sacrificial first-tier fill material may be concurrently deposited in each of the first-tier openings (149, 129). The sacrificial first-tier fill material includes a material that may be subsequently removed selective to the materials of the first insulating layers 132 and the first sacrificial material layers 142.

In one embodiment, the sacrificial first-tier fill material may include a semiconductor material such as silicon (e.g., a-Si or polysilicon), a silicon-germanium alloy, germanium, a III-V compound semiconductor material, or a combination thereof. Optionally, a thin etch stop liner (such as a silicon oxide layer or a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In another embodiment, the sacrificial first-tier fill material may include a silicon oxide material having a higher etch rate than the materials of the first insulating layers 132, the first insulating cap layer 170, and the inter-tier dielectric layer 180. For example, the sacrificial first-tier fill material may include borosilicate glass or porous or non-porous organosilicate glass having an etch rate that is at least 100 times higher than the etch rate of densified TEOS oxide (i.e., a silicon oxide material formed by decomposition of tetraethylorthosilicate glass in a chemical vapor deposition process and subsequently densified in an anneal process) in a 100:1 dilute hydrofluoric acid. In this case, a thin etch stop liner (such as a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In yet another embodiment, the sacrificial first-tier fill material may include amorphous silicon or a carbon-containing material (such as amorphous carbon or diamond-like carbon) that may be subsequently removed by ashing, or a silicon-based polymer that may be subsequently removed selective to the materials of the first alternating stack (132, 142).

Portions of the deposited sacrificial material may be removed from above the topmost layer of the first-tier alternating stack (132, 142), such as from above the inter-tier dielectric layer 180. For example, the sacrificial first-tier fill material may be recessed to a top surface of the inter-tier dielectric layer 180 using a planarization process. The planarization process may include a recess etch, chemical mechanical planarization (CMP), or a combination thereof. The top surface of the inter-tier dielectric layer 180 may be used as an etch stop layer or a planarization stop layer.

Remaining portions of the sacrificial first-tier fill material may comprise sacrificial first-tier opening fill portions (148, 128). Specifically, each remaining portion of the sacrificial material in a first-tier memory opening 149 constitutes a sacrificial first-tier memory opening fill portion 148. Each remaining portion of the sacrificial material in a first-tier support opening 129 constitutes a sacrificial first-tier support opening fill portion 128. The various sacrificial first-tier opening fill portions (148, 128) may be concurrently formed, i.e., during a same set of processes including the deposition process that deposits the sacrificial first-tier fill material and the planarization process that removes the first-tier deposition process from above the first alternating stack (132, 142) (such as from above the top surface of the inter-tier dielectric layer 180). The top surfaces of the sacrificial first-tier opening fill portions (148, 128) may be coplanar with the top surface of the inter-tier dielectric layer 180. Each of the sacrificial first-tier opening fill portions (148, 128) may, or may not, include cavities therein.

Figure 5:
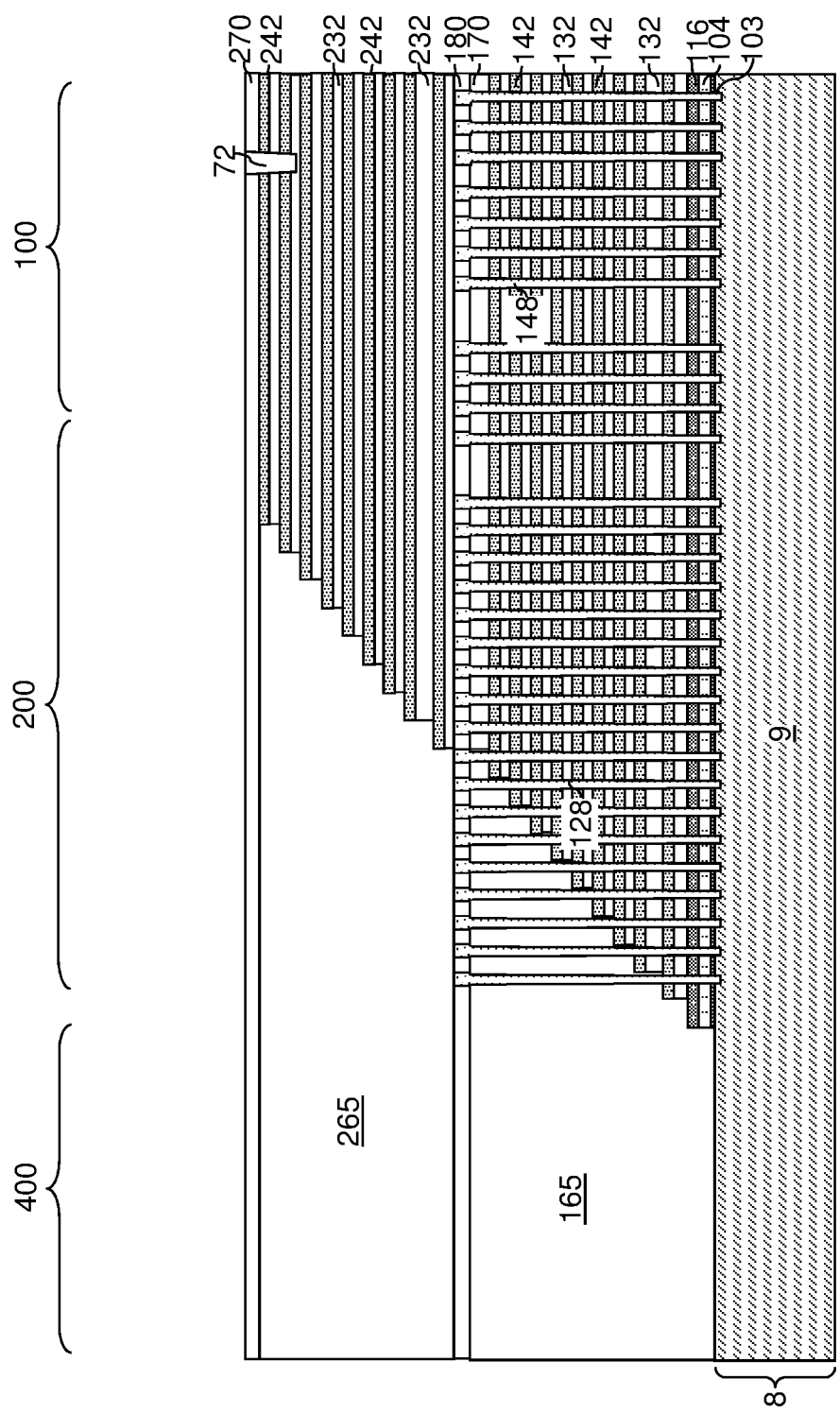
FIG. 5 is a vertical cross-sectional view of the exemplary structure after formation of a second-tier alternating stack of second insulating layers and second spacer material layers, second stepped surfaces, and a second retro-stepped dielectric material portion according to an embodiment of the present disclosure.

Referring to FIG. 5, a second-tier structure may be formed over the first-tier structure (132, 142, 170, 148, 128). The second-tier structure may include an additional alternating stack of insulating layers and spacer material layers, which may be sacrificial material layers. For example, a second alternating stack (232, 242) of material layers may be subsequently formed on the top surface of the first alternating stack (132, 142). The second alternating stack (232, 242) may include an alternating plurality of third material layers and fourth material layers. Each third material layer may include a third material, and each fourth material layer may include a fourth material that is different from the third material. In one embodiment, the third material may be the same as the first material of the first insulating layer 132, and the fourth material may be the same as the second material of the first sacrificial material layers 142.

In one embodiment, the third material layers may be second insulating layers 232 and the fourth material layers may be second spacer material layers that provide vertical spacing between each vertically neighboring pair of the second insulating layers 232. In one embodiment, the third material layers and the fourth material layers may be second insulating layers 232 and second sacrificial material layers 242, respectively. The third material of the second insulating layers 232 may be at least one insulating material. The fourth material of the second sacrificial material layers 242 may be a sacrificial material that may be removed selective to the third material of the second insulating layers 232. The second sacrificial material layers 242 may comprise an insulating material, a semiconductor material, or a conductive material. The fourth material of the second sacrificial material layers 242 may be subsequently replaced with electrically conductive electrodes which may function, for example, as control gate electrodes of a vertical NAND device.

In one embodiment, each second insulating layer 232 may include a second insulating material, and each second sacrificial material layer 242 may include a second sacrificial material. In this case, the second alternating stack (232, 242) may include an alternating plurality of second insulating layers 232 and second sacrificial material layers 242. The third material of the second insulating layers 232 may be deposited, for example, by chemical vapor deposition (CVD). The fourth material of the second sacrificial material layers 242 may be formed, for example, CVD or atomic layer deposition (ALD).

The third material of the second insulating layers 232 may be at least one insulating material. Insulating materials that may be used for the second insulating layers 232 may be any material that may be used for the first insulating layers 132. The fourth material of the second sacrificial material layers 242 may be a sacrificial material that is removed selective to the third material of the second insulating layers 232. Sacrificial materials that may be used for the second sacrificial material layers 242 may be any material that may be used for the first sacrificial material layers 142. In one embodiment, the second insulating material may be the same as the first insulating material, and the second sacrificial material may be the same as the first sacrificial material.

The thicknesses of the second insulating layers 232 and the second sacrificial material layers 242 may be in a range from 20 nm to 50 nm, although lesser and greater thicknesses may be used for each second insulating layer 232 and for each second sacrificial material layer 242. The number of repetitions of the pairs of a second insulating layer 232 and a second sacrificial material layer 242 may be in a range from 2 to 1,024, and typically from 8 to 256, although a greater number of repetitions may also be used. In one embodiment, each second sacrificial material layer 242 in the second alternating stack (232, 242) may have a uniform thickness that is substantially invariant within each respective second sacrificial material layer 242.

Second stepped surfaces in the second stepped area may be formed in the staircase region 200 using a same set of processing steps as the processing steps used to form the first stepped surfaces in the first stepped area with suitable adjustment to the pattern of at least one masking layer. A second retro-stepped dielectric material portion 265 may be formed over the second stepped surfaces in the staircase region 200.

A second insulating cap layer 270 may be subsequently formed over the second alternating stack (232, 242). The second insulating cap layer 270 includes a dielectric material that is different from the material of the second sacrificial material layers 242. In one embodiment, the second insulating cap layer 270 may include silicon oxide. In one embodiment, the first and second sacrificial material layers (142, 242) may comprise silicon nitride.

Generally speaking, at least one alternating stack of insulating layers (132, 232) and spacer material layers (such as sacrificial material layers (142, 242)) may be formed over the in-process source-level material layers 10', and at least one retro-stepped dielectric material portion (165, 265) may be formed over the staircase regions on the at least one alternating stack (132, 142, 232, 242).

Optionally, drain-select-level isolation structures 72 may be formed through a subset of layers in an upper portion of the second-tier alternating stack (232, 242). The second sacrificial material layers 242 that are cut by the drain-select-level isolation structures 72 correspond to the levels in which drain-select-level electrically conductive layers are subsequently formed. The drain-select-level isolation structures 72 include a dielectric material such as silicon oxide. The drain-select-level isolation structures 72 may laterally extend along a first horizontal direction hd1, and may be laterally spaced apart along a second horizontal direction hd2 that is perpendicular to the first horizontal direction hd1. The combination of the second alternating stack (232, 242), the second retro-stepped dielectric material portion 265, the second insulating cap layer 270, and the optional drain-select-level isolation structures 72 collectively constitute a second-tier structure (232, 242, 265, 270, 72).

Figure 6A:
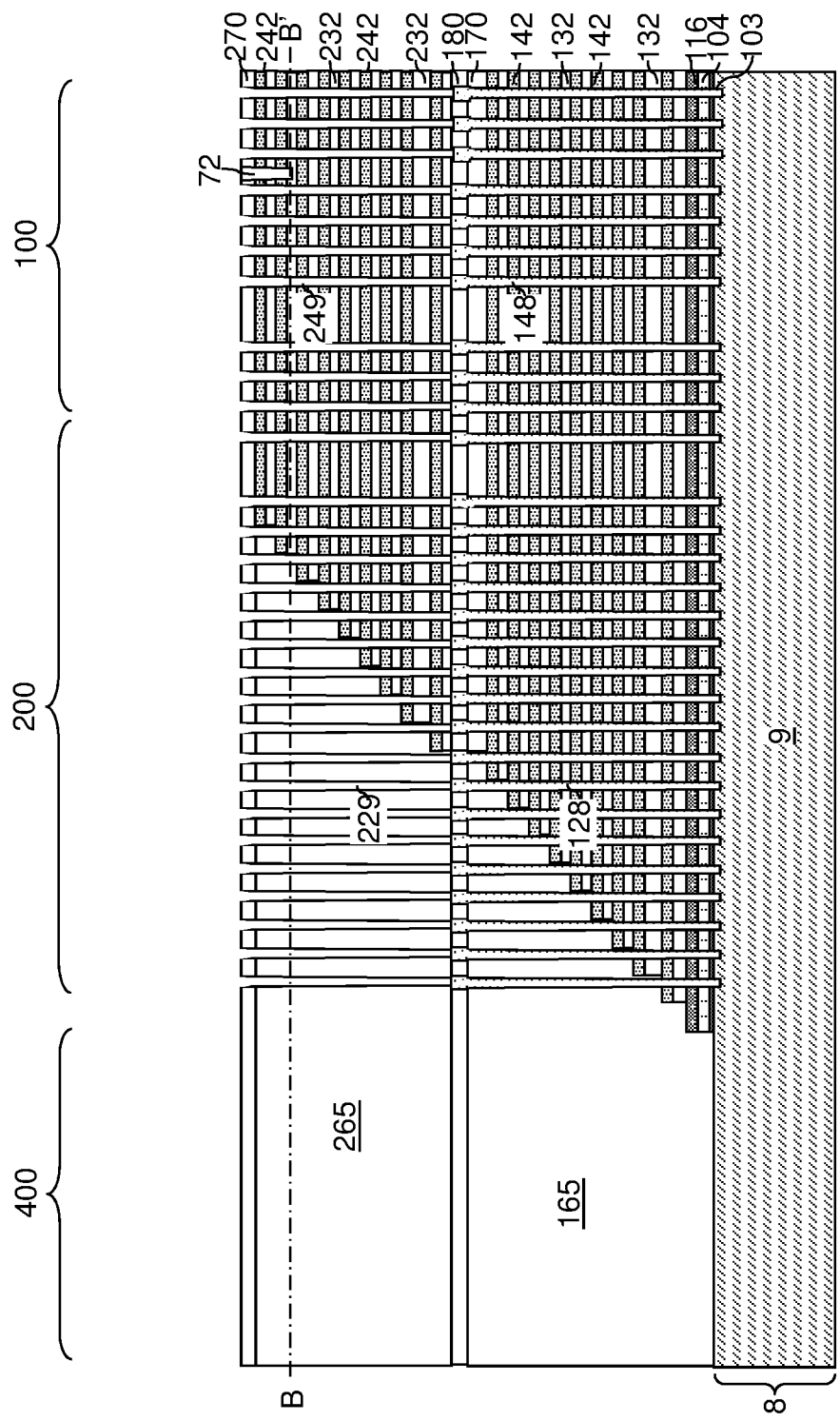
FIG. 6A is a vertical cross-sectional view of the exemplary structure after formation of second-tier memory openings and second-tier support openings according to an embodiment of the present disclosure.
Figure 6B:
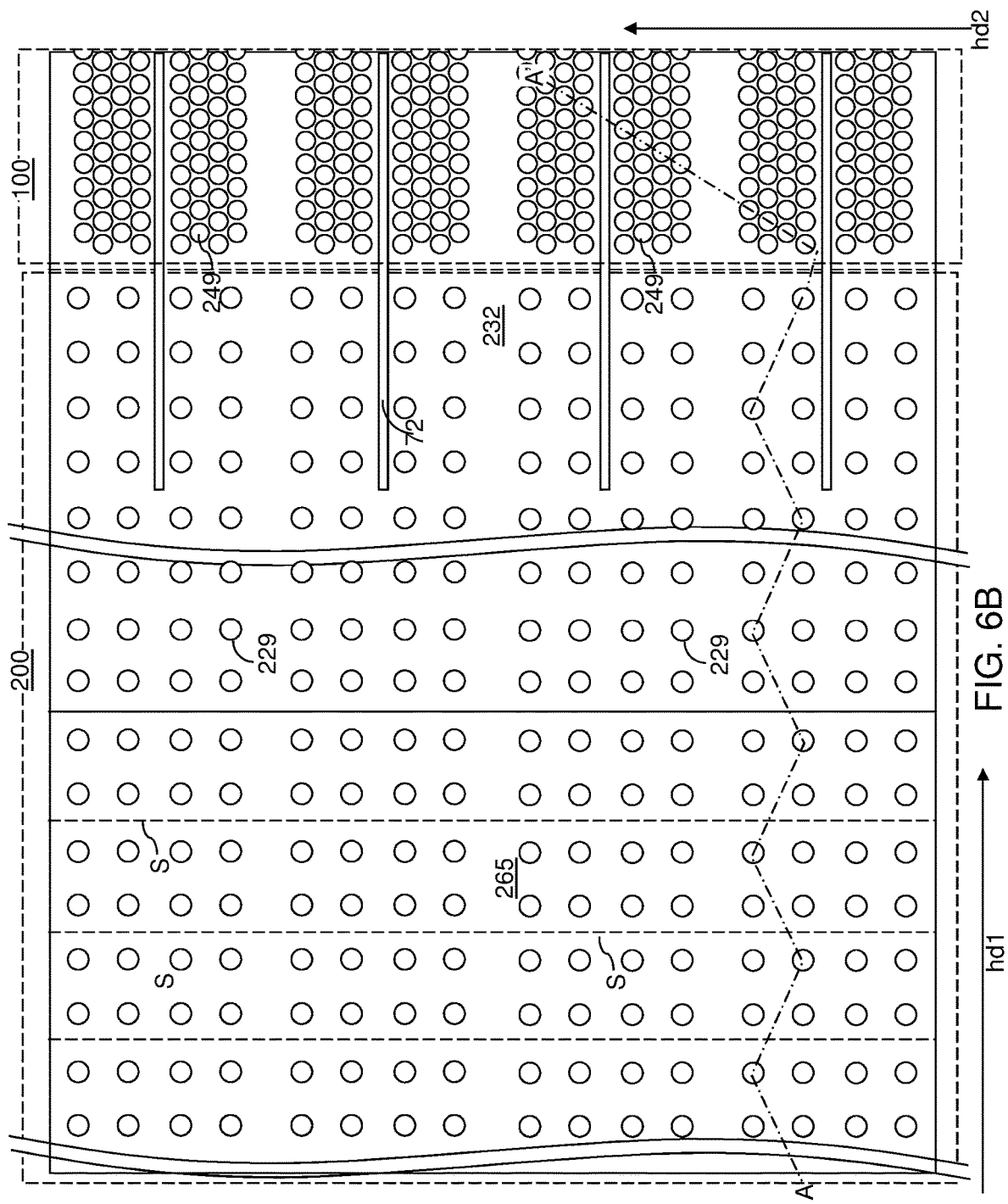
FIG. 6B is a horizontal cross-sectional view of the exemplary structure along the horizontal plane B-B' of FIG. 6A. The hinged vertical plane A-A' corresponds to the plane of the vertical cross-sectional view of FIG. 6A.

Referring to FIGS. 6A and 6B, various second-tier openings (249, 229) may be formed through the second-tier structure (232, 242, 265, 270, 72). A photoresist layer (not shown) may be applied over the second insulating cap layer 270, and may be lithographically patterned to form various openings therethrough. The pattern of the openings may be the same as the pattern of the various first-tier openings (149, 129), which is the same as the sacrificial first-tier opening fill portions (148, 128). Thus, the lithographic mask used to pattern the first-tier openings (149, 129) may be used to pattern the photoresist layer.

The pattern of openings in the photoresist layer may be transferred through the second-tier structure (232, 242, 265, 270, 72) by a second anisotropic etch process to form various second-tier openings (249, 229) concurrently, i.e., during the second anisotropic etch process. The various second-tier openings (249, 229) may include second-tier memory openings 249 and second-tier support openings 229.

The second-tier memory openings 249 may be formed directly on a top surface of a respective one of the sacrificial first-tier memory opening fill portions 148. The second-tier support openings 229 may be formed directly on a top surface of a respective one of the sacrificial first-tier support opening fill portions 128. Further, each second-tier support openings 229 may be formed through a horizontal surface within the second stepped surfaces, which include the interfacial surfaces between the second alternating stack (232, 242) and the second retro-stepped dielectric material portion 265. Locations of steps S in the first-tier alternating stack (132, 142) and the second-tier alternating stack (232, 242) are illustrated as dotted lines in FIG. 7B.

The second anisotropic etch process may include an etch step in which the materials of the second-tier alternating stack (232, 242) are etched concurrently with the material of the second retro-stepped dielectric material portion 265. The chemistry of the etch step may alternate to optimize etching of the materials in the second-tier alternating stack (232, 242) while providing a comparable average etch rate to the material of the second retro-stepped dielectric material portion 265. The second anisotropic etch process may use, for example, a series of reactive ion etch processes or a single reaction etch process (e.g., $CF_4/O_2/Ar$ etch). The sidewalls of the various second-tier openings (249, 229) may be substantially vertical, or may be tapered. A bottom periphery of each second-tier opening (249, 229) may be laterally offset, and/or may be located entirely within, a periphery of a top surface of an underlying sacrificial first-tier opening fill portion (148, 128). The photoresist layer may be subsequently removed, for example, by ashing.

Figure 7:
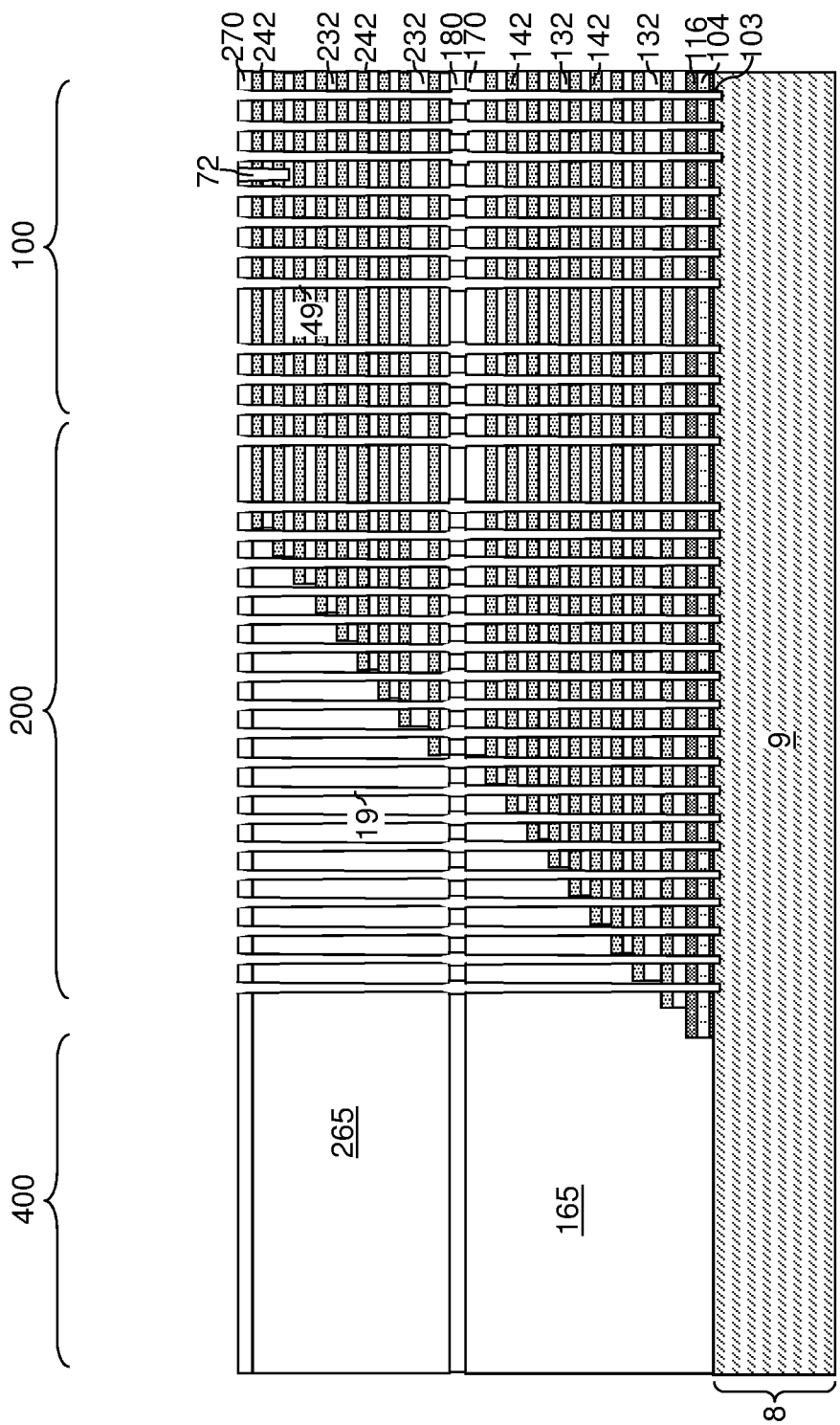
FIG. 7 is a vertical cross-sectional view of the exemplary structure after formation of inter-tier memory openings and inter-tier support openings according to an embodiment of the present disclosure.

Referring to FIG. 7, the sacrificial first-tier fill material of the sacrificial first-tier opening fill portions (148, 128) may be removed using an etch process that etches the sacrificial first-tier fill material selective to the materials of the first and second insulating layers (132, 232), the first and second sacrificial material layers (142, 242), the first and second insulating cap layers (170, 270), and the inter-tier dielectric layer 180. A memory opening 49, which is also referred to as an inter-tier memory opening 49, may be formed in each combination of a second-tier memory openings 249 and a volume from which a sacrificial first-tier memory opening fill portion 148 is removed. A support opening 19, which is also referred to as an inter-tier support opening 19, may be formed in each combination of a second-tier support openings 229 and a volume from which a sacrificial first-tier support opening fill portion 128 is removed.

Figure 8C:
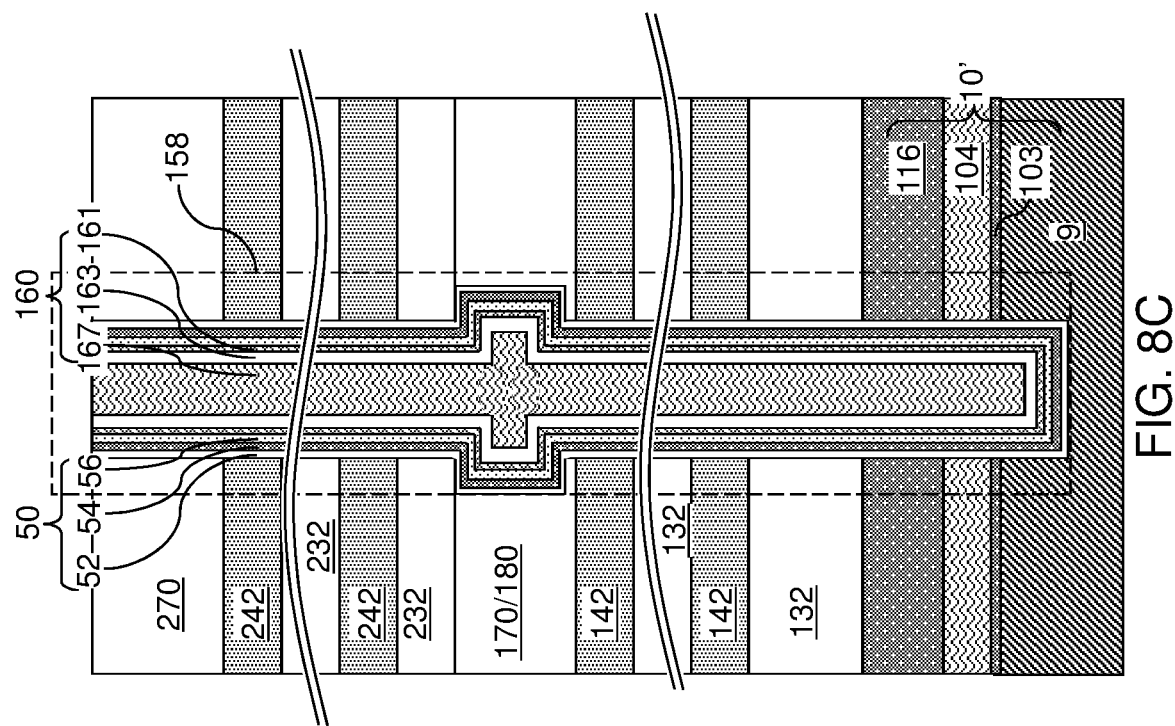

FIGS. 8A-8C provide sequential cross-sectional views of a memory opening 49 during formation of a memory opening fill structure. The same structural change occurs in each of the memory openings 49 and the support openings 19.

Referring to FIG. 8A, a memory opening 49 in the first exemplary device structure of FIG. 7 is illustrated. The memory opening 49 may extend through the first-tier structure and the second-tier structure.

Referring to FIG. 8B, a stack of layers including a continuous memory film 50L and sacrificial fill material layers 160L may be deposited in each of the memory openings 49 and in each of the support openings 19. The continuous memory film 50L may include a continuous blocking dielectric layer 52L, a continuous charge storage layer 54L, a continuous tunneling dielectric layer 56L. The continuous blocking dielectric layer 52L may include a single dielectric material layer or a stack of a plurality of dielectric material layers. In one embodiment, the blocking dielectric layer may include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the continuous blocking dielectric layer 52L may include a dielectric metal oxide having a dielectric constant greater than 7.9, i.e., having a dielectric constant greater than the dielectric constant of silicon nitride. The thickness of the dielectric metal oxide layer may be in a range from 1 nm to 20 nm, although lesser and greater thicknesses may also be used. The dielectric metal oxide layer may subsequently function as a dielectric material portion that blocks leakage of stored electrical charges to control gate electrodes. In one embodiment, the continuous blocking dielectric layer 52L includes aluminum oxide. Alternatively, or additionally, the continuous blocking dielectric layer 52L may include a dielectric semiconductor compound such as silicon oxide, silicon oxynitride, silicon nitride, or a combination thereof.

Subsequently, the continuous charge storage layer 54L may be formed. In one embodiment, the continuous charge storage layer 54L may be a continuous layer or patterned discrete portions of a charge trapping material including a dielectric charge trapping material, which may be, for example, silicon nitride. Alternatively, the continuous charge storage layer 54L may include a continuous layer or patterned discrete portions of a conductive material such as doped polysilicon or a metallic material that is patterned into multiple electrically isolated portions (e.g., floating gates), for example, by being formed within lateral recesses into sacrificial material layers (142, 242). In one embodiment, the continuous charge storage layer 54L includes a silicon nitride layer. In one embodiment, the sacrificial material layers (142, 242) and the insulating layers (132, 232) may have vertically coincident sidewalls, and the continuous charge storage layer 54L may be formed as a single continuous layer. Alternatively, the sacrificial material layers (142, 242) may be laterally recessed with respect to the sidewalls of the insulating layers (132, 232), and a combination of a deposition process and an anisotropic etch process may be used to form the continuous charge storage layer 54L as a plurality of memory material portions that are vertically spaced apart. The thickness of the continuous charge storage layer 54L may be in a range from 2 nm to 20 nm, although lesser and greater thicknesses may also be used.

The continuous tunneling dielectric layer 56L may include a dielectric material through which charge tunneling may be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The continuous tunneling dielectric layer 56L may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the continuous tunneling dielectric layer 56L may include a stack of a first silicon oxide layer, a silicon oxynitride layer, and a second silicon oxide layer, which is commonly known as an ONO stack. In one embodiment, the continuous tunneling dielectric layer 56L may include a silicon oxide layer that is substantially free of carbon or a silicon oxynitride layer that is substantially free of carbon. The thickness of the continuous tunneling dielectric layer 56L may be in a range from 2 nm to 20 nm, although lesser and greater thicknesses may also be used. The stack of the continuous blocking dielectric layer 52L, the continuous charge storage layer 54L, and the continuous tunneling dielectric layer 56L constitutes a memory film 50 that stores memory bits.

The sacrificial fill material layers 160L may include, for example, a semiconductor liner layer 161L, a silicon oxide liner layer 163L, and a sacrificial core fill material layer 167L. The semiconductor liner layer 161L may include a semiconductor material such as amorphous silicon or polysilicon, and may have a thickness in a range from 3 nm to 30 nm, although lesser and greater thicknesses may also be used. The silicon oxide liner layer 163L may include silicon oxide, and may have a thickness in a range from 3 nm to 30 nm, although lesser and greater thicknesses may also be used. The sacrificial core fill material layer 167L may include a sacrificial material that may be removed selective to the silicon oxide liner layer 163L. For example, the sacrificial core fill material layer 167L may include a semiconductor material such as amorphous silicon, polysilicon, or a silicon-germanium alloy, a carbon-based material such as amorphous carbon or diamond-like carbon, a porous or non-porous organosilicate glass, or a polymer material. The thickness of the sacrificial core fill material layer 167L may fill remaining voids within the memory openings 49 and within the support openings 19.

Referring to FIG. 8C, portions of the continuous memory film 50L the sacrificial fill material layers 160L that overlie the top surface of the second insulating cap layer 270 may be removed by a planarization process. The planarization process may use at least one recess etch process and/or a chemical mechanical planarization process. Each memory opening 49 may be filled with an in-process memory opening fill structure 158, and each support opening 19 may be filled with an in-process support pillar structure. Each in-process memory opening fill structure 158 may include a memory film 50 and a sacrificial fill structure 160. Each memory film 50 may include a blocking dielectric layer 52, a charge storage layer 54, and a tunneling dielectric layer 56. Each blocking dielectric layer 52 that is a patterned remaining portion of the continuous blocking dielectric layer 52L. Each charge storage layer 54 is a patterned remaining portion of the continuous charge storage layer 54L. Each tunneling dielectric layer 56 is a patterned remaining portion of the continuous tunneling dielectric layer 56L. Each sacrificial fill structure 160 may include a semiconductor liner 161 contacting an inner sidewall of the memory film 50, a silicon oxide liner 163 contacting an inner sidewall of the semiconductor liner 161; and a sacrificial core fill portion 167 located within the silicon oxide liner 163. Each semiconductor liner 161 comprises a patterned remaining portion of the semiconductor liner layer 161L. Each silicon oxide liner 163 comprises a patterned remaining portion of the silicon oxide liner layer 163L. Each sacrificial core fill portion 167 comprises a patterned remaining portion of the sacrificial core fill material layer 167L.

Figure 9A:
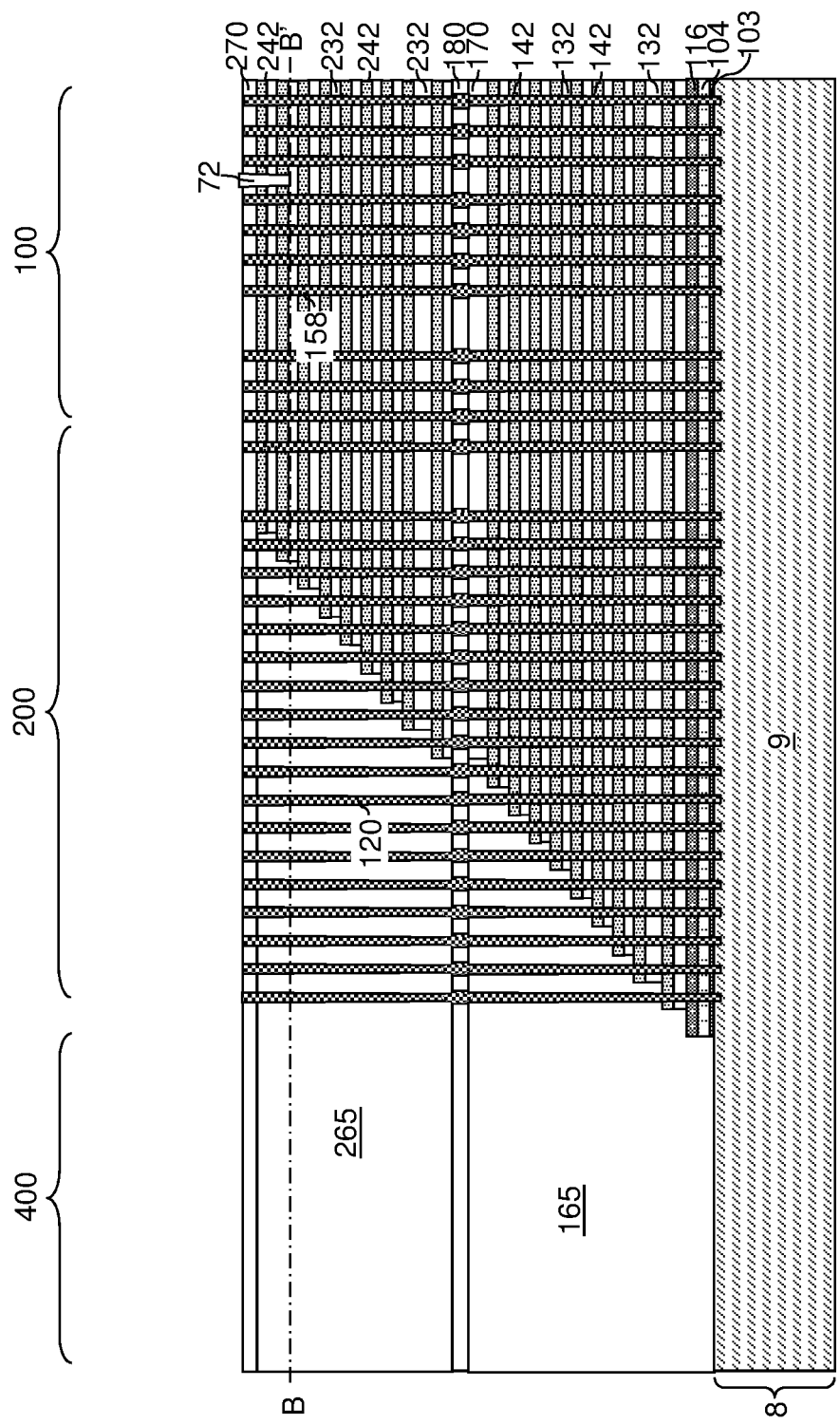
FIG. 9A is a vertical cross-sectional view of the exemplary structure after formation of sacrificial memory opening fill structures and sacrificial support pillar structures according to an embodiment of the present disclosure.
Figure 9B:
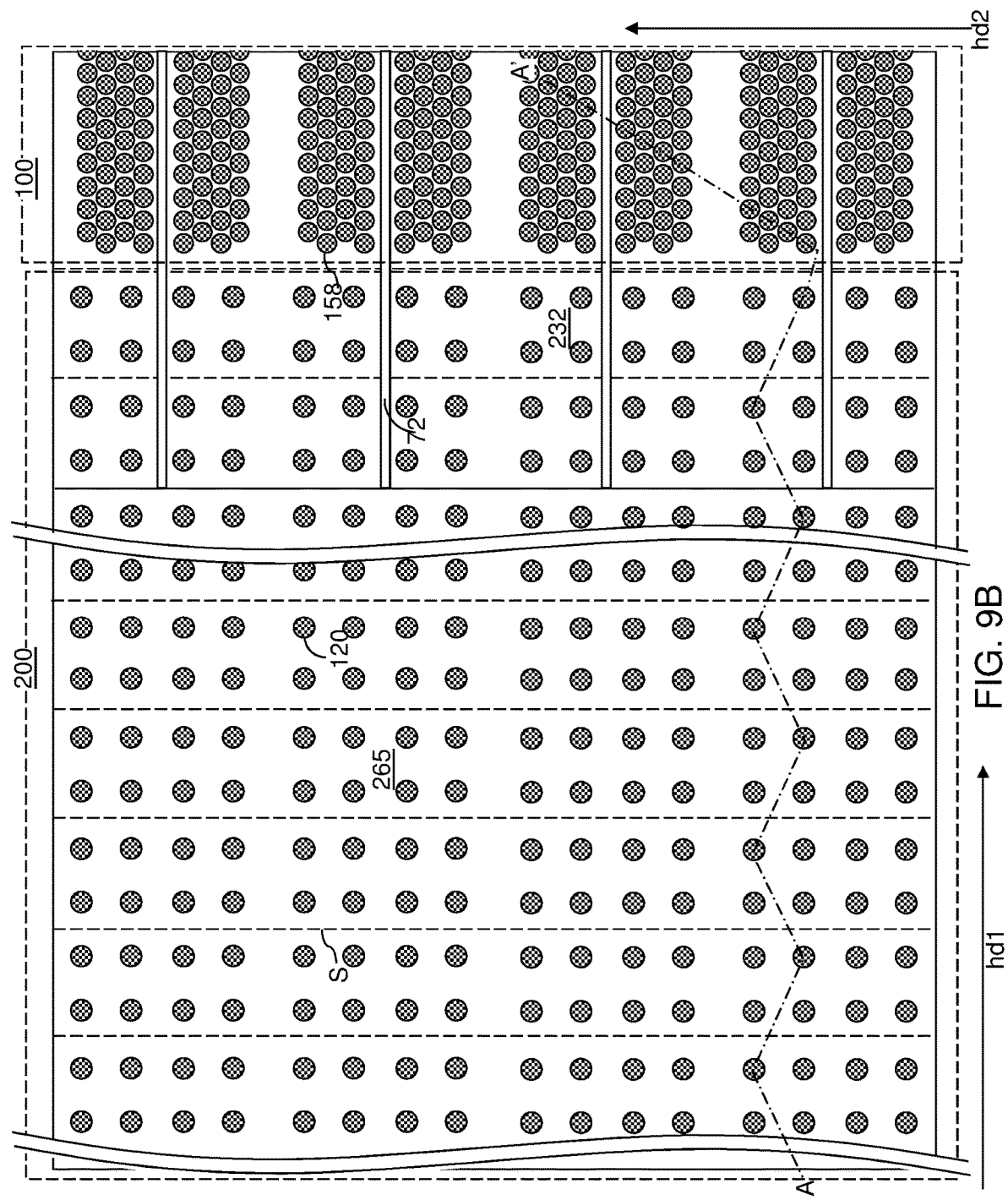
FIG. 9B is a horizontal cross-sectional view of the exemplary structure along the horizontal plane B-B' of FIG. 9A. The hinged vertical plane A-A' corresponds to the plane of the vertical cross-sectional view of FIG. 9A.

Referring to FIGS. 9A and 9B, the exemplary structure is illustrated after the processing steps of FIG. 8C. The exemplary structure may include in-process memory opening fill structures 158 and in-process support pillar structures 120. Each in-process support pillar structure 120 may have a same set of structural components as an in-process memory opening fill structure 158.

Figure 10A:
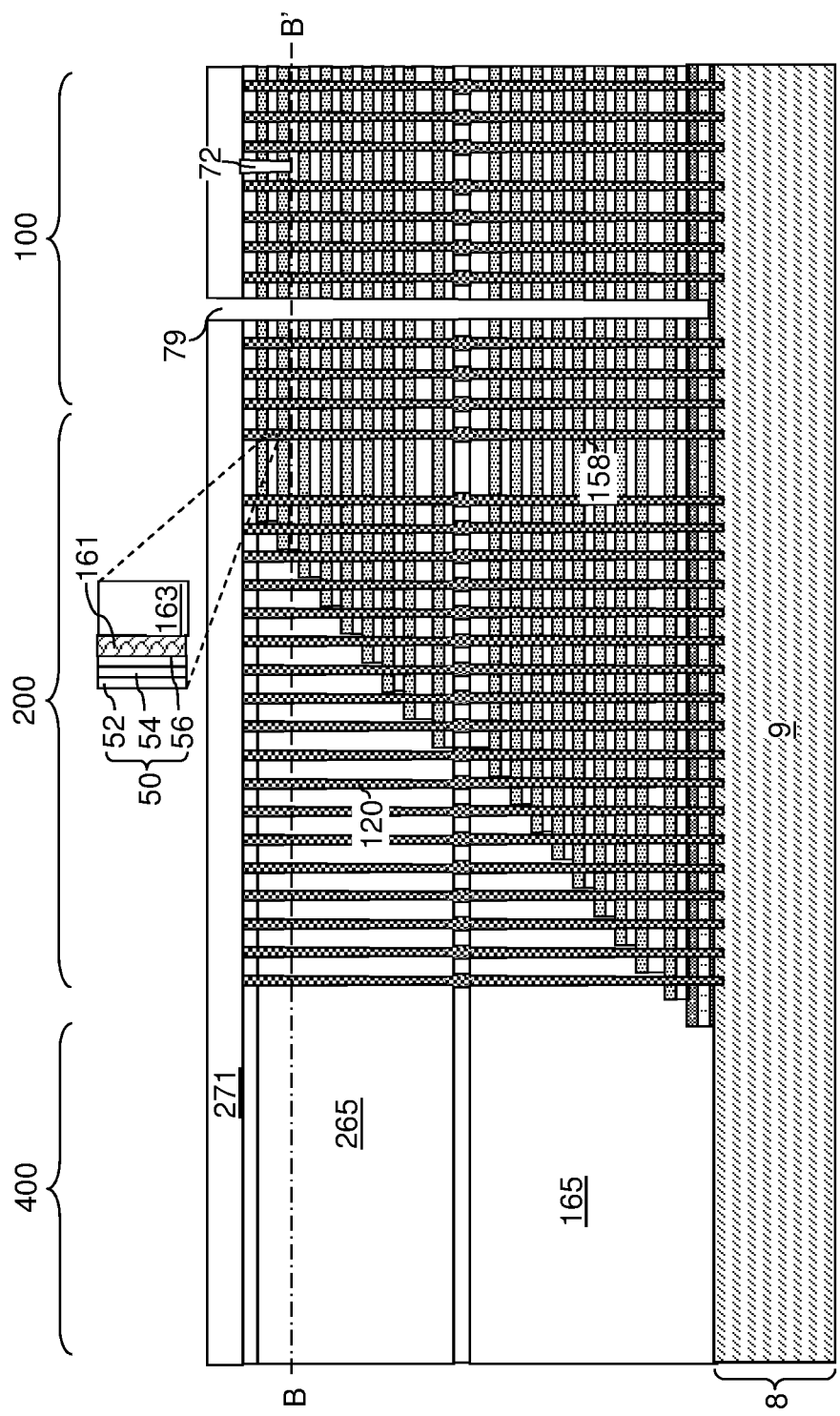
FIG. 10A is a vertical cross-sectional view of the exemplary structure after formation of a sacrificial cover dielectric layer and backside trenches according to an embodiment of the present disclosure.
Figure 10B:
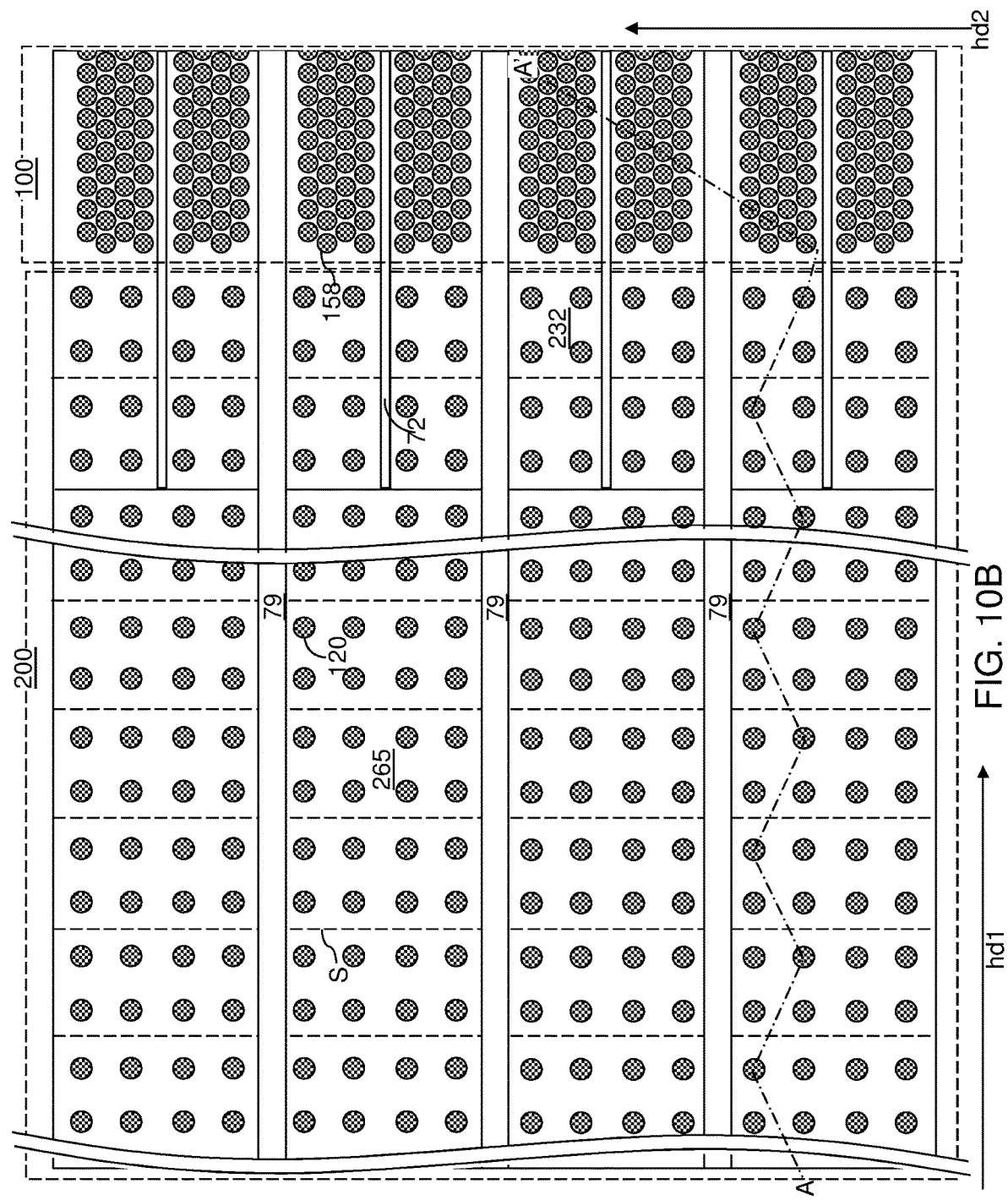
FIG. 10B is a horizontal cross-sectional view of the exemplary structure along the horizontal plane B-B' of FIG. 10A. The hinged vertical plane A-A' corresponds to the plane of the vertical cross-sectional view of FIG. 10A.
Figure 11A:
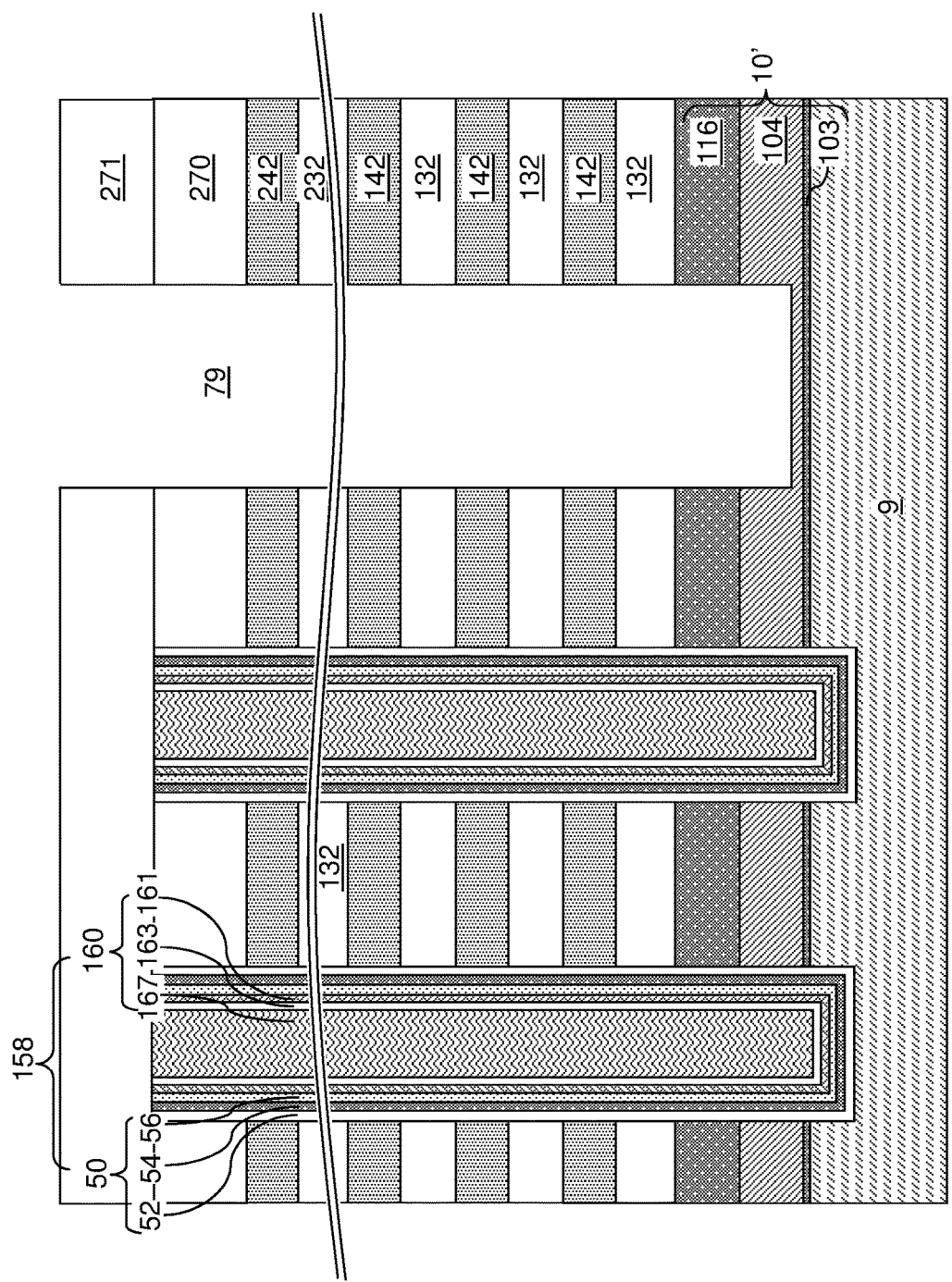
FIGS. 11A-11E illustrate sequential vertical cross-sectional views of memory opening fill structures and a backside trench during replacement of a source-level sacrificial layer with an epitaxial source semiconductor layer according to an embodiment of the present disclosure.

Referring to FIGS. 10A, 10B, and 11A, a sacrificial cover dielectric layer 271 may be formed over the second-tier structure (232, 242, 270, 265, 72). The sacrificial cover dielectric layer 271 includes a dielectric material that may be subsequently removed selective to the material of the second insulating cap layer 270. For example, the sacrificial cover dielectric layer 271 may include borosilicate glass or organosilicate glass. The sacrificial cover dielectric layer 271 and may be formed by a conformal or non-conformal deposition process. For example, the sacrificial cover dielectric layer 271 may include undoped silicate glass and may have a thickness in a range from 100 nm to 600 nm, although lesser and greater thicknesses may also be used.

A photoresist layer may be applied over the sacrificial cover dielectric layer 271 and may be lithographically patterned to form elongated openings that extend along the first horizontal direction hd1 between clusters of in-process memory opening fill structures 158. Backside trenches 79 may be formed by transferring the pattern in the photoresist layer (not shown) through the sacrificial cover dielectric layer 271, the second-tier structure (232, 242, 270, 265, 72), and the first-tier structure (132, 142, 170, 165), and into the in-process source-level material layers 10'. Portions of the sacrificial cover dielectric layer 271, the second-tier structure (232, 242, 270, 265, 72), the first-tier structure (132, 142, 170, 165), and the in-process source-level material layers (104, 116) that underlie the openings in the photoresist layer may be removed to form the backside trenches 79. In one embodiment, the backside trenches 79 may be formed between clusters of in-process memory opening fill structures 158. The clusters of the in-process memory opening fill structures 158 may be laterally spaced apart along the second horizontal direction hd2 by the backside trenches 79. A surface (such as a sidewall) of the source-level sacrificial layer 104) may be physically exposed to each backside trench 79.

Figure 11B:
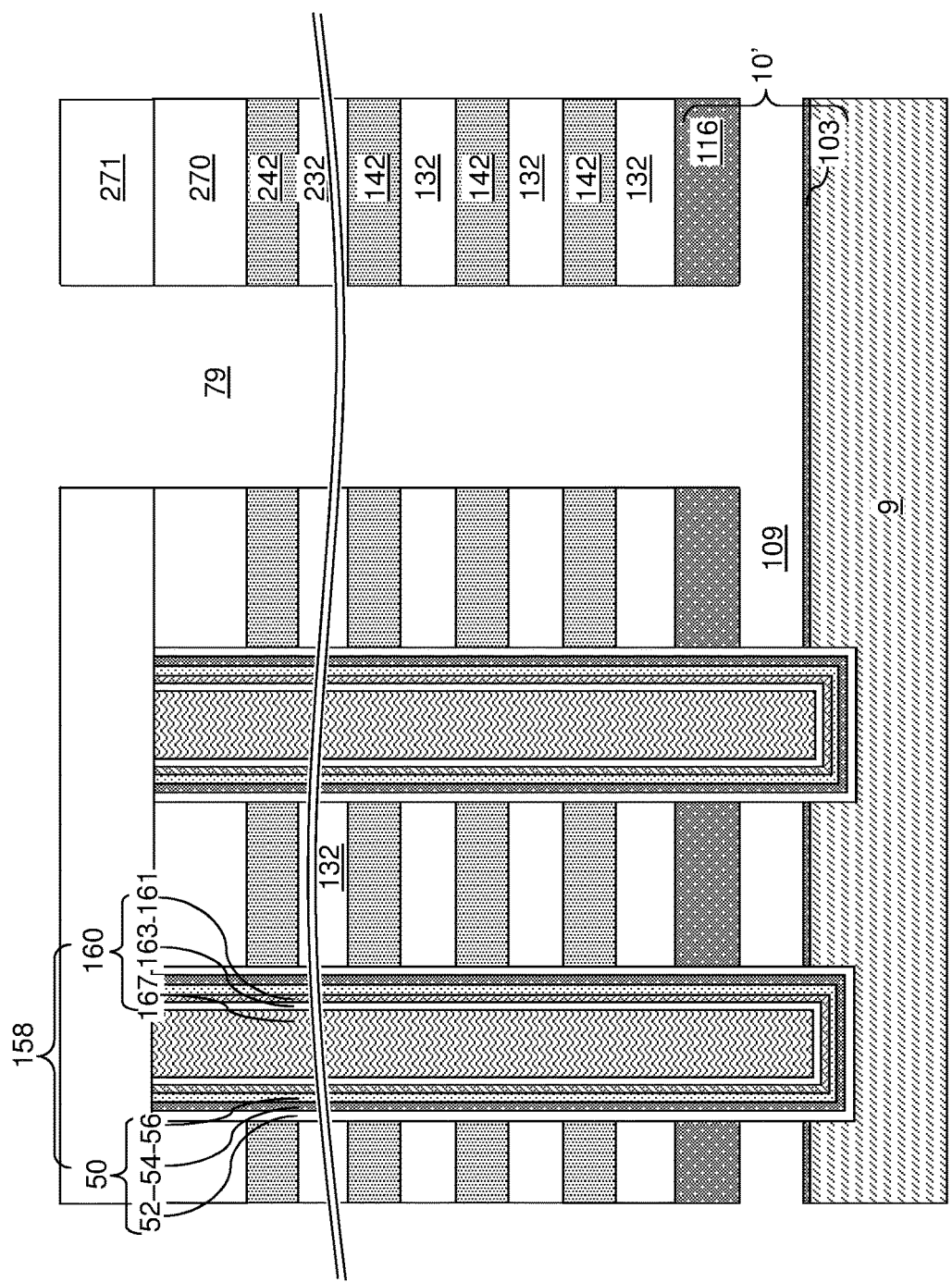

Referring to FIG. 11B, an etchant that etches the material of the source-level sacrificial layer 104 selective to the materials of the first alternating stack (132, 142), the second alternating stack (232, 242), the first and second insulating cap layers (170, 270), the sacrificial cover dielectric layer 271, the source-level sacrificial liner 103, and the source-level dielectric layer 116 may be introduced into the backside trenches 79 in an isotropic etch process. For example, if the source-level sacrificial layer 104 includes undoped amorphous silicon or an undoped amorphous silicon-germanium alloy, a wet etch process using hot trimethyl-2 hydroxyethyl ammonium hydroxide ("hot TMY") or tetramethyl ammonium hydroxide (TMAH) may be used to remove the source-level sacrificial layer 104 selective to the various materials of the first alternating stack (132, 142), the second alternating stack (232, 242), the first and second insulating cap layers (170, 270), the sacrificial cover dielectric layer 271, the source-level sacrificial liner 103, and the source-level dielectric layer 116. If the source-level sacrificial layer 104 includes a metallic nitride material such as TiN, TaN, or WN, a wet etch process that etches the metallic nitride material selective to dielectric materials may be used for the isotropic etch process. A source cavity 109 may be formed in the volume from which the source-level sacrificial layer 104 is removed. Generally, the source cavity 109 may be formed by removing the source-level sacrificial layer 104 selective to a material in the in-process memory opening fill structures 158.

Figure 11C:
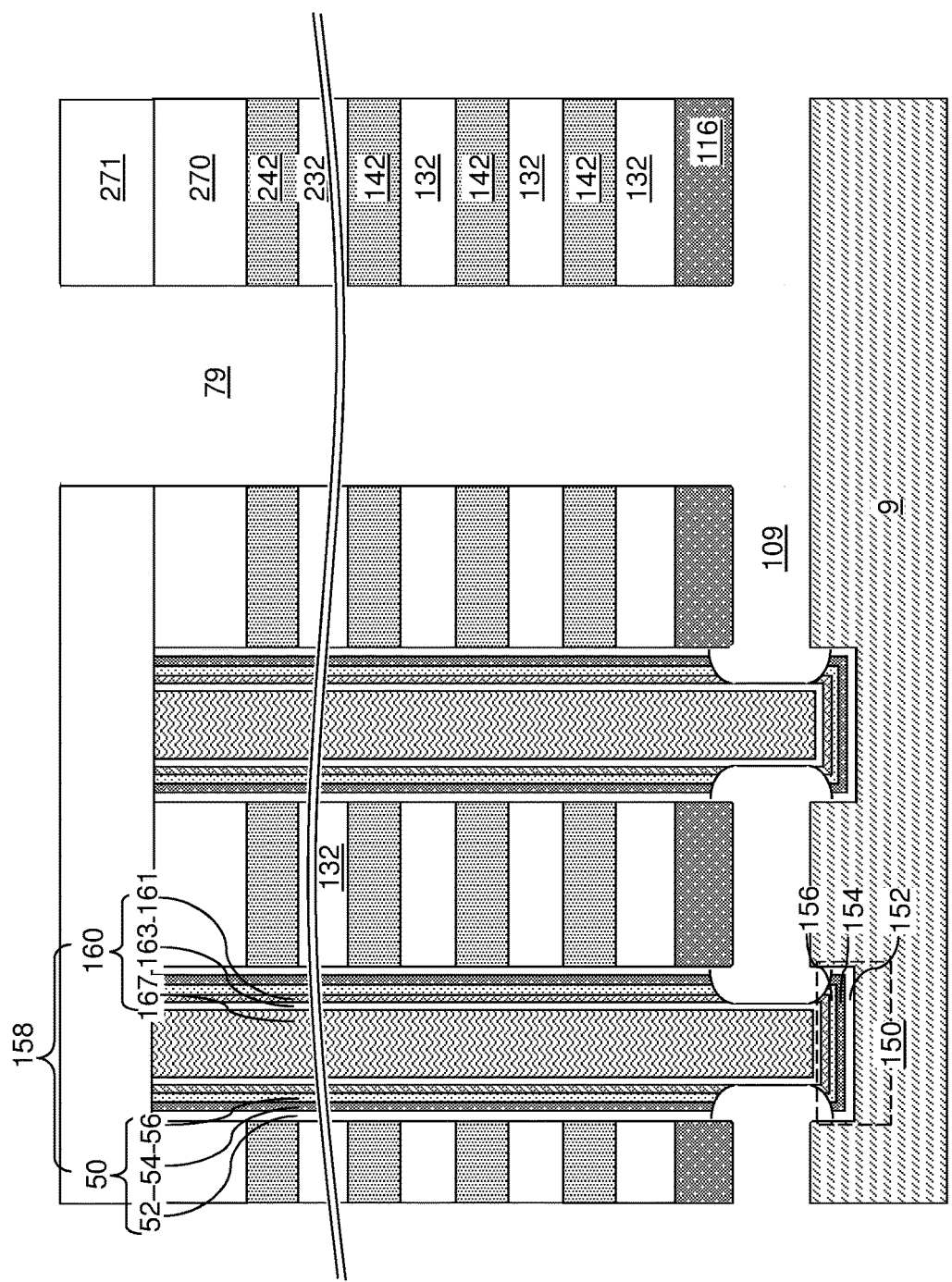

Referring to FIG. 11C, a sequence of isotropic etchants, such as wet etchants, may be applied to the physically exposed portions of the memory films 50 to sequentially etch the various component layers of the memory films 50 from outside to inside, and to physically expose cylindrical surfaces of a material portion within each in-process memory opening fill structure 158. Optionally, a cylindrical portion of each semiconductor liner 161 may be removed around the source cavity 109 during the sequence of isotropic etch processes. In this case, the material portion within each in-process memory opening fill structure 158 that is physically exposed to the source cavity 109 may comprise a cylindrical portion of an outer sidewall of each silicon oxide liner 163 within the in-process memory opening fill structures 158.

The source-level sacrificial liner 103 and surface portions of the source-level dielectric layer 116 may be collaterally etched during removal of the portions of the memory films 50 located at the level of the source cavity 109. An annular portion of each memory film 50 may be isotropically etched by providing at least one isotropic etchant into the volume of the void formed by removal of the source-level sacrificial layer 104, i.e., the source cavity 109 as formed at the processing steps of FIG. 11B. The source cavity 109 may be expanded in volume by removal of the portions of the memory films 50 at the level of the source cavity 109, the source-level sacrificial liner 103, and the surface portions of the source-level dielectric layer 116. The source cavity 109 comprises the void formed by removal of the source-level sacrificial layer 104 and volumes from which annular portions of the memory films 50 are removed. A horizontal top surface of the single crystalline semiconductor layer 9 may be physically exposed to the source cavity 109 by removing the source-level sacrificial liner 103 after removal of the source-level sacrificial layer 104.

A dielectric cap structure 150 may be provided at the bottom of each in-process memory opening fill structure 158. Each dielectric cap structure 150 may be a remaining portion of a respective memory film 50 after removal of the annular portions of the memory films 50 at the level of the source cavity 109. Each dielectric cap structure 150 may contain a layer stack including a blocking dielectric material layer 152 having a same composition and a same thickness as a blocking dielectric layer 52 within a memory film 50, a charge storage material layer 154 having a same composition and a same thickness as a charge storage layer 54 within a memory film 50, and a tunneling dielectric material layer 156 having a same composition and a same thickness as the tunneling dielectric layer 56 within a memory film 50.

Figure 11D:
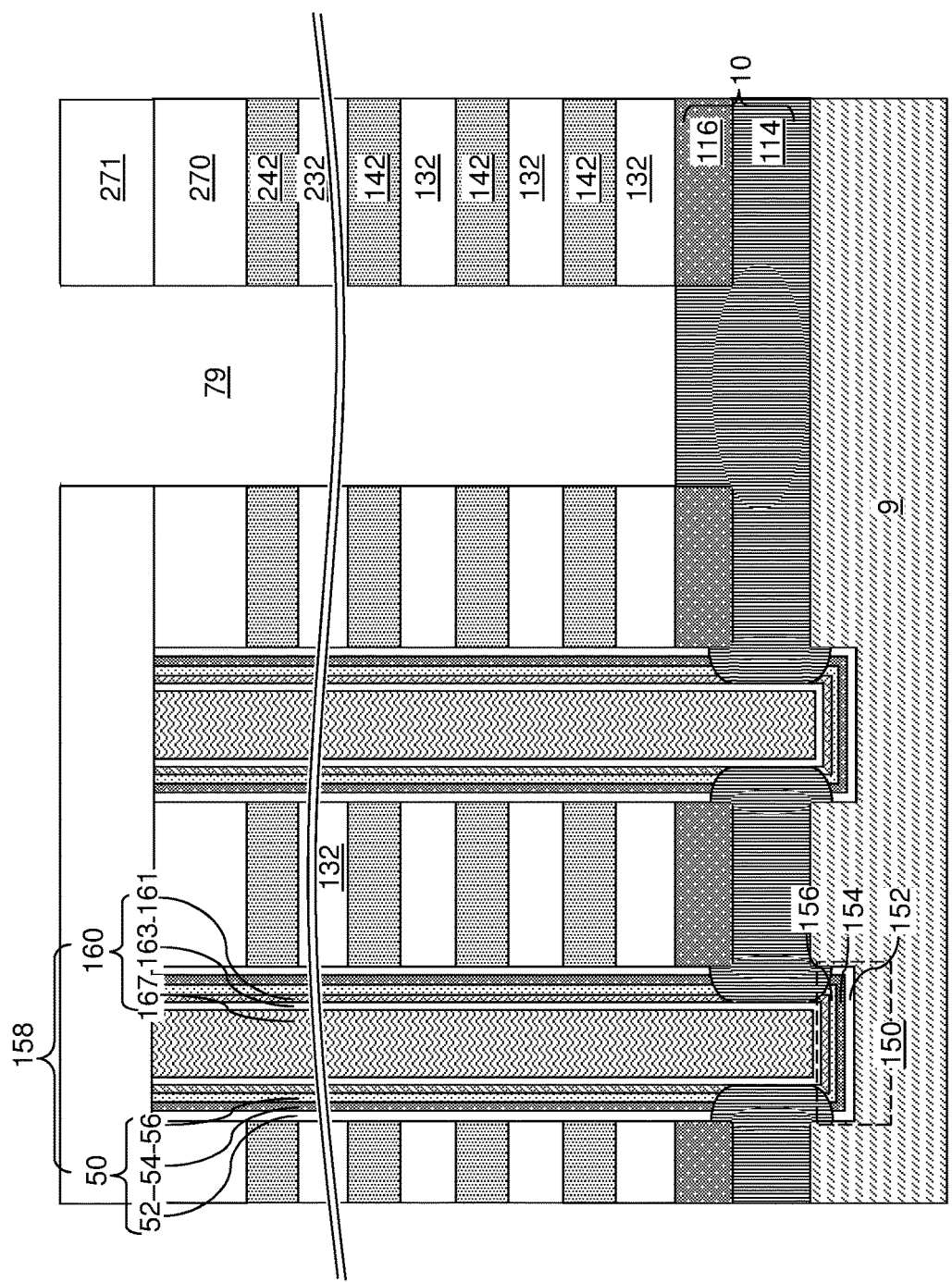

Referring to FIG. 11D, a first selective epitaxy process may be performed to grow a first epitaxial semiconductor material the horizontal top surface of the single crystalline semiconductor layer 9. A selective epitaxy process is a deposition process that deposits a single crystalline material in epitaxial alignment with the single crystalline lattice structure of an underlying single crystalline material portion. The exemplary structure may be placed in a vacuum-tight process chamber of an apparatus configured for selective epitaxy of a semiconductor material. At least one semiconductor precursor gas and an etchant gas may be simultaneously or alternately flowed into the process chamber to effect the first selective epitaxy process. The at least one semiconductor precursor gas may include, for example, silane, disilane, dichlorosilane, trichlorosilane, silicon tetrachloride, germane, digermane, or other known semiconductor precursor gases. The etchant gas may include, for example, gas phase hydrogen chloride. A dopant gas may be flowed in-situ concurrently with the flow of the at least one semiconductor precursor gas (and/or the etchant gas) or after each cycle of the flow of the etchant gas.

A first epitaxial semiconductor material in epitaxial alignment with the single crystalline semiconductor material of the single crystalline semiconductor layer 9 may grow upward from the top surface of the single crystalline semiconductor layer 9 to form an epitaxial source semiconductor layer 114 that fills the source cavity 109. The atomic concentration of electrical dopants in the epitaxial source semiconductor layer 114 may be in a range from $1.0 \times 10^{20}/cm^3$ to $2.0 \times 10^{21}/cm^3$, such as from $2.0 \times 10^{20}/cm^3$ to $8.0 \times 10^{20}/cm^3$. The epitaxial source semiconductor layer 114 may grow vertically until the epitaxial source semiconductor layer 114 contacts a bottom surface of the source-level dielectric layer 116. The source-level dielectric layer 116 may contact a top surface of the epitaxial source semiconductor layer 114 and a bottom surface of the alternating stack of insulating layers (132, 232) and sacrificial material layers (142, 242). The topmost surface of the epitaxial source semiconductor layer 114 may be formed between the horizontal plane including the bottom surface of the source-level dielectric layer 116 and the horizontal plane including the bottom surface of the bottommost one of the first sacrificial material layers 142. The combination of the epitaxial source semiconductor layer 114 and the source-level dielectric layer 116 constitutes source-level material layers 10, which are also referred to as a source-level layer stack.

Figure 11E:
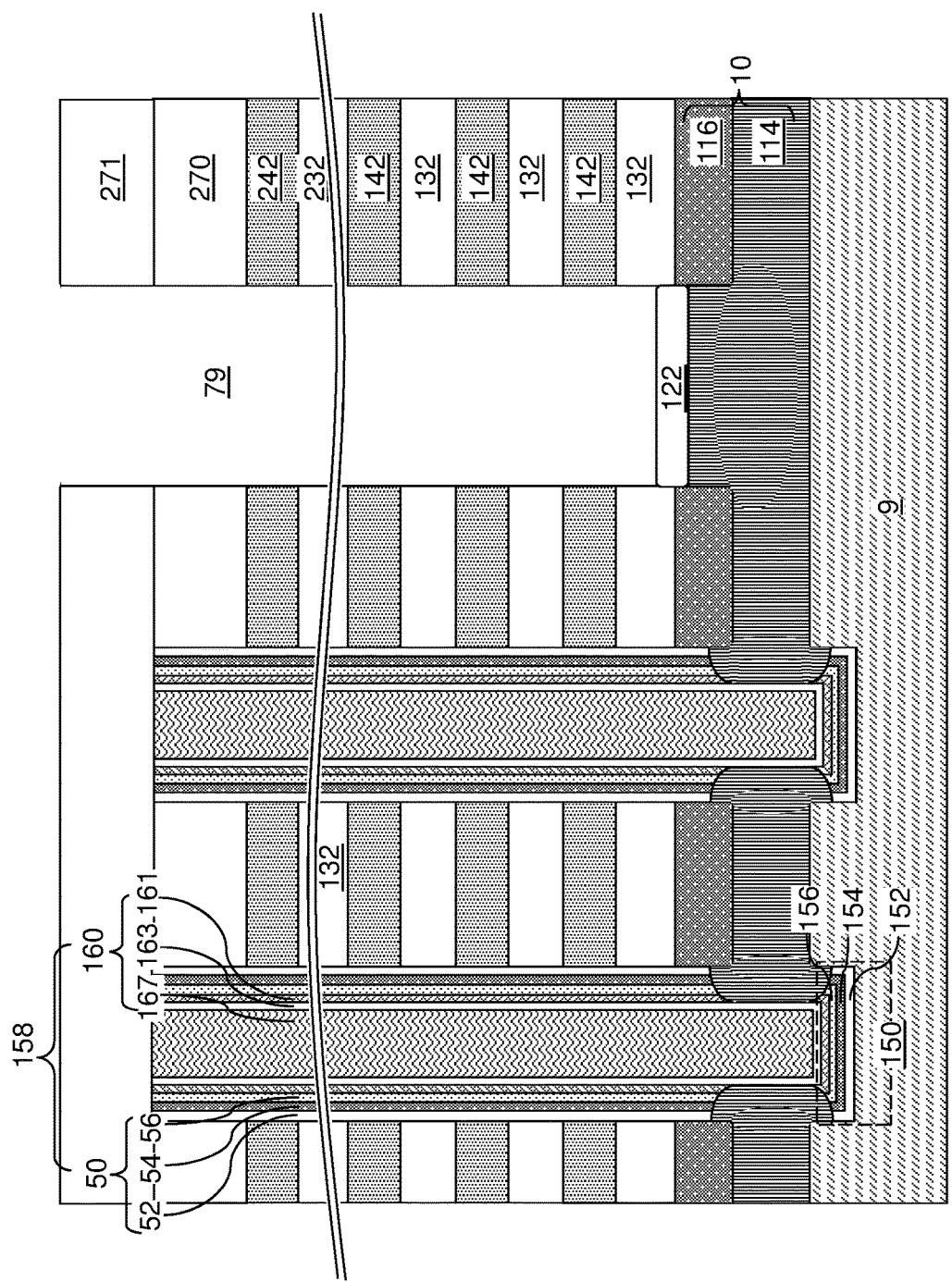

Referring to FIG. 11E, an oxidation process may be performed to convert physically exposed surface portions of the epitaxial source semiconductor layer 114 into dielectric semiconductor oxide portions. For example, surfaces portions of the epitaxial source semiconductor layer 114 may be converted into dielectric semiconductor oxide plates 122.

Figure 12:
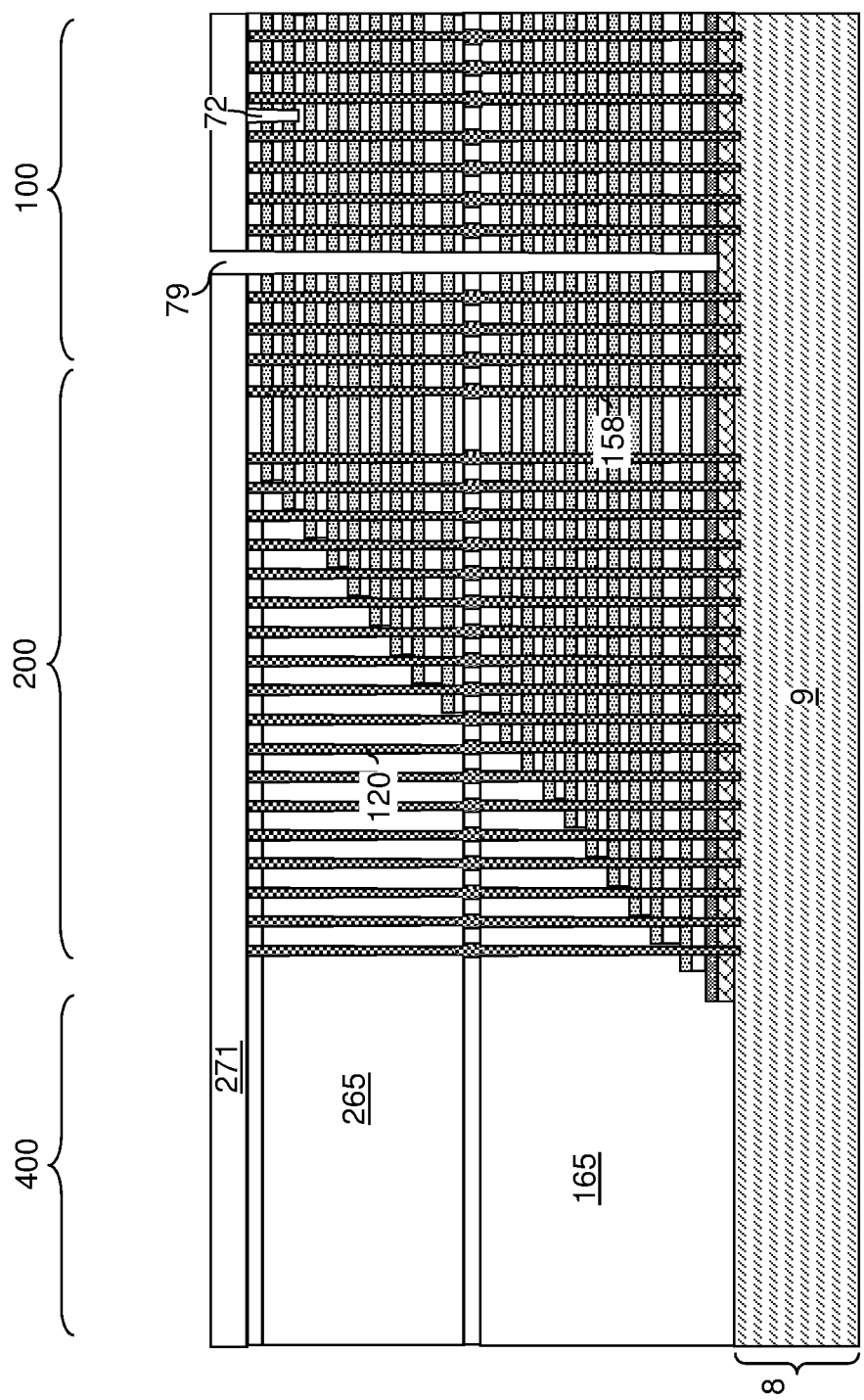
FIG. 12 is a vertical cross-sectional view of the exemplary structure after formation of source-level material layers according to an embodiment of the present disclosure.

FIG. 12 illustrates the exemplary structure after the processing steps of FIG. 11E. The dielectric semiconductor oxide plates 122 and the dielectric cap structures 150 are not illustrated for clarity.

Figure 13:
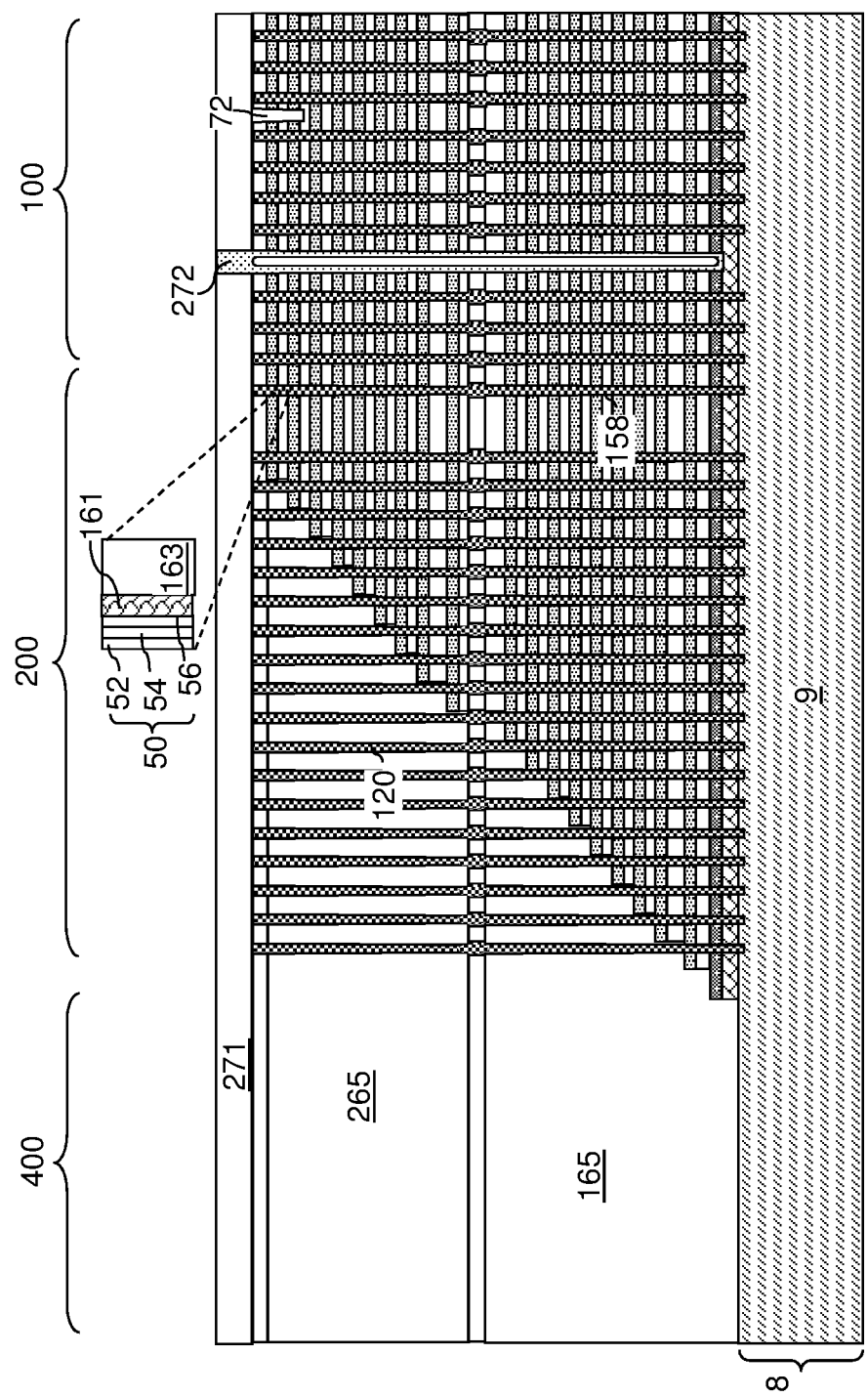
FIG. 13 is a vertical cross-sectional view of the exemplary structure after formation of sacrificial wall structures according to an embodiment of the present disclosure.

Referring to FIG. 13, a sacrificial material may be deposited in the backside trenches 79. Excess portions of the sacrificial material may be removed from above the horizontal plane including the top surface of the sacrificial cover dielectric layer 271. Each remaining portion of the sacrificial material that fills the backside trenches 79 constitute a sacrificial wall structure 272. The sacrificial wall structures 272 may include a sacrificial fill material such as borosilicate glass, amorphous silicon, polysilicon, or a silicon-germanium alloy. In one embodiment, the sacrificial material may be deposited by an anisotropic deposition process such as plasma-enhanced chemical vapor deposition, and each of the sacrificial wall structures 272 may include an optional trench cavity (e.g., air gap) 275 that laterally extends along the first horizontal direction hd1 and vertically extends through a predominant subset (i.e., more than 50%) of all layers within the alternating stacks {(132, 142), (232, 242)}.

Figure 14:
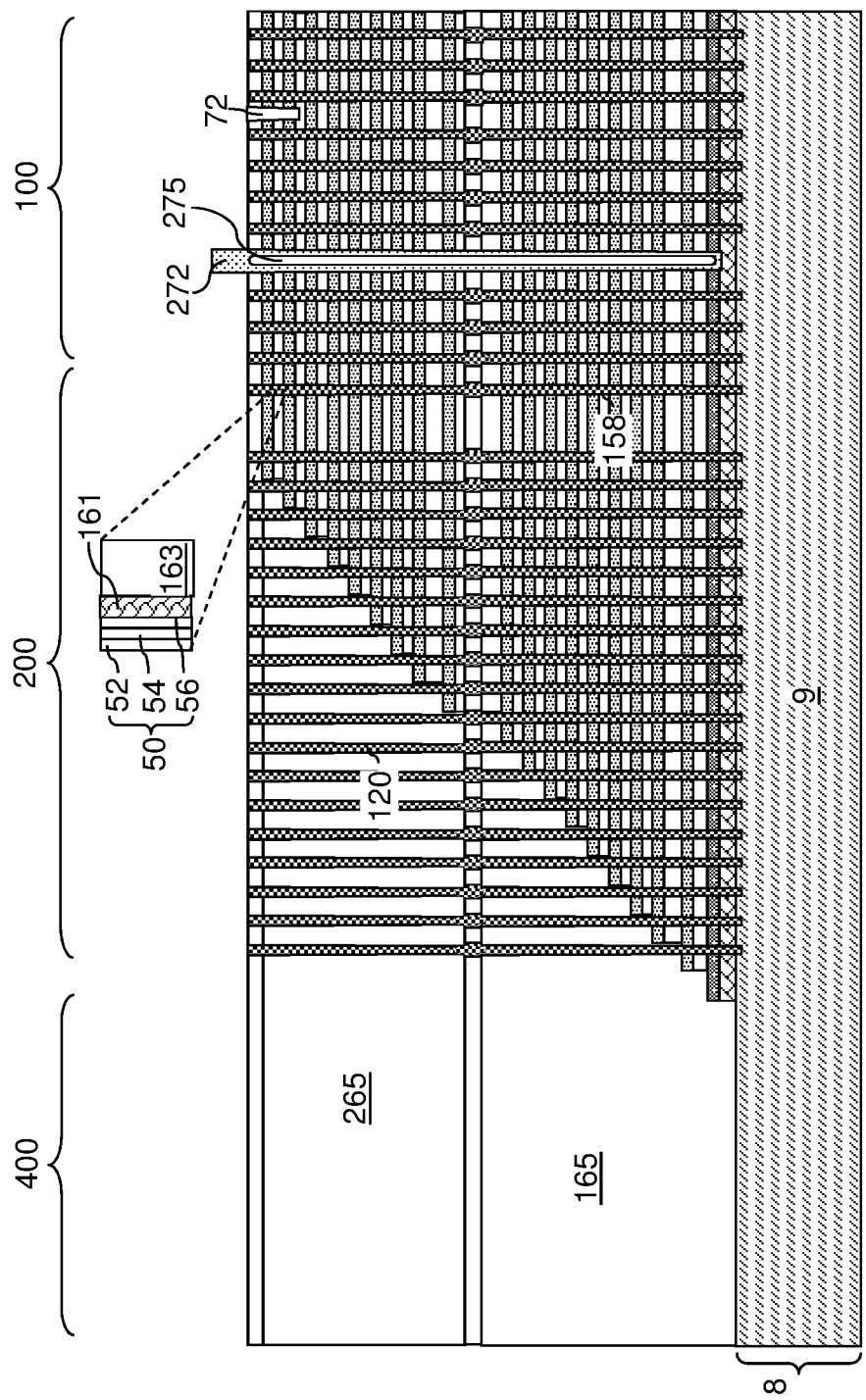
FIG. 14 is a vertical cross-sectional view of the exemplary structure after removal of the sacrificial cover dielectric layer according to an embodiment of the present disclosure.
Figure 15A:
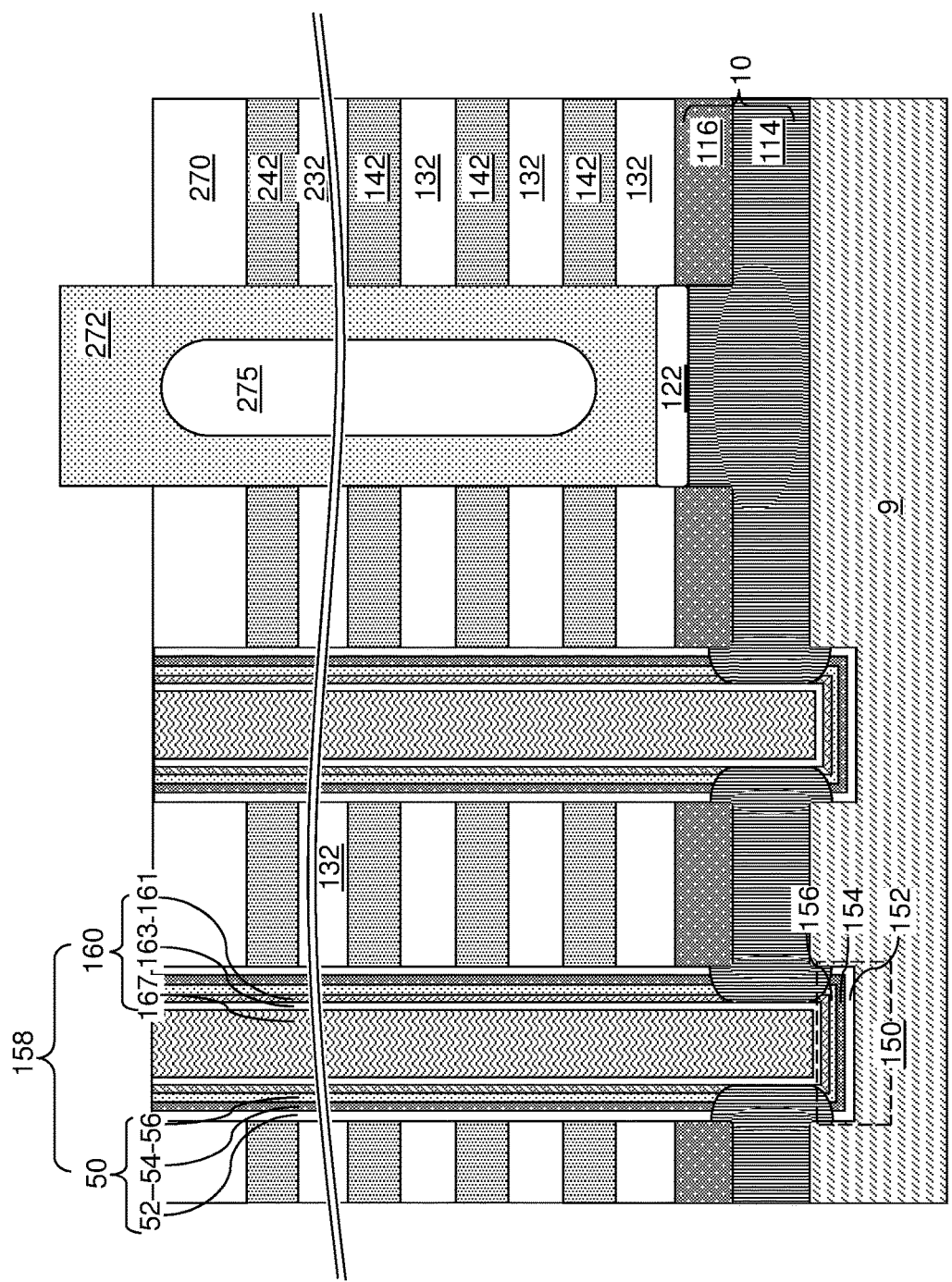
FIGS. 15A-15E illustrate sequential vertical cross-sectional views of memory openings and a backside trench during replacement of sacrificial fill structures within memory opening fill structures and formation of a contact-level dielectric layer according to an embodiment of the present disclosure.

Referring to FIGS. 14 and 15A, the sacrificial cover dielectric layer 271 may be removed selective to the material of the second insulating cap layer 270. For example, if the sacrificial cover dielectric layer 271 includes boro silicate glass, a wet etch process using dilute hydrofluoric acid may be used to remove the sacrificial cover dielectric layer 271 without excessively recessing the second insulating cap layer 270. Top surfaces of the sacrificial fill structures 160 may be physically exposed after removal of the sacrificial cover dielectric layer 271. If the sacrificial wall structures 272 comprise a same material as the sacrificial cover dielectric layer 271, the sacrificial wall structures 272 may be collaterally recessed. If the sacrificial wall structures 272 includes a semiconductor material, the sacrificial wall structures 272 may protrude above the top surface of the second insulating cap layer 270.

Figure 15B:
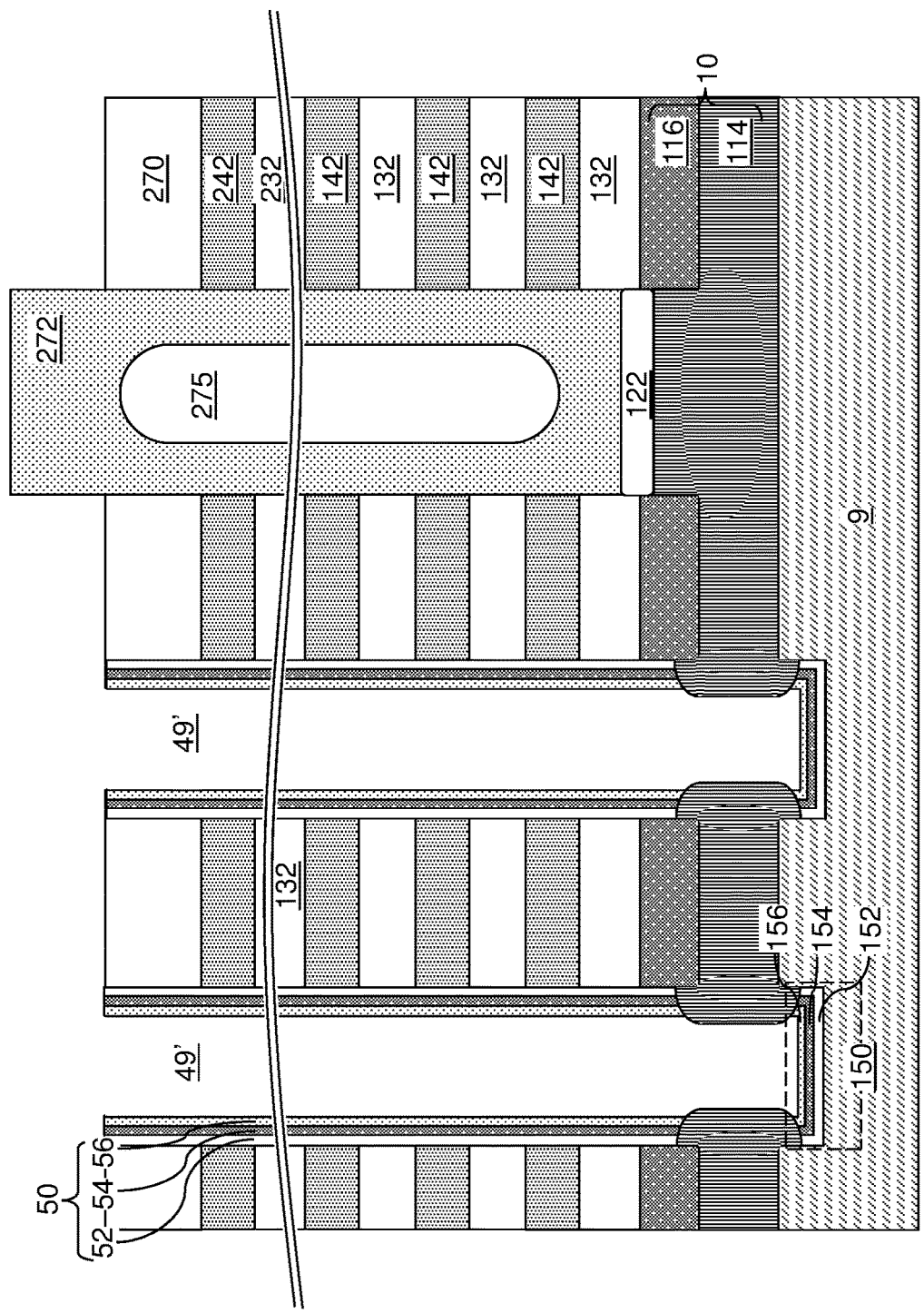

Referring to FIG. 15B, the sacrificial fill structures 160 may be removed selective to the memory films 50 and the epitaxial source semiconductor layer 114 to form memory cavities 49'. A first isotropic etch process may be performed to remove the sacrificial core fill portions 167 selective to the silicon oxide liners 163. For example, if the sacrificial core fill portions 167 include amorphous silicon, a wet etch process using TMAH or TMY may be used. A second isotropic etch process may be performed to remove the silicon oxide liners 163 selective to the semiconductor liners 161 and the epitaxial source semiconductor layer 114. For example, a wet etch process using dilute hydrofluoric acid may be used to remove the silicon oxide liners 163 selective to the semiconductor liners 161. In one embodiment, the sacrificial wall structures 272 may be collaterally etched partially or fully as long as the dielectric semiconductor oxide plates 122 are not etched through. A third isotropic etch process may be performed to remove the semiconductor liners 161. A wet etch process or an isotropic dry etch process may be performed to remove the semiconductor liners 161. In one embodiment, removal of the semiconductor liners 161 may be performed selective to the memory films 50. Surface portions of the epitaxial source semiconductor layer 114 may be recessed at the bottom of each memory cavity 49' formed by removal of the sacrificial fill structures 160. Optionally, cavities may be formed within each in-process support pillar structure 120 by removal of the sacrificial fill structures 160 within the in-process support pillar structures 120. In case the sacrificial wall structures 272 include a semiconductor material, a patterned etch mask layer (such as a patterned photoresist layer) may be used to temporarily protect the sacrificial wall structures 272 during removal of the sacrificial fill structures 160.

Referring to 15C, a preclean process may be optionally performed to remove any surface oxide material from physically exposed surfaces of the epitaxial source semiconductor layer 114. For example, a wet etch process using dilute hydrofluoric acid or a gas phase hydrofluoric acid etch may be performed. A second selective epitaxy process may be performed to grow a second epitaxial semiconductor material the cylindrical surfaces of the epitaxial source semiconductor layer 114 at the bottom of each memory cavity 49'. The second epitaxial semiconductor material is grown inward and upward from the physically exposed cylindrical surfaces of the epitaxial source semiconductor layer 114 to form an epitaxial vertical semiconductor channel 60 within each memory cavity 49'. The second epitaxial semiconductor material within each epitaxial vertical semiconductor channel 60 may be in epitaxial alignment with the first epitaxial semiconductor material of the epitaxial source semiconductor layer 114. For example, if the epitaxial source semiconductor layer 114 comprises single crystal silicon, then the epitaxial vertical semiconductor channel 60 may also comprise single crystal silicon which is epitaxially grown from the epitaxial source semiconductor layer 114 which is used as a growth template or seed.

The second selective epitaxy process may be performed in the same manner as the first selective epitaxy process with a modification in the conductivity type of the electrical dopants. Specifically, the conductivity type of the electrical dopants incorporated into the second epitaxial semiconductor material may be the opposite of the conductivity type of the electrical dopants incorporated into the first epitaxial semiconductor material. The second selective epitaxy process may use dopants of a first conductivity type, and the first selective epitaxy process may use dopants of a second conductivity type that is the opposite of the first conductivity type. If the first conductivity type is p-type, the second conductivity type is n-type, and vice versa. The atomic concentration of electrical dopants in the epitaxial vertical semiconductor channels may be in a range from $1.0\times10^{15}/cm^3$ to $3.0\times10^{18}/cm^3$, such as from $3.0\times10^{15}/cm^3$ to $1.0\times10^{18}/cm^3$. A first p-n junction may be formed at each cylindrical interface between the epitaxial source semiconductor layer 114 and the epitaxial vertical semiconductor channels 60. As used herein, a cylindrical interface refers to an interface having the area of a vertically-extending surface that provides a uniform horizontal cross-sectional shape that is invariant with the location of the horizontal cross-sectional plane.

A cylindrical sidewall of each epitaxial vertical semiconductor channel 60 may contact an inner cylindrical sidewall of a memory film 50. In one embodiment, the cylindrical interface between the epitaxial source semiconductor layer 114 and an epitaxial vertical semiconductor channel 60 may be vertically coincident with an inner cylindrical sidewall of the memory film 50. Excess portions of the second epitaxial semiconductor material may be removed from above the horizontal plane including the top surface of the second insulating cap layer 270 by a planarization process. The planarization process may use a recess etch process and/or a chemical mechanical planarization process. Top portions of the sacrificial wall structures 272 may be collaterally recessed during the planarization process. In case cavities are formed within each in-process support pillar structure 120 by removal of the sacrificial fill structures 160, an epitaxial vertical semiconductor channel 60 may be formed within each of the support openings 19.

Figure 15C:
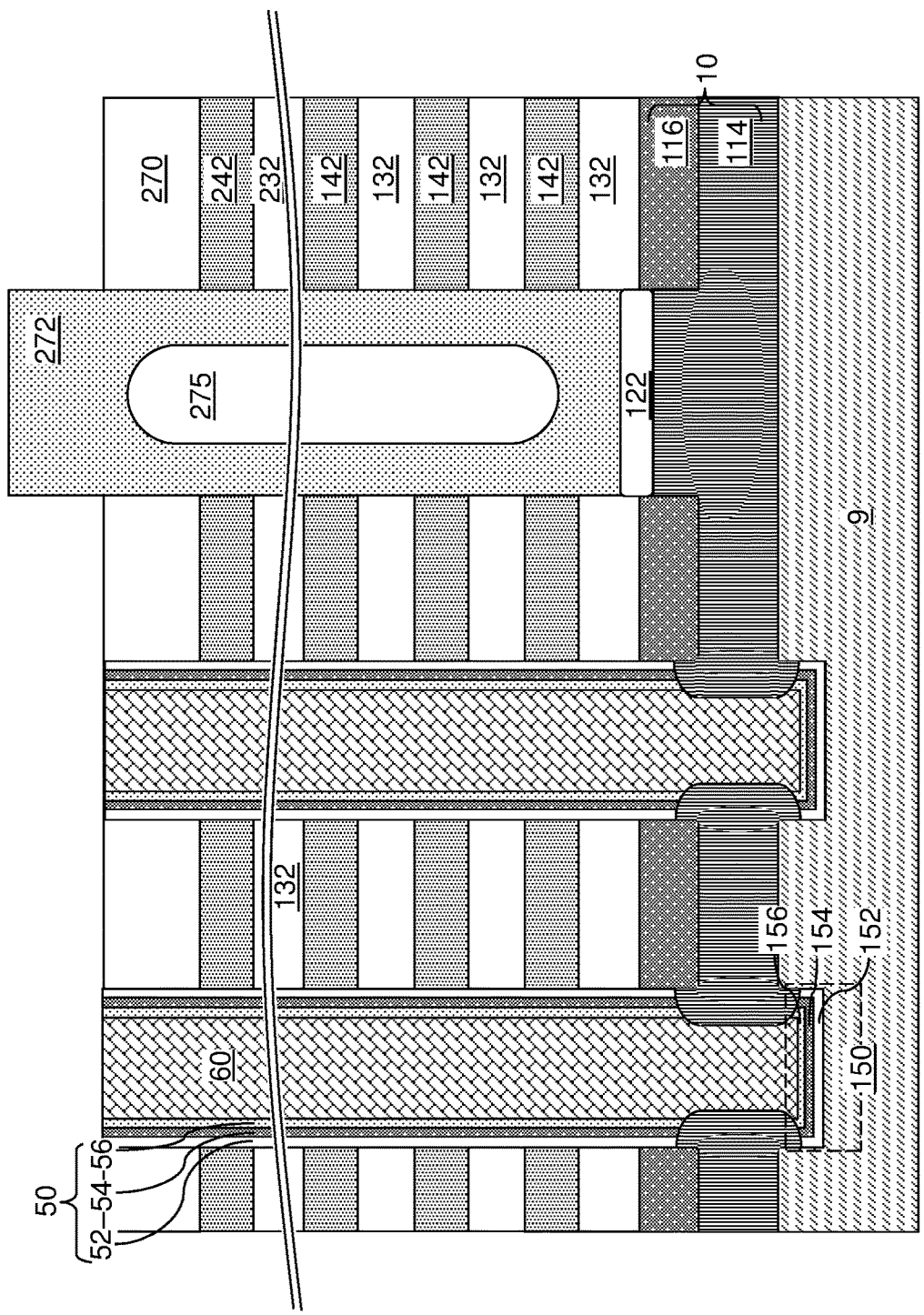
Figure 15D:
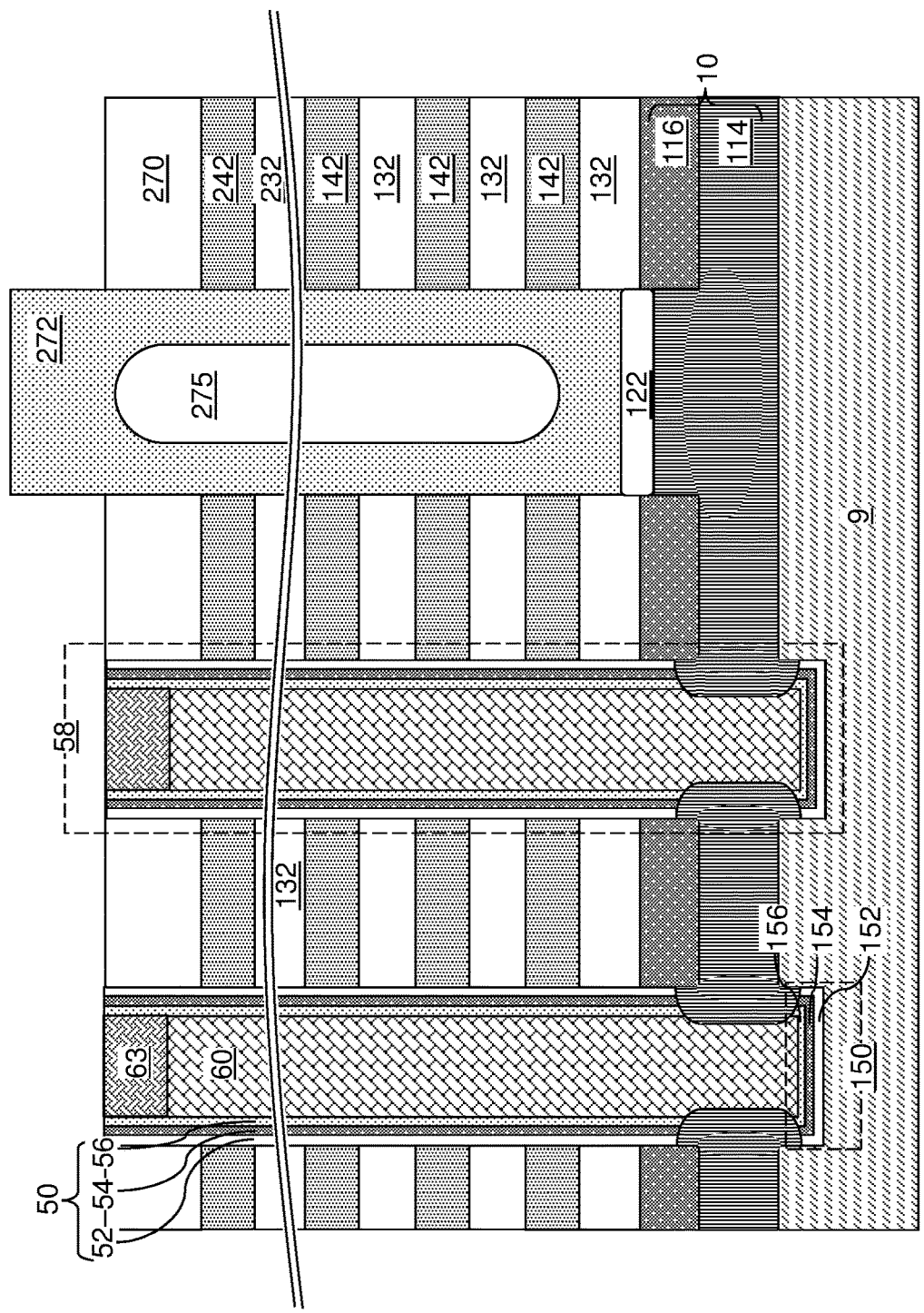

Referring to FIG. 15D, dopants of the second conductivity type may be implanted into upper potions of the epitaxial vertical semiconductor channels 60. The implanted upper portions of the epitaxial vertical semiconductor channels 60 may be converted into single crystalline semiconductor regions having a net doping of the second conductivity type, and constitute drain regions 63. The net atomic concentration of electrical dopants of the second conductivity type (i.e., the atomic concentration of electrical dopants of the second conductivity type less the atomic concentration of electrical dopants of the first conductivity type) in the drain regions 63 may be in a range from $1.0\times10^{20}/cm^3$ to $2.0\times10^{21}/cm^3$, such as from $2.0\times10^{20}/cm^3$ to $8.0\times10^{20}/cm^3$. Each drain region 63 contacts a top surface of a respective epitaxial vertical semiconductor channel 60, and comprises the same semiconductor material as the epitaxial vertical semiconductor channels 60. A second p-n junction is formed at each interface between an epitaxial vertical semiconductor channel 60 and a drain region 63.

Figure 15E:
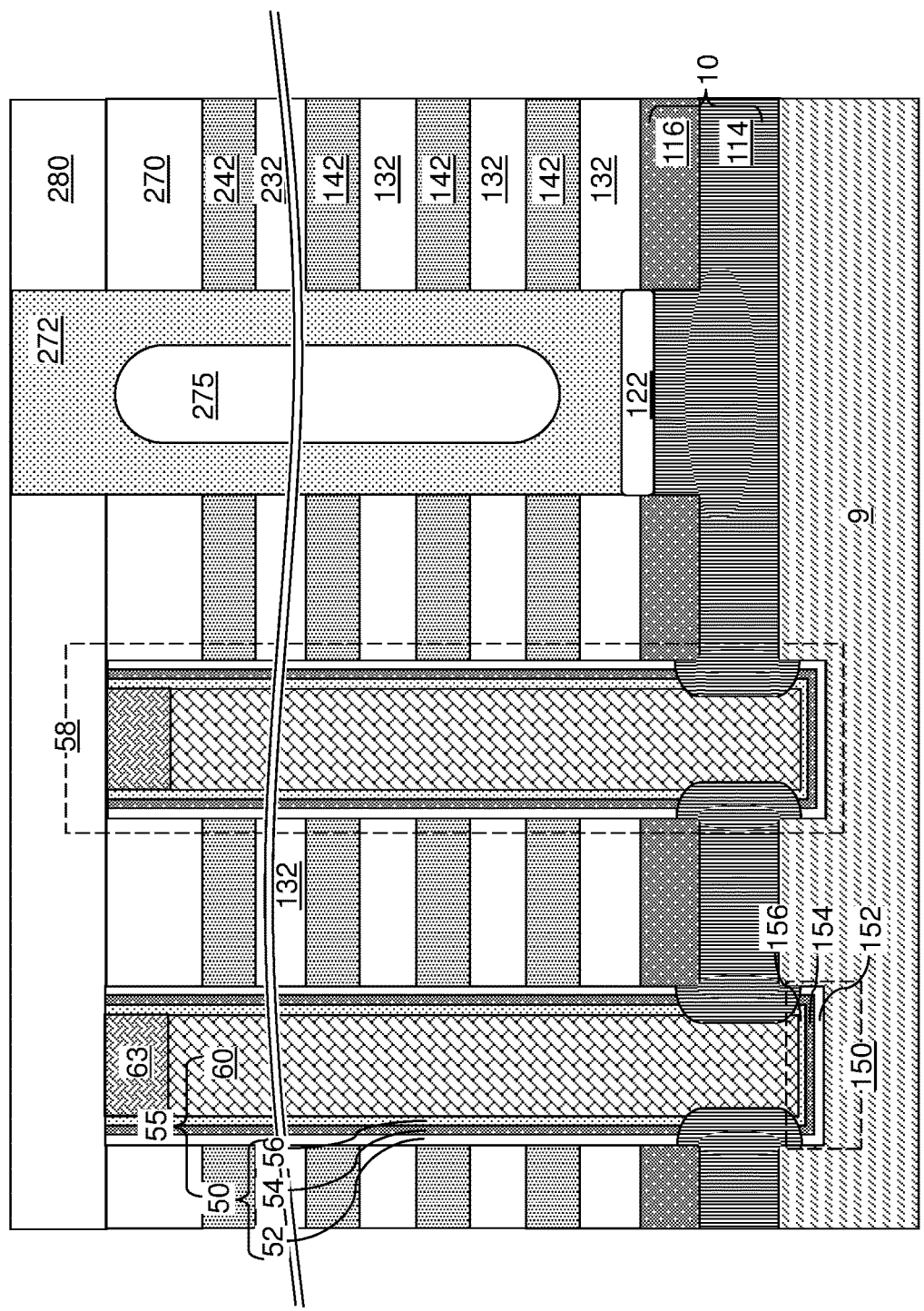

Referring to FIG. 15E, a first contact-level dielectric layer 280 may be optionally deposited over the second insulating cap layer 270. The first contact-level dielectric layer 280 includes a dielectric material such as silicon oxide. Each combination of a memory film 50 and an epitaxial vertical semiconductor channel 60 constitutes a memory stack structure 55. Each memory stack structure 55 includes a vertical stack of memory elements, which may comprise portions of a charge storage layer 54 that are located at the levels of the sacrificial material layers (142, 242). The set of all structures that fills a memory opening 49 constitutes a memory opening fill structure 58. A memory opening fill structure 58 includes a memory stack structure 55, a drain region 63, and a dielectric cap structure 150.

Figure 16A:
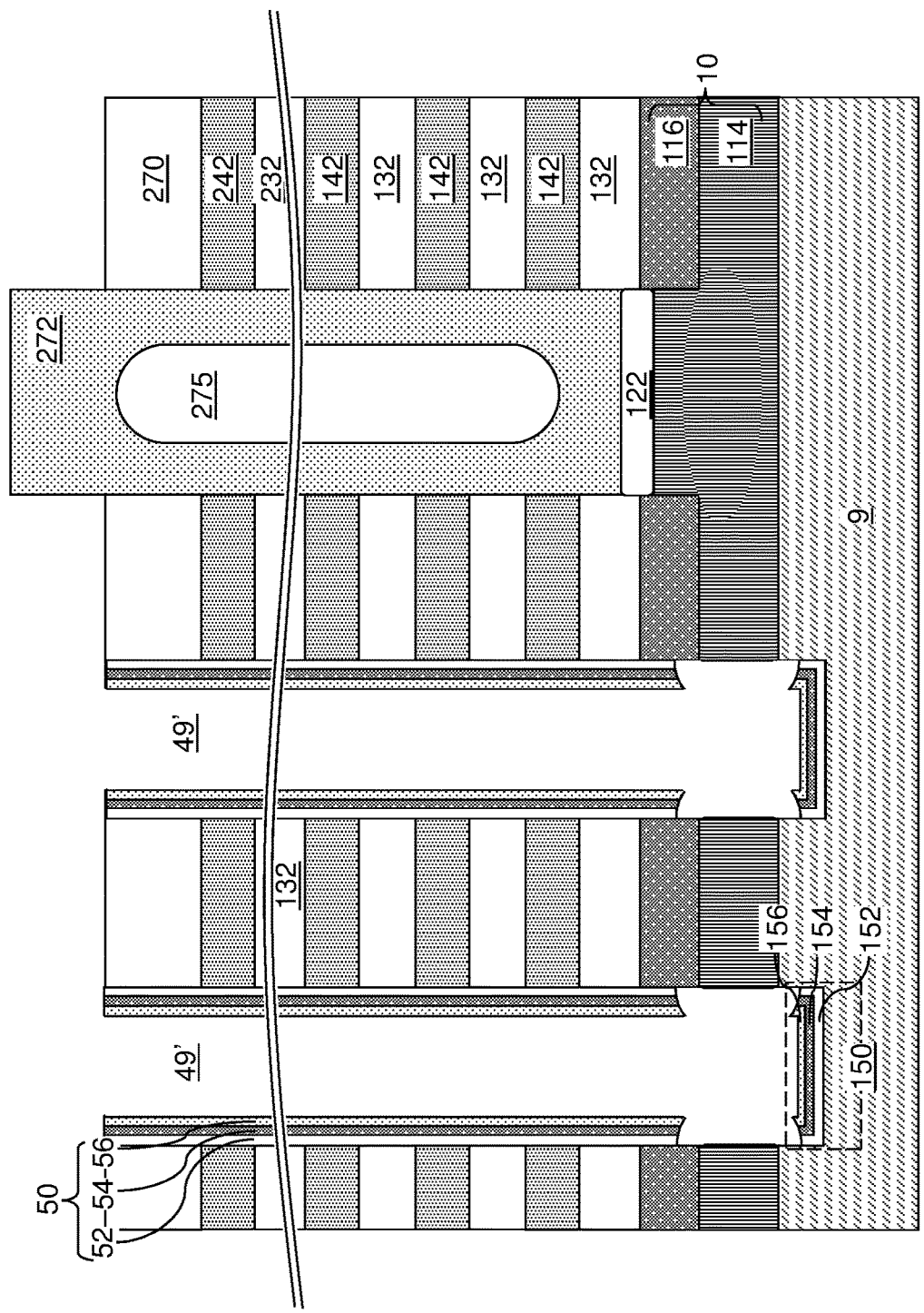
FIGS. 16A and 16B illustrate sequential vertical cross-sectional views of memory opening fill structures in a first alternative configuration according to an embodiment of the present disclosure.

Referring to FIG. 16A, a first alternative embodiment configuration of the exemplary structure is illustrated, which may be derived from the exemplary structure illustrated in FIG. 15B by isotropically laterally recessing the epitaxial source semiconductor layer 114 such that recessed cylindrical surfaces of the epitaxial source semiconductor layer 114 are vertically coincident with an outer sidewall of a respective overlying memory film 50. An isotropic etch process such as a wet etch process use TMAH or TMY may be used to laterally recess the cylindrical sidewalls of the epitaxial source semiconductor layer 114 around each memory cavity 49'.

Figure 16B:
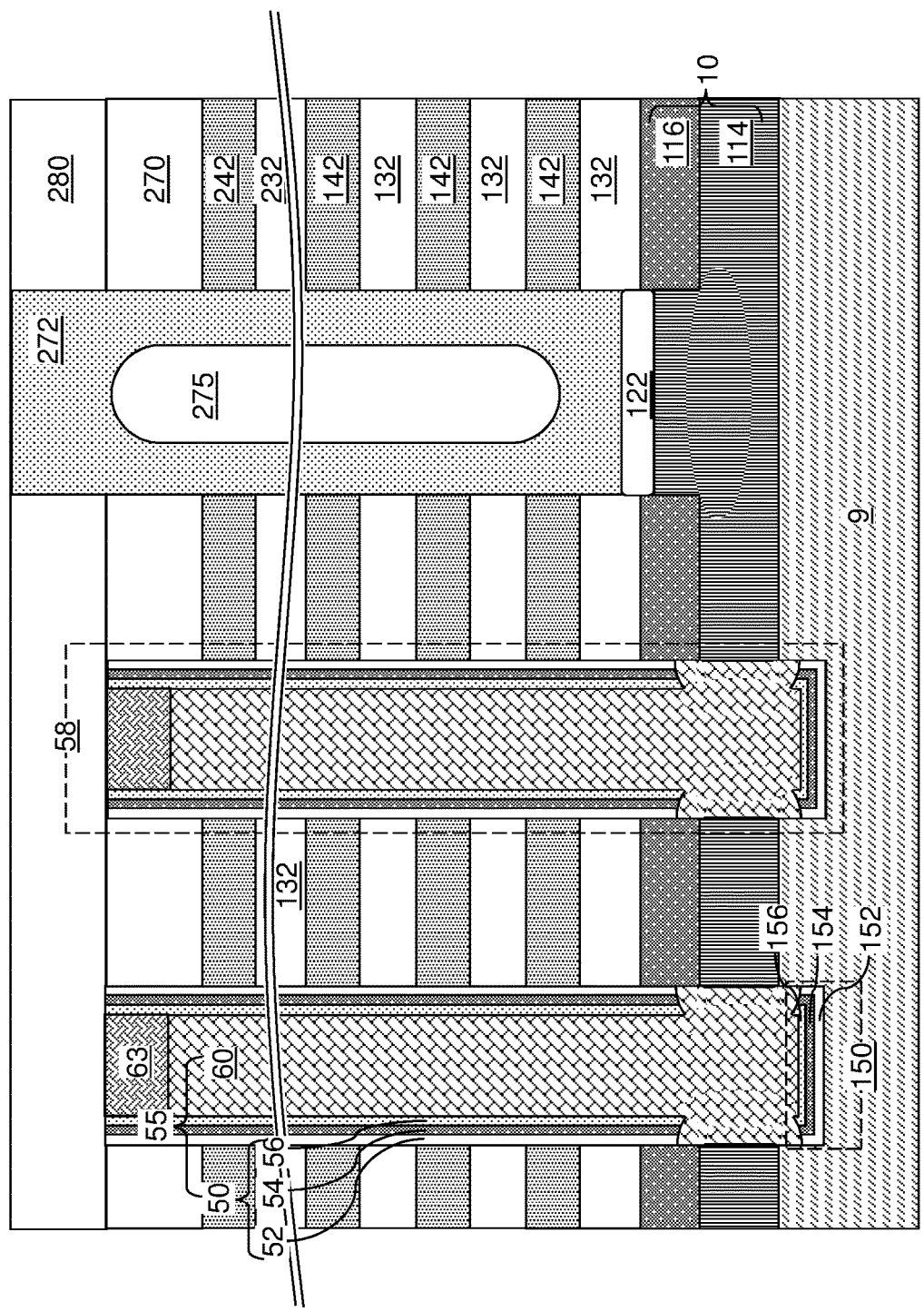

Referring to FIG. 16B, the processing steps of FIGS. 15C-15E may be performed to form epitaxial vertical semiconductor channels 60, drain regions 63, and the first contact-level dielectric layer 280.

Figure 17:
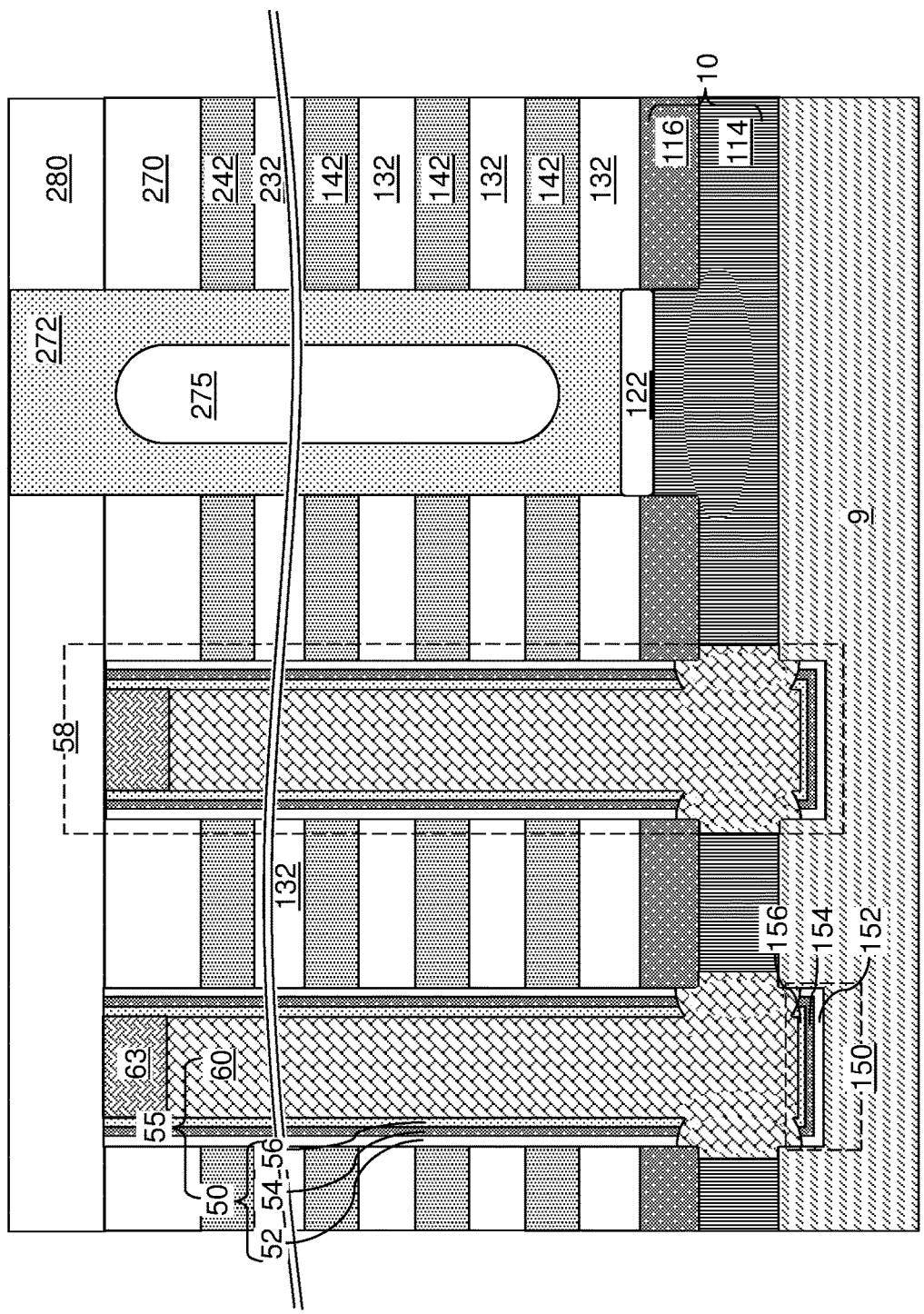
FIG. 17 illustrates a vertical cross-sectional view of memory opening fill structures in a second alternative configuration according to an embodiment of the present disclosure.

Referring to FIG. 17, a second alternative embodiment configuration of the exemplary structure may be derived from the exemplary structure illustrated in FIG. 15B by isotropically laterally recessing the epitaxial source semiconductor layer 114 such that recessed cylindrical surfaces of the epitaxial source semiconductor layer 114 are located outside an outer sidewall of a respective overlying memory film 50. An annular top surface of the single crystalline semiconductor layer 9 may be physically exposed around each memory cavity 49'. The epitaxial vertical semiconductor channels 60 may grow from cylindrical surfaces of the epitaxial source semiconductor layer 114 and from the annular top surface of the single crystalline semiconductor layer 9. In this case, a bottom periphery of the cylindrical interface between the epitaxial source semiconductor layer 114 and an epitaxial vertical semiconductor channel 60 contacts a top surface of the single crystalline semiconductor layer 9.

Figure 18:
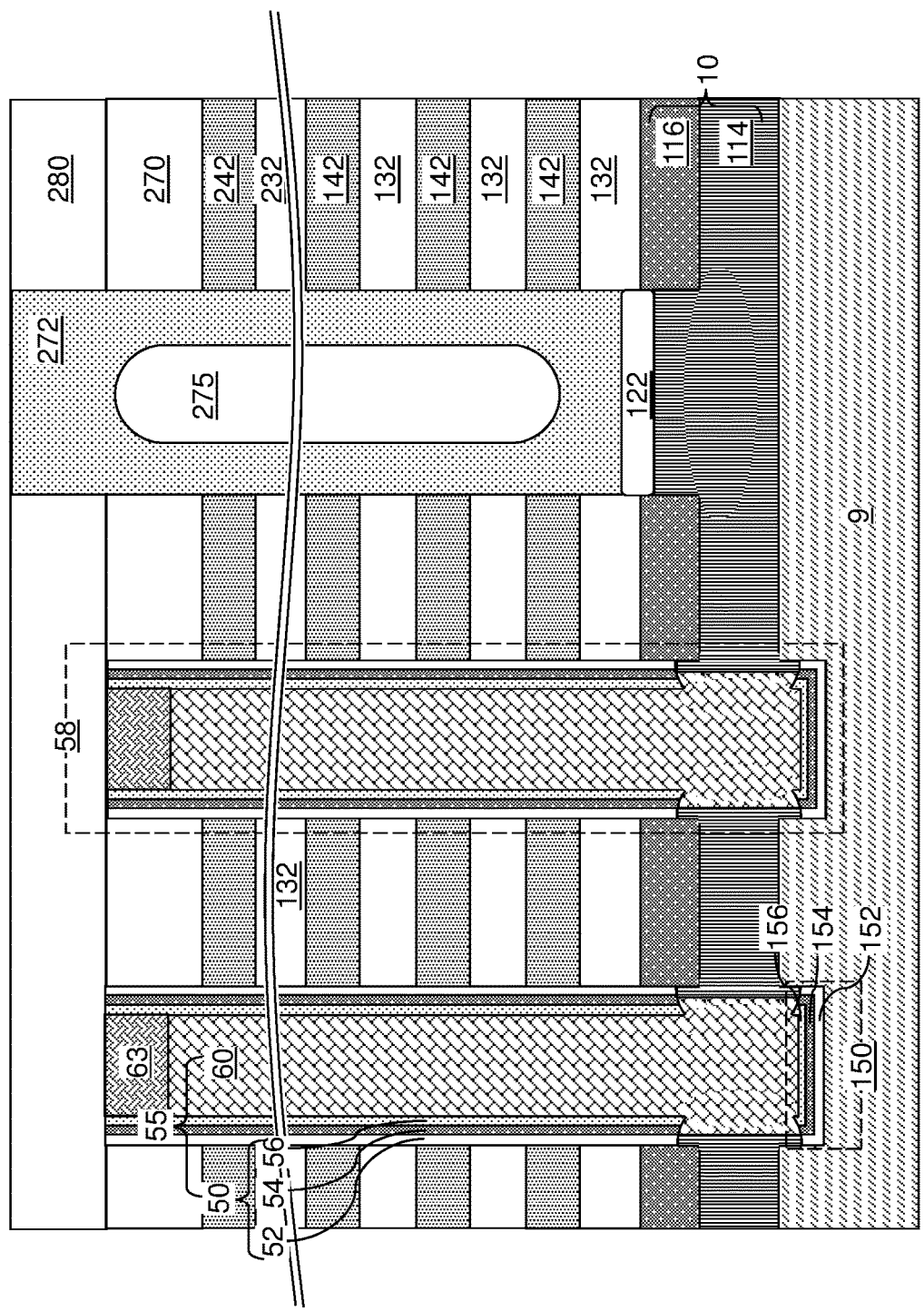
FIG. 18 illustrates a vertical cross-sectional view of memory opening fill structures in a third alternative configuration according to an embodiment of the present disclosure.

Referring to FIG. 18, a third alternative embodiment configuration of the exemplary structure may be derived from the exemplary structure illustrated in FIG. 15B by isotropically laterally recessing the epitaxial source semiconductor layer 114 such that recessed cylindrical surfaces of the epitaxial source semiconductor layer 114 are located between an inner sidewall of a respective overlying memory film 50 and an outer sidewall of a respective overlying memory film 50. In other words, the recessed cylindrical surfaces of the epitaxial source semiconductor layer 114 may have an upper periphery located within an annular bottom surface of an overlying memory film 50 between a bottom periphery of an inner cylindrical sidewall of the overlying memory film 50 and an outer cylindrical sidewall of the overlying memory film 50. The epitaxial vertical semiconductor channels 60 may grow from cylindrical surfaces of the epitaxial source semiconductor layer 114.

Figure 19:
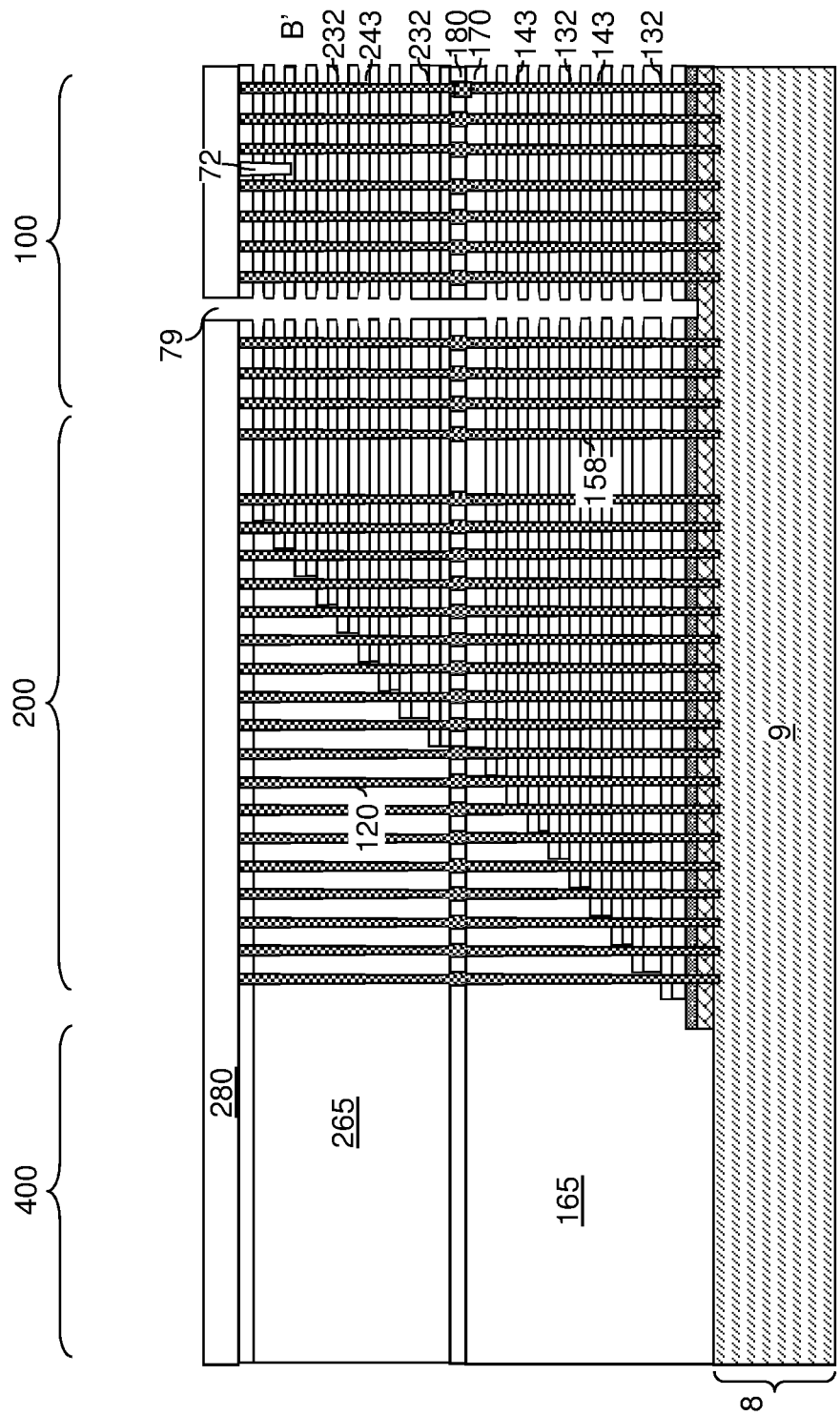
FIG. 19 is a vertical cross-sectional view of the exemplary structure after formation of backside recesses according to an embodiment of the present disclosure.

Referring to FIG. 19, the sacrificial wall structures 272 may be removed selective to the alternating stacks {(132, 142), (232, 242), the first contact-level dielectric layer 280, and the dielectric semiconductor oxide plates 122. In case the sacrificial wall structures 272 includes organosilicate glass or borosilicate glass, a wet etch process using dilute hydrofluoric acid may be used. If trench cavities 275 are present within the sacrificial wall structures 272, removal of the sacrificial wall structures 272 may be accelerated through access of an etchant to a bottom portion of the sacrificial wall structure through the trench cavities 275. If the sacrificial wall structures 272 include a semiconductor material, a wet etch process that etches a semiconductor material may be used to remove the sacrificial wall structures 272. Voids are formed in the volumes of the backside trenches above the dielectric semiconductor oxide plates 122.

The sacrificial material layers (142, 242) may be removed selective to the insulating layers (132, 232), the first and second insulating cap layers (170, 270), the sacrificial cover dielectric layer 271, and the source contact layer 114, and the dielectric semiconductor oxide plates 122. For example, an etchant that selectively etches the materials of the sacrificial material layers (142, 242) with respect to the materials of the insulating layers (132, 232), the first and second insulating cap layers (170, 270), the retro-stepped dielectric material portions (165, 265), and the material of the outermost layer of the memory films 50 may be introduced into the backside trenches 79, for example, using an isotropic etch process. For example, the sacrificial material layers (142, 242) may include silicon nitride, the materials of the insulating layers (132, 232), the first and second insulating cap layers (170, 270), the retro-stepped dielectric material portions (165, 265), and the outermost layer of the memory films 50 may include silicon oxide materials.

The isotropic etch process may be a wet etch process using a wet etch solution, or may be a gas phase (dry) etch process in which the etchant is introduced in a vapor phase into the backside trenches 79. For example, if the sacrificial material layers (142, 242) include silicon nitride, the etch process may be a wet etch process in which the exemplary structure is immersed within a wet etch tank including phosphoric acid, which etches silicon nitride selective to silicon oxide, silicon, and various other materials used in the art.

Backside recesses (143, 243) may be formed in volumes from which the sacrificial material layers (142, 242) are removed. The backside recesses (143, 243) may include first backside recesses 143 that are formed in volumes from which the first sacrificial material layers 142 are removed and second backside recesses 243 that are formed in volumes from which the second sacrificial material layers 242 are removed. Each of the backside recesses (143, 243) may be a laterally extending cavity having a lateral dimension that is greater than the vertical extent of the cavity. In other words, the lateral dimension of each of the backside recesses (143, 243) may be greater than the height of the respective backside recess (143, 243). A plurality of backside recesses (143, 243) may be formed in the volumes from which the material of the sacrificial material layers (142, 242) is removed. Each of the backside recesses (143, 243) may extend substantially parallel to the top surface of the single crystalline semiconductor layer 9. A backside recess (143, 243) may be vertically bounded by a top surface of an underlying insulating layer (132, 232) and a bottom surface of an overlying insulating layer (132, 232). In one embodiment, each of the backside recesses (143, 243) may have a uniform height throughout. The memory opening fill structures 58 and support pillar structures 20 (which are derived from the in-process support pillar structures 120 and may have the same set of component material portions as a memory opening fill structure 58) provide structural support while the backside recesses (143, 243) are present in the exemplary structure.

Figure 20A:
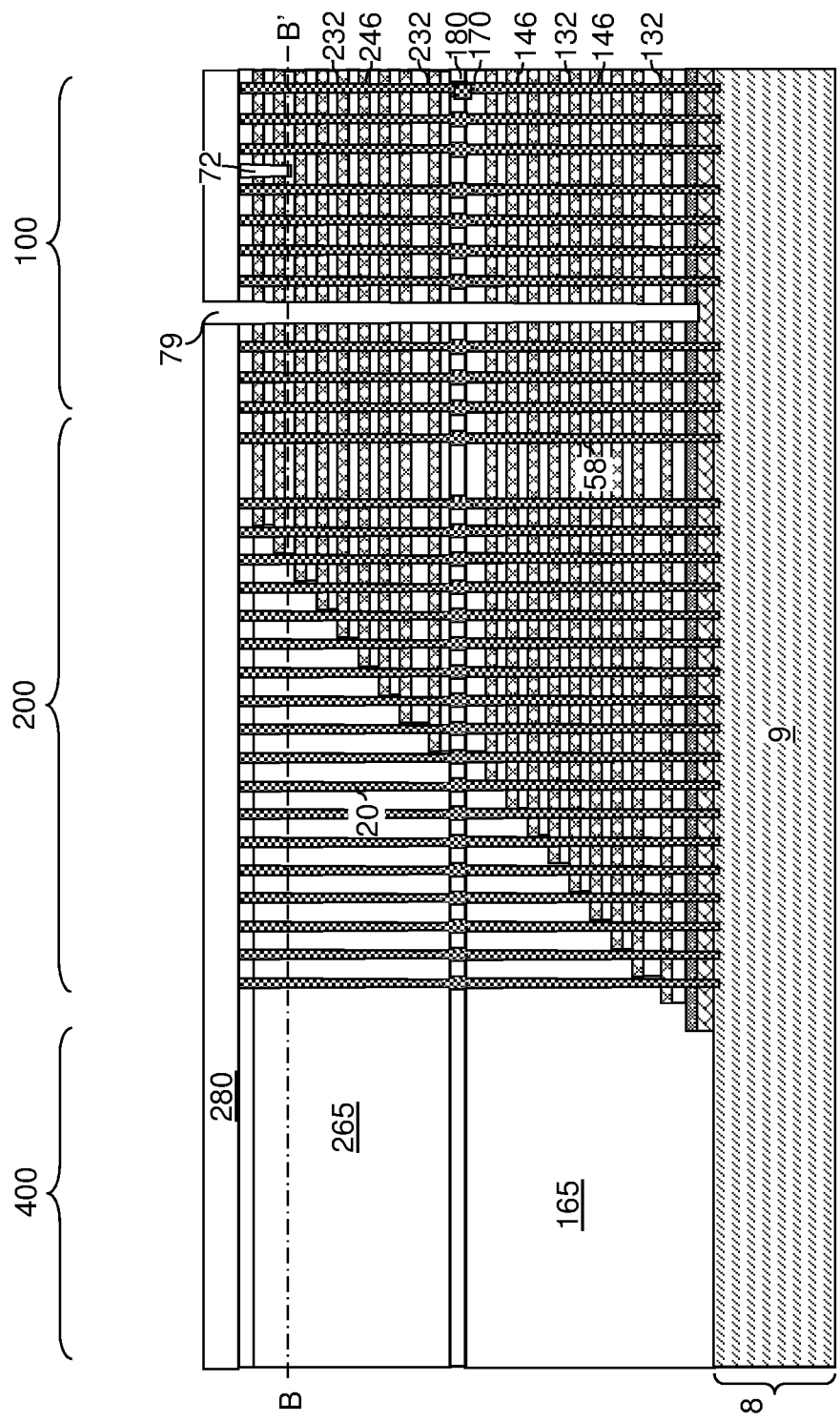
FIG. 20A is a vertical cross-sectional view of the exemplary structure after formation of electrically conductive layers according to an embodiment of the present disclosure.
Figure 20B:
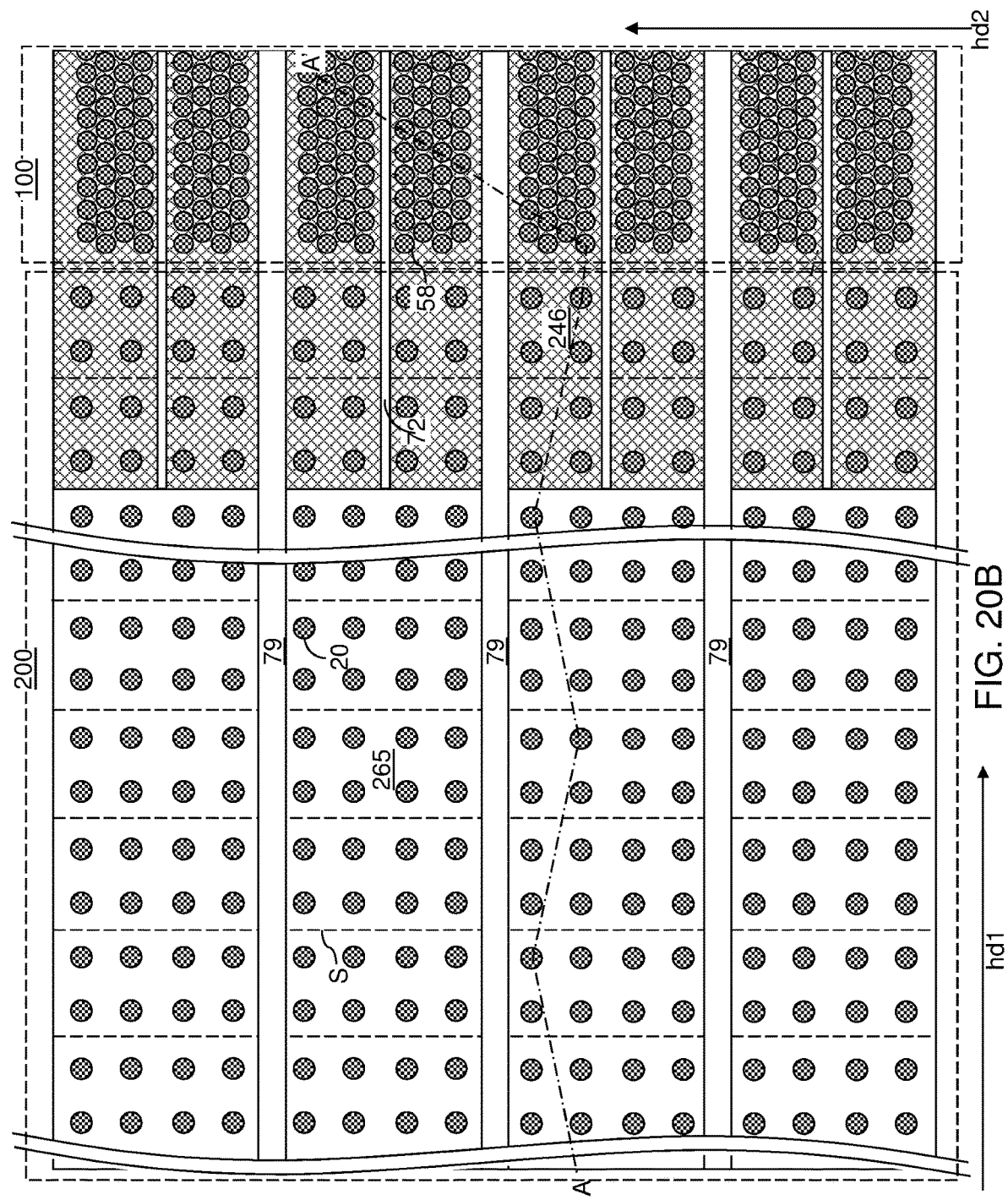
FIG. 20B is a horizontal cross-sectional view of the exemplary structure along the horizontal plane B-B' of FIG. 20A. The hinged vertical plane A-A' corresponds to the plane of the vertical cross-sectional view of FIG. 20A.

Referring to FIGS. 20A and 20B, a backside blocking dielectric layer (not shown) may be optionally deposited in the backside recesses (143, 243) and the backside trenches 79 and over the first contact-level dielectric layer 280. The backside blocking dielectric layer includes a dielectric material such as a dielectric metal oxide, silicon oxide, or a combination thereof. For example, the backside blocking dielectric layer may include aluminum oxide. The backside blocking dielectric layer may be formed by a conformal deposition process such as atomic layer deposition or chemical vapor deposition. The thickness of the backside blocking dielectric layer may be in a range from 1 nm to 20 nm, such as from 2 nm to 10 nm, although lesser and greater thicknesses may also be used.

At least one conductive material may be deposited in the plurality of backside recesses (143, 243), on the sidewalls of the backside trenches 79, and over the first contact-level dielectric layer 280. The at least one conductive material may be deposited by a conformal deposition method, which may be, for example, chemical vapor deposition (CVD), atomic layer deposition (ALD), electroless plating, electroplating, or a combination thereof. The at least one conductive material may include an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof.

In one embodiment, the at least one conductive material may include at least one metallic material, i.e., an electrically conductive material that includes at least one metallic element. Non-limiting exemplary metallic materials that may be deposited in the backside recesses (143, 243) include tungsten, tungsten nitride, titanium, titanium nitride, tantalum, tantalum nitride, cobalt, and ruthenium. For example, the at least one conductive material may include a conductive metallic nitride liner that includes a conductive metallic nitride material such as TiN, TaN, WN, or a combination thereof, and a conductive fill material such as W, Co, Ru, Mo, Cu, or combinations thereof. In one embodiment, the at least one conductive material for filling the backside recesses (143, 243) may be a combination of titanium nitride layer and a tungsten fill material.

Electrically conductive layers (146, 246) may be formed in the backside recesses (143, 243) by deposition of the at least one conductive material. A plurality of first electrically conductive layers 146 may be formed in the plurality of first backside recesses 143, a plurality of second electrically conductive layers 246 may be formed in the plurality of second backside recesses 243, and a continuous metallic material layer (not shown) may be formed on the sidewalls of each backside trench 79 and over the first contact-level dielectric layer 280. Each of the first electrically conductive layers 146 and the second electrically conductive layers 246 may include a respective conductive metallic nitride liner and a respective conductive fill material. Thus, the first and second sacrificial material layers (142, 242) may be replaced with the first and second electrically conductive layers (146, 246), respectively. Specifically, each first sacrificial material layer 142 may be replaced with an optional portion of the backside blocking dielectric layer and a first electrically conductive layer 146, and each second sacrificial material layer 242 may be replaced with an optional portion of the backside blocking dielectric layer and a second electrically conductive layer 246. A backside cavity is present in the portion of each backside trench 79 that is not filled with the continuous metallic material layer.

Residual conductive material may be removed from inside the backside trenches 79. Specifically, the deposited metallic material of the continuous metallic material layer may be etched back from the sidewalls of each backside trench 79 and from above the first contact-level dielectric layer 280, for example, by an anisotropic or isotropic etch. Each remaining portion of the deposited metallic material in the first backside recesses constitutes a first electrically conductive layer 146. Each remaining portion of the deposited metallic material in the second backside recesses constitutes a second electrically conductive layer 246. Sidewalls of the first electrically conductive material layers 146 and the second electrically conductive layers may be physically exposed to a respective backside trench 79. The backside trenches may have a pair of curved sidewalls having a non-periodic width variation along the first horizontal direction hd1 and a non-linear width variation along the vertical direction.

Each electrically conductive layer (146, 246) may be a conductive sheet including openings therein. A first subset of the openings through each electrically conductive layer (146, 246) may be filled with memory opening fill structures 58. A second subset of the openings through each electrically conductive layer (146, 246) may be filled with the support pillar structures 20. Each electrically conductive layer (146, 246) may have a lesser area than any underlying electrically conductive layer (146, 246) because of the first and second stepped surfaces. Each electrically conductive layer (146, 246) may have a greater area than any overlying electrically conductive layer (146, 246) because of the first and second stepped surfaces.

In some embodiment, drain-select-level isolation structures 72 may be provided at topmost levels of the second electrically conductive layers 246. A subset of the second electrically conductive layers 246 located at the levels of the drain-select-level isolation structures 72 constitutes drain select gate electrodes. A subset of the electrically conductive layer (146, 246) located underneath the drain select gate electrodes may function as combinations of a control gate and a word line located at the same level. The control gate electrodes within each electrically conductive layer (146, 246) are the control gate electrodes for a vertical memory device including the memory stack structure 55.

Each of the memory opening fill structures 58 may comprise a vertical stack of memory elements located at each level of the electrically conductive layers (146, 246). A subset of the electrically conductive layers (146, 246) may comprise word lines for the memory elements. The semiconductor devices in the underlying peripheral device region 400 may comprise word line switch devices configured to control a bias voltage to respective word lines. The memory-level assembly may be located over the single crystalline semiconductor layer 9. The memory-level assembly includes at least one alternating stack (132, 146, 232, 246) and memory opening fill structures 58 vertically extending through the at least one alternating stack (132, 146, 232, 246).

Figure 21A:
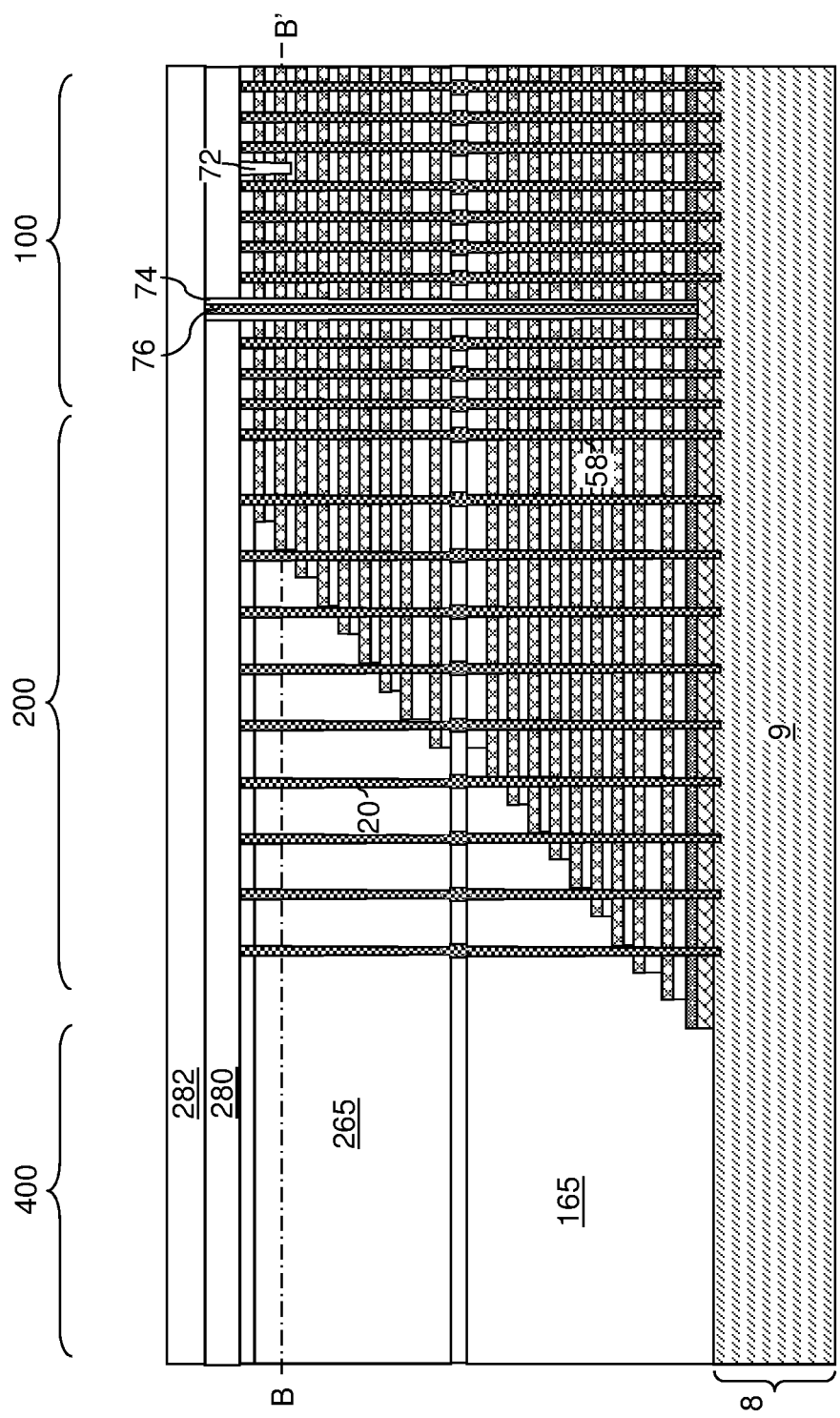
FIG. 21A is a vertical cross-sectional view of the exemplary structure after formation of backside contact via structures in the backside trenches according to an embodiment of the present disclosure.
Figure 21B:
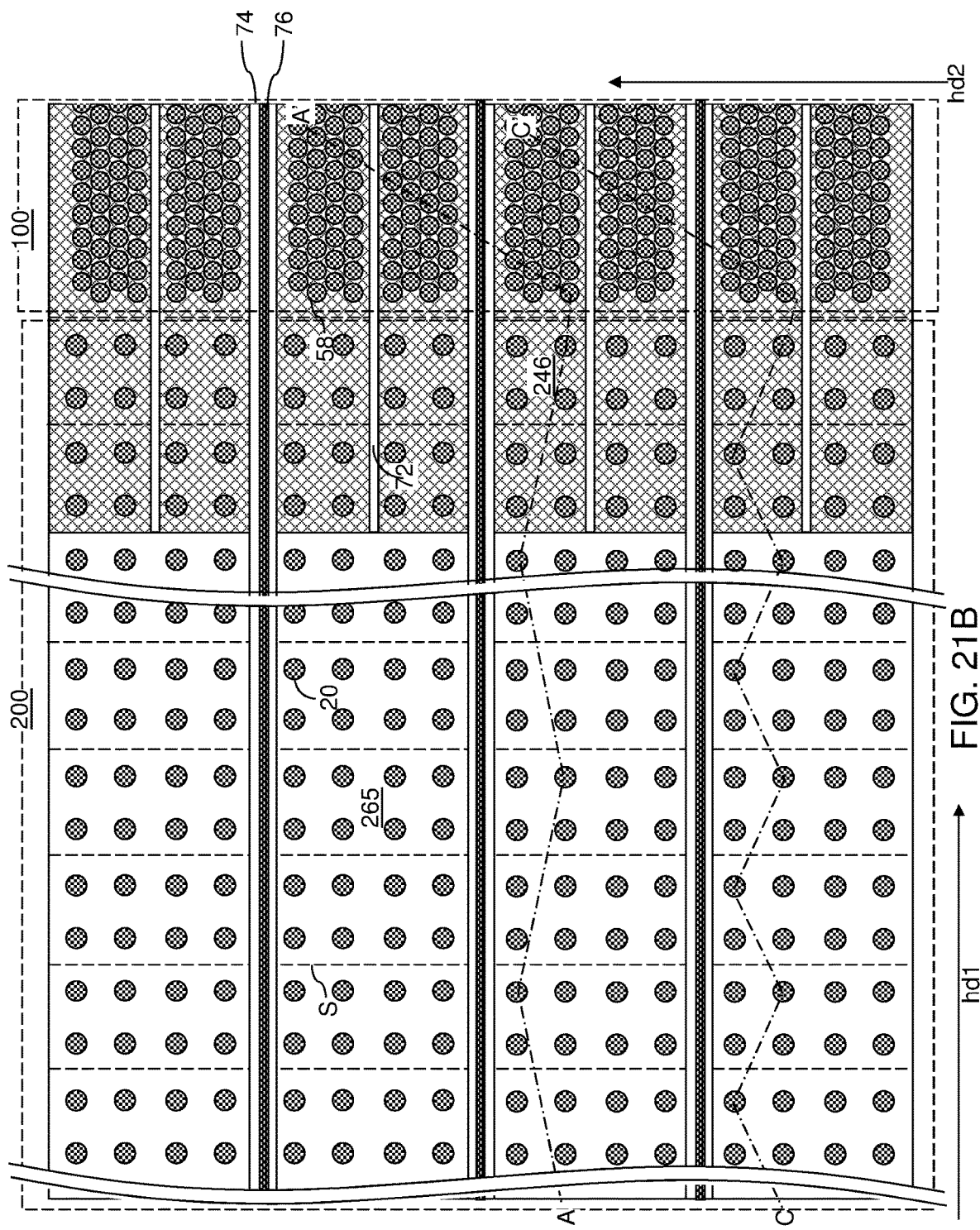
FIG. 21B is a horizontal cross-sectional view of the exemplary structure along the horizontal plane B-B' of FIG. 21A. The hinged vertical plane A-A' corresponds to the plane of the vertical cross-sectional view of FIG. 21A.
Figure 21C:
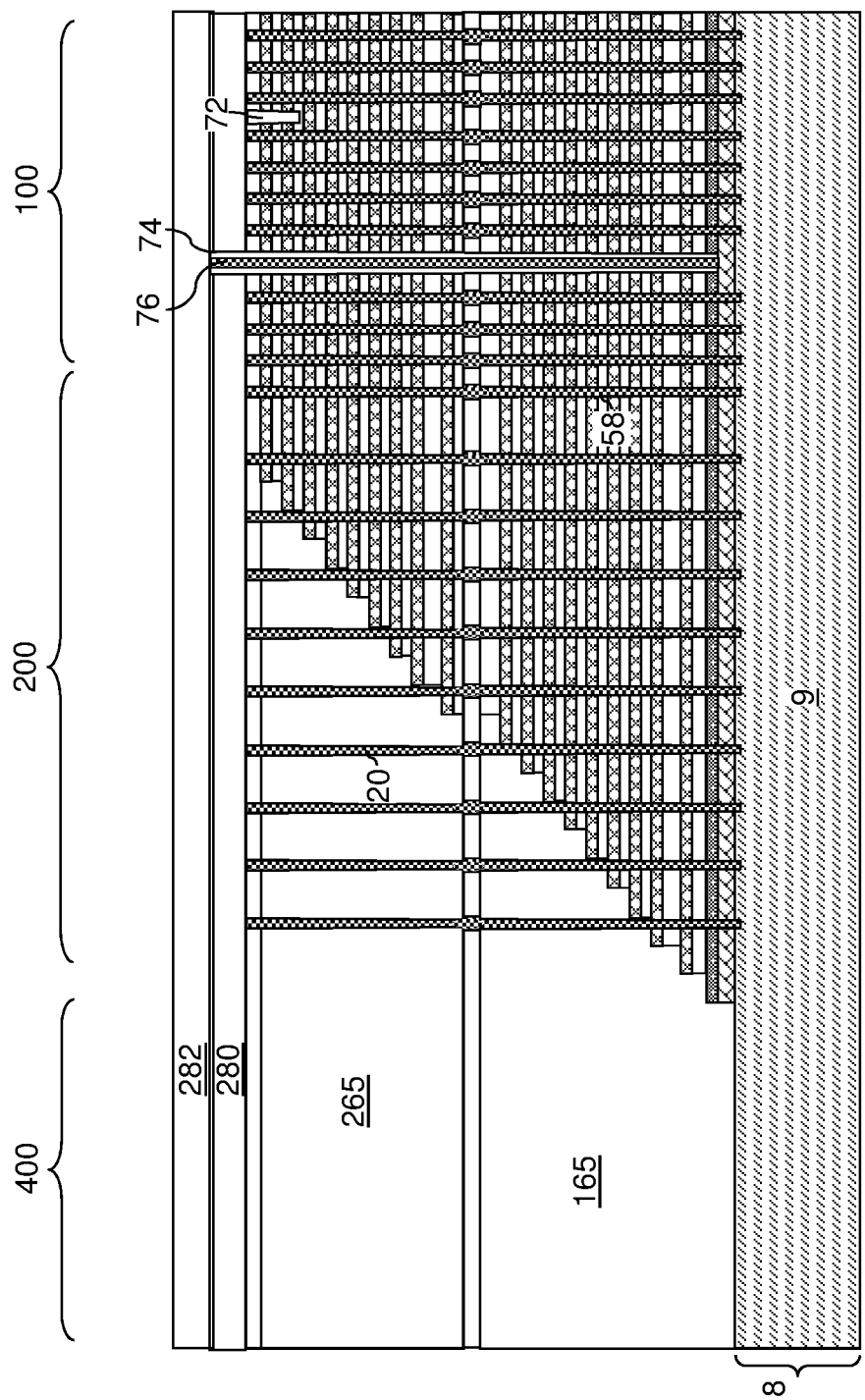
FIG. 21C is a vertical cross-sectional view of the exemplary structure along the vertical plane C-C' of FIG. 21B.

Referring to FIGS. 21A-21C, a dielectric material may be conformally deposited in the backside trenches 79 and over the first contact-level dielectric layer 280 by a conformal deposition process. The dielectric material may include, for example, silicon oxide. An anisotropic etch is performed to remove horizontal portions of the insulating material layer from above the first contact-level dielectric layer 280 and at the bottom of each trench 79. Each remaining portion of the insulating material layer may constitute an insulating spacer 74. A backside contact via structure (i.e., local interconnect) 76 for the epitaxial source semiconductor layer (e.g., buried source line) 114 may be formed within each backside cavity remaining the backside trench 79. The contact via structures 76 may be formed by depositing at least one conductive material in the remaining unfilled volume (i.e., the backside cavity) of the backside trench 79. For example, the at least one conductive material may include a conductive liner and a conductive fill material portion. The conductive liner may include a conductive metallic liner such as TiN, TaN, WN, TiC, TaC, WC, an alloy thereof, or a stack thereof. The thickness of the conductive liner may be in a range from 3 nm to 30 nm, although lesser and greater thicknesses may also be used. The conductive fill material portion may include a metal or a metallic alloy. For example, the conductive fill material portion may include W, Cu, Al, Co, Ru, Ni, an alloy thereof, or a stack thereof.

An optional second contact-level dielectric layer 282 may be formed over the first contact-level dielectric layer 280. The second contact-level dielectric layer 282 includes a dielectric material such as silicon oxide, and may have a thickness in a range from 100 nm to 600 nm, although lesser and greater thicknesses may also be used.

Figure 22A:
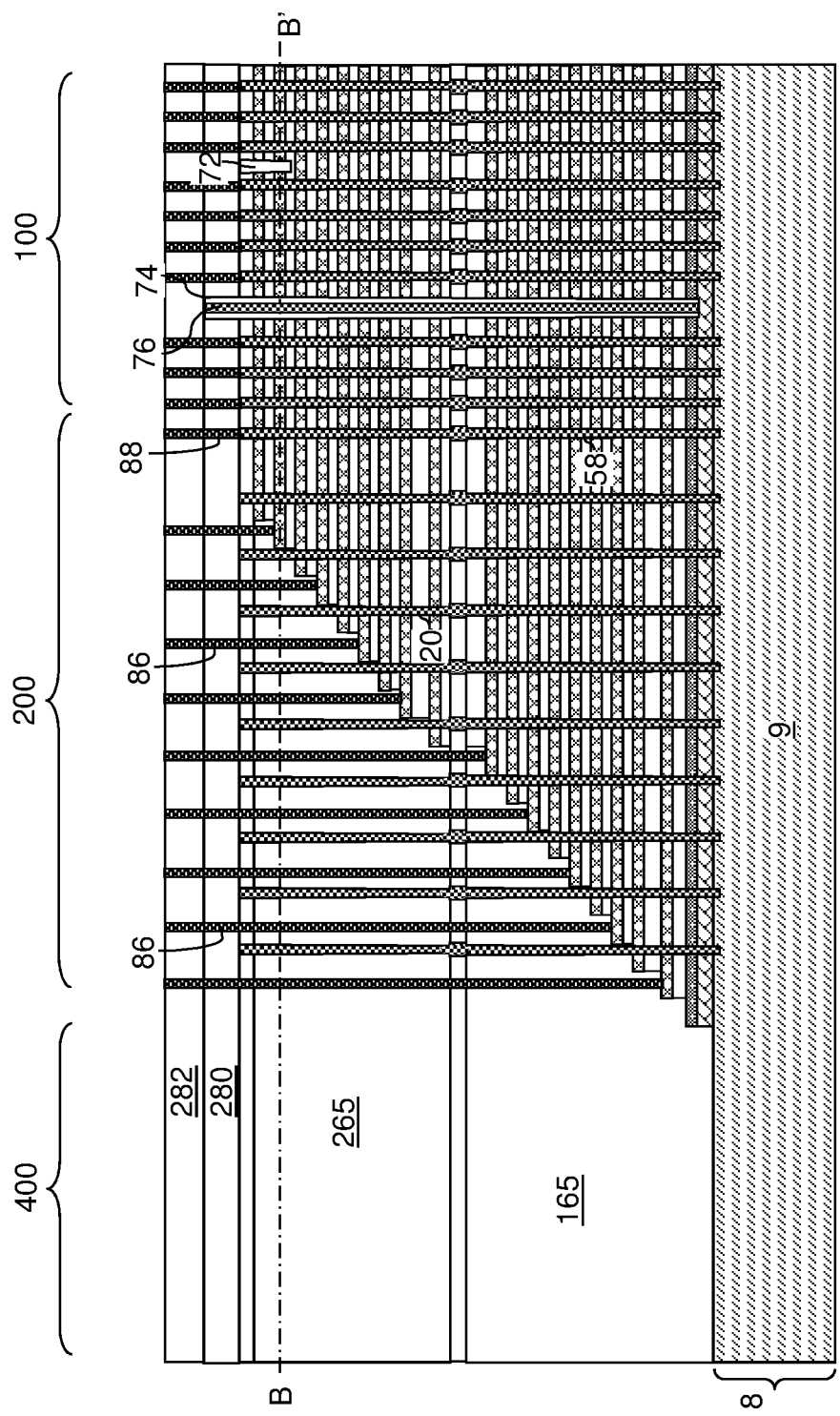
FIG. 22A is a vertical cross-sectional view of the exemplary structure after formation of a second contact-level dielectric layer and various contact via structures according to an embodiment of the present disclosure.
Figure 22B:
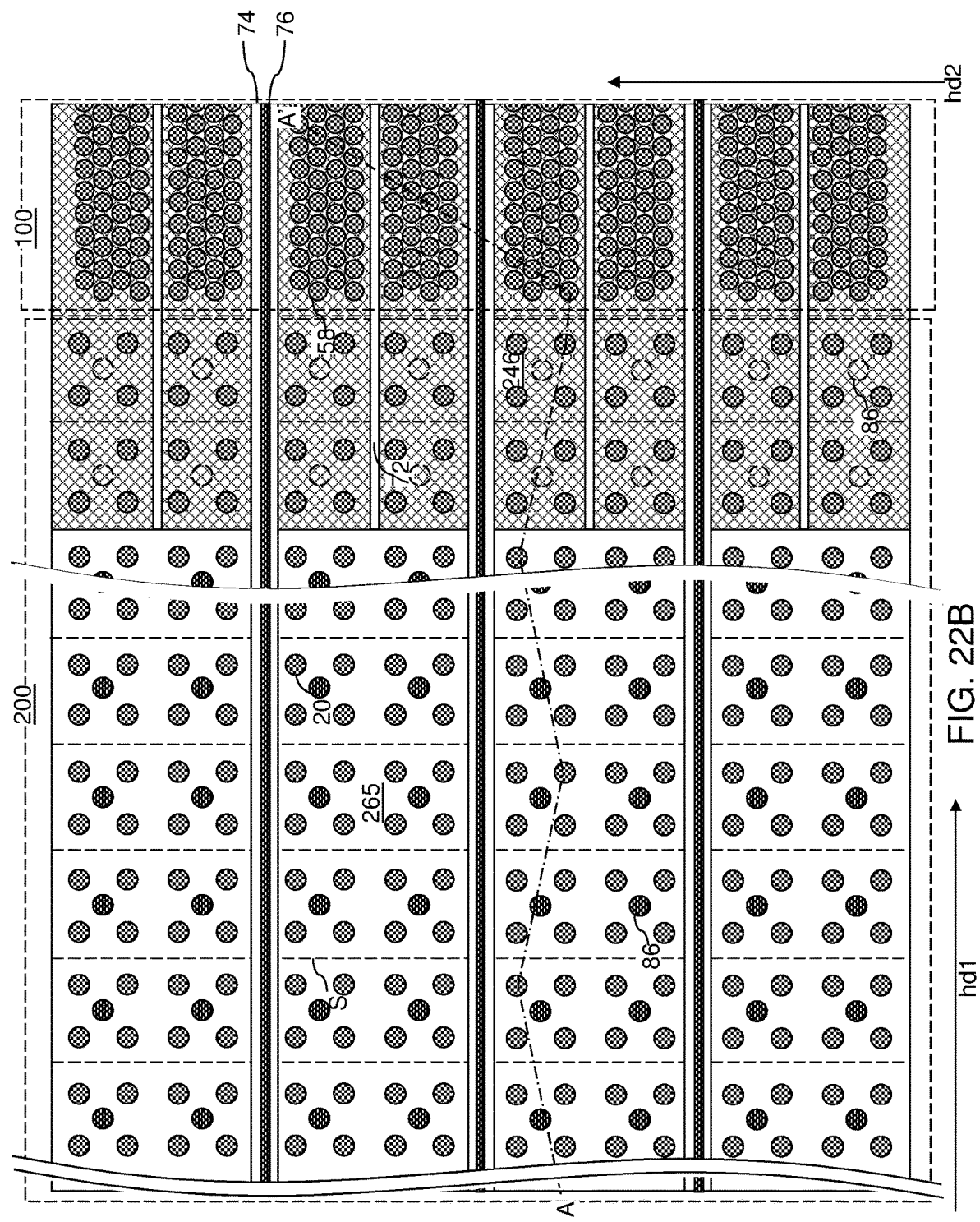
FIG. 22B is a horizontal cross-sectional view of the exemplary structure along the vertical plane B-B' of FIG. 22A. The hinged vertical plane A-A' corresponds to the plane of the vertical cross-sectional view of FIG. 22A.

Referring to FIGS. 22A and 22B, a photoresist layer (not shown) may be applied over the second contact-level dielectric layer 282, and may be lithographically patterned to form various contact via openings. For example, openings for forming drain contact via structures may be formed in the memory array region 100, and openings for forming staircase region contact via structures may be formed in the staircase region 200. An anisotropic etch process may be performed to transfer the pattern in the photoresist layer through the second and first contact-level dielectric layers (282, 280) and underlying dielectric material portions. The drain regions 63 and the electrically conductive layers (146, 246) may be used as etch stop structures. Drain contact via cavities may be formed over each drain region 63, and staircase-region contact via cavities may be formed over each electrically conductive layer (146. 246) at the stepped surfaces underlying the first and second retro-stepped dielectric material portions (165, 265). The photoresist layer may be subsequently removed, for example, by ashing.

Drain contact via structures 88 may be formed in the drain contact via cavities and on a top surface of a respective one of the drain regions 63. Staircase-region contact via structures 86 may be formed in the staircase-region contact via cavities and on a top surface of a respective one of the electrically conductive layers (146, 246). The staircase-region contact via structures 86 may include drain select level contact via structures that contact a subset of the second electrically conductive layers 246 that function as drain select level gate electrodes. Further, the staircase-region contact via structures 86 may include word line contact via structures that contact electrically conductive layers (146, 246) that underlie the drain select level gate electrodes and function as word lines for the memory opening fill structures 58.

Figure 23A:
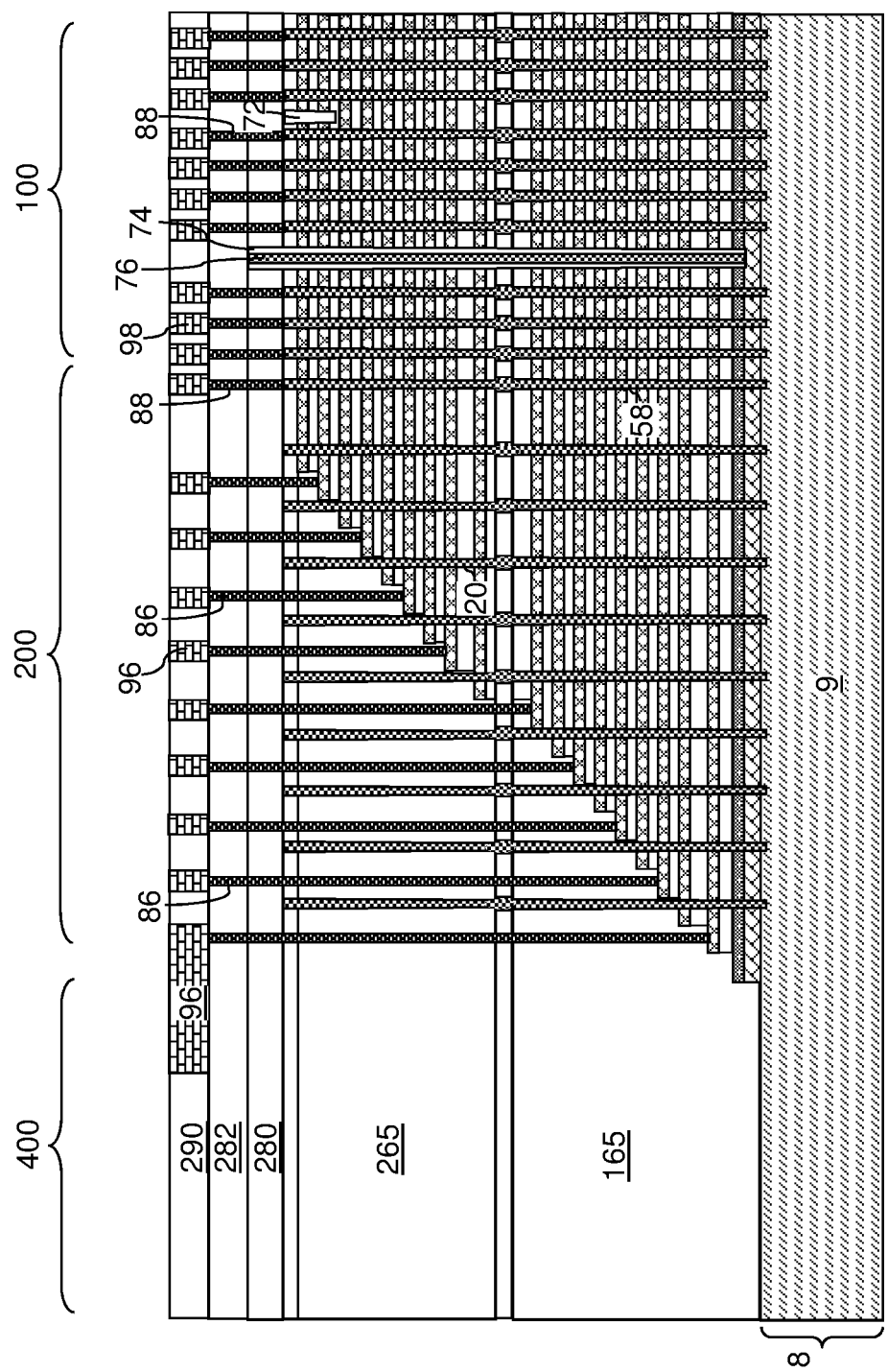
FIG. 23A is a vertical cross-sectional view of the exemplary structure after formation of through-memory-level via structures and upper metal line structures according to an embodiment of the present disclosure.
Figure 23B:
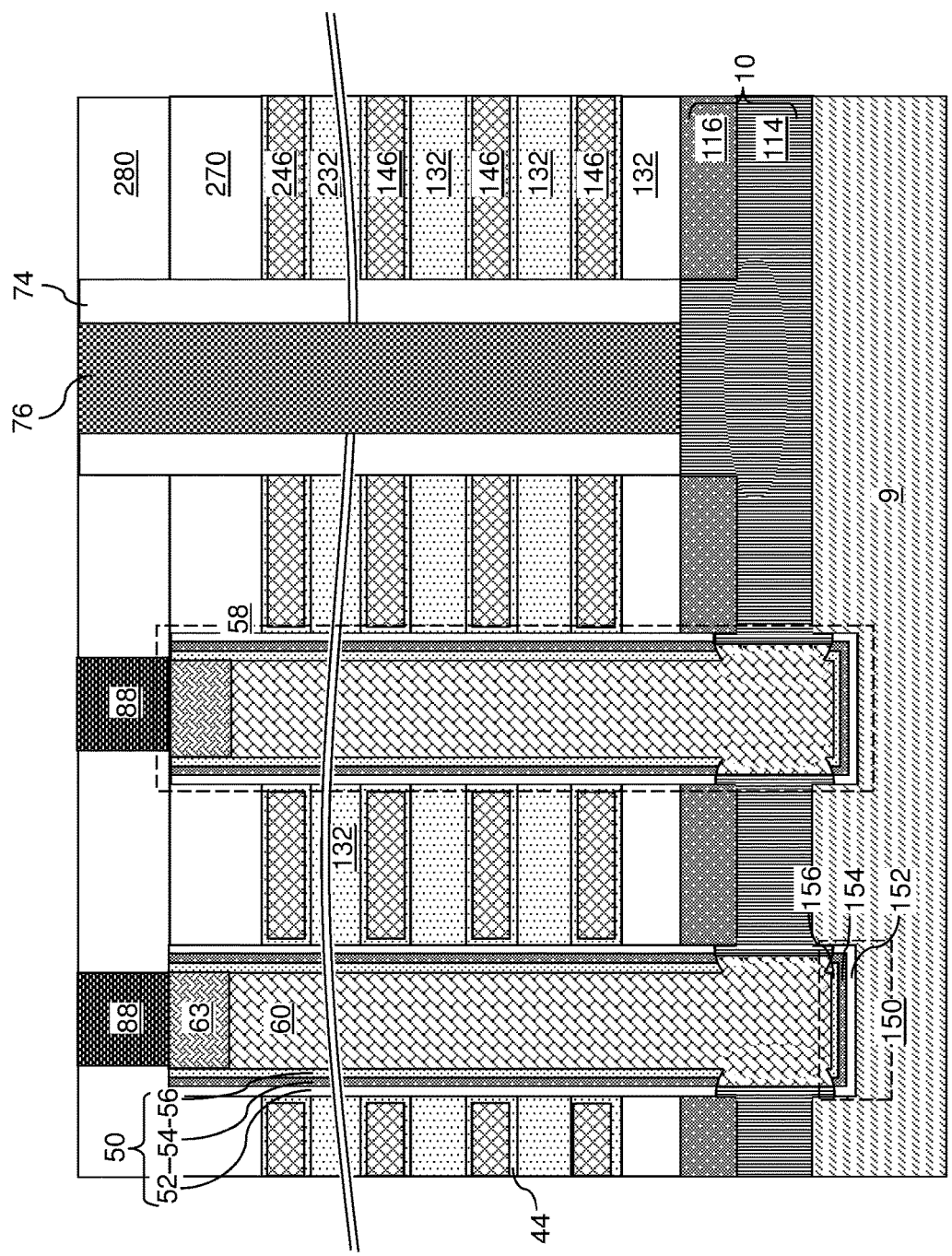
FIG. 23B is a vertical cross-sectional views of memory openings and a backside trench within the exemplary structure of FIG. 23A.

Referring to FIGS. 23A and 23B, at least one additional dielectric layer may be formed over the contact-level dielectric layers (280, 282), and additional metal interconnect structures (herein referred to as upper-level metal interconnect structures) may be formed in the at least one additional dielectric layer. For example, the at least one additional dielectric layer may include a line-level dielectric layer 290 that is formed over the contact-level dielectric layers (280, 282). The upper-level metal interconnect structures may include bit lines 98 contacting a respective one of the drain contact via structures 88, and interconnection line structures 96 contacting, and/or electrically connected to, at least one of the staircase-region contact via structures 86. A backside blocking dielectric layer 44 may be located between each vertically neighboring pair of an insulating layer (132, 232) and an electrically conductive layer (146, 246) within the alternating stack {(132, 146), (232, 246)}, and between each electrically conductive layer (146, 246) of the alternating stack {(132, 146), (232, 246)} and the memory film 50.

Referring to all drawings and according to various embodiments of the present disclosure, a three-dimensional memory device is provided, which comprises: an alternating stack of insulating layers (132, 232) and electrically conductive layers (146, 246) located over a single crystalline semiconductor layer 9; a single crystal epitaxial source semiconductor layer 114 located between the single crystalline semiconductor layer 9 and the alternating stack {(132, 146), (232, 246)} and epitaxially aligned to the single crystalline semiconductor layer 9; and a memory stack structure 55 vertically extending through the alternating stack {(132, 146), (232, 246)} and comprising a memory film 50 and an epitaxial vertical semiconductor channel 60 including a single crystal semiconductor material that is epitaxially aligned to the epitaxial source semiconductor layer 114 at a first interface. The first interface may be a cylindrical interface if the memory openings 49 have a cylindrical horizontal cross sectional shape. The first interface may be a polygonal (e.g., rectangular or square) interface if the memory openings 49 have a polygonal horizontal cross sectional shape.

In one embodiment, the memory film 50 comprises a first layer stack including, from outside to inside, a charge storage layer 54 and a tunneling dielectric layer 56 that contacts the epitaxial vertical semiconductor channel 60. In one embodiment, the three-dimensional memory device comprises a dielectric cap structure 150 contacting a bottom surface of the epitaxial vertical semiconductor channel 60 and vertically spaced from the memory film 50 by the first interface, wherein the dielectric cap structure 150 comprises a second layer stack including a charge storage material layer 154 having a same composition and a same thickness as the charge storage layer 54 and a tunneling dielectric material layer 156 having a same composition and a same thickness as the tunneling dielectric layer 56.

In one embodiment, the single crystalline semiconductor layer 9 comprises an entirety of a single crystal silicon wafer 8 or an entirety of a top single crystal silicon material layer 9 of a silicon-on-insulator (SOI) substrate 8, the epitaxial source semiconductor layer 114 comprises a single crystal silicon layer, and the epitaxial vertical semiconductor channel 60 comprises a single crystal silicon channel.

In one embodiment, the three-dimensional memory device comprises a source-level dielectric layer 116 in contact with a top surface of the epitaxial source semiconductor layer 114 and a bottom surface of the alternating stack {(132, 146), (232, 246)}. In one embodiment, a backside contact via structure 76 may laterally extend along a first horizontal direction hd1, and vertically extend through each layer within the alternating stack {(132, 146), (232, 246)}.

In one embodiment, a cylindrical sidewall of the epitaxial vertical semiconductor channel 60 contacts an inner cylindrical sidewall of the memory film 50. In one embodiment, the first interface comprises a first p-n junction. In one embodiment, the three-dimensional memory device comprises a drain region 63 contacting a top surface of the epitaxial vertical semiconductor channel 60 and comprising a same semiconductor material as the epitaxial vertical semiconductor channel 60, wherein a second p-n junction is located at an interface between the epitaxial vertical semiconductor channel 60 and the drain region 63.

In one embodiment, the first interface between the epitaxial source semiconductor layer 114 and the epitaxial vertical semiconductor channel 60 is vertically coincident with an inner cylindrical sidewall of the memory film 50.

In one embodiment, the first interface contacts an annular bottom surface of the memory film 50 between a bottom periphery of an inner cylindrical sidewall of the memory film 50 and an outer cylindrical sidewall of the memory film 50.

In one embodiment, a bottom periphery of the first interface contacts a top surface of the single crystalline semiconductor layer 9.

In one embodiment, the three-dimensional memory device comprises a monolithic three-dimensional NAND memory device, the electrically conductive layers (146, 246) comprise, or are electrically connected to, a respective word line of the monolithic three-dimensional NAND memory device. The monolithic three-dimensional NAND memory device comprises an array of monolithic three-dimensional NAND strings over a single crystalline silicon substrate, and at least one memory cell in a first device level of the array of monolithic three-dimensional NAND strings is located over another memory cell in a second device level of the array of monolithic three-dimensional NAND strings.

The epitaxial vertical semiconductor channels 60 of the present disclosure provide higher charge mobility compared to polycrystalline semiconductor channels known in the art. By providing a higher charge carrier mobility, the drive current of each NAND string through a respective epitaxial vertical semiconductor channel 60 may be enhanced, and/or vertical stacking of a higher number of insulating layers and electrically conductive layers is provided.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:
an alternating stack of insulating layers and electrically conductive layers located over a single crystalline semiconductor layer;
a single crystal epitaxial source semiconductor layer located between the single crystalline semiconductor layer and the alternating stack and epitaxially aligned to the single crystalline semiconductor layer; and
a memory stack structure vertically extending through the alternating stack and comprising a memory film and an epitaxial vertical semiconductor channel including a single crystal semiconductor material that is epitaxially aligned to the epitaxial source semiconductor layer at a first interface.

2. The three-dimensional memory device of claim 1, wherein the memory film comprises a first layer stack including a charge storage layer and a tunneling dielectric layer that contacts the epitaxial vertical semiconductor channel.

3. The three-dimensional memory device of claim 2, further comprising a dielectric cap structure contacting a bottom surface of the epitaxial vertical semiconductor channel and vertically spaced from the memory film by the first interface, wherein the dielectric cap structure comprises a second layer stack including a charge storage material layer having a same composition and a same thickness as the charge storage layer and a tunneling dielectric material layer having a same composition and a same thickness as the tunneling dielectric layer.

4. The three-dimensional memory device of claim 1, wherein:
the single crystalline semiconductor layer comprises an entirety of a single crystal silicon wafer or an entirety of a top single crystal silicon material layer of a silicon-on-insulator (SOI) substrate;
the epitaxial source semiconductor layer comprises a single crystal silicon layer; and
the epitaxial vertical semiconductor channel comprises a single crystal silicon channel.

5. The three-dimensional memory device of claim 1, further comprising a source-level dielectric layer in contact with a top surface of the epitaxial source semiconductor layer and a bottom surface of the alternating stack.

6. The three-dimensional memory device of claim 5, further comprising a backside contact via structure laterally extending along a first horizontal direction, and vertically extending through each layer within the alternating stack.

7. The three-dimensional memory device of claim 1, wherein a sidewall of the epitaxial vertical semiconductor channel contacts an inner sidewall of the memory film.

8. The three-dimensional memory device of claim 1, wherein the first interface comprises a first p-n junction.

9. The three-dimensional memory device of claim 8, further comprising a drain region contacting a top surface of the epitaxial vertical semiconductor channel and comprising a same semiconductor material as the epitaxial vertical semiconductor channel, wherein a second p-n junction is located at a second interface between the epitaxial vertical semiconductor channel and the drain region.

10. The three-dimensional memory device of claim 1, wherein the first interface between the epitaxial source semiconductor layer and the epitaxial vertical semiconductor channel is vertically coincident with an inner cylindrical sidewall of the memory film.

11. The three-dimensional memory device of claim 1, wherein the first interface contacts an annular bottom surface of the memory film between a bottom periphery of an inner cylindrical sidewall of the memory film and an outer cylindrical sidewall of the memory film.

12. The three-dimensional memory device of claim 1, wherein a bottom periphery of the first interface contacts a top surface of the single crystalline semiconductor layer.

13. The three-dimensional memory device of claim 1, wherein a backside blocking dielectric layer is located between each vertically neighboring pair of an insulating layer and an electrically conductive layer within the alternating stack, and between each electrically conductive layer of the alternating stack and the memory film.

14. A method of forming a three-dimensional semiconductor device, comprising:
forming a source-level sacrificial layer over a single crystalline semiconductor layer;
forming an alternating stack of insulating layers and sacrificial material layers over the source-level sacrificial layer;
forming a memory opening through the alternating stack;
forming an in-process memory opening fill structure comprising a memory film and a sacrificial fill structure in the memory opening;
forming a source cavity by removing the source-level sacrificial layer selective to a material in the in-process memory opening fill structure;
forming an epitaxial source semiconductor layer in the source cavity by growing a first epitaxial semiconductor material in the source cavity using a first selective epitaxy process;
forming a memory cavity by removing the sacrificial fill structure selective to the memory film and the epitaxial source semiconductor layer;
forming an epitaxial vertical semiconductor channel in the memory cavity by growing a second epitaxial semiconductor material from surfaces of the epitaxial source semiconductor layer through the memory cavity; and
replacing the sacrificial material layers with electrically conductive layers.

15. The method of claim 14, further comprising:
forming a backside trench through the alternating stack, wherein a surface of the source-level sacrificial layer is physically exposed to the backside trench; and
isotropically etching a material of the source-level sacrificial layer selective to materials of the insulating layers and the sacrificial material layers, wherein the source cavity comprises a void formed by removal of the source-level sacrificial layer.

16. The method of claim 15, further comprising isotropically removing an annular portion of the memory film by providing at least one isotropic etchant into a volume of the void formed by removal of the source-level sacrificial layer, wherein:
a material portion within the in-process memory opening fill structure is physically exposed; and
the source cavity comprises the void formed by removal of the source-level sacrificial layer and a volume from which the annular portion of the memory film is removed.

17. The method of claim 16, wherein the in-process memory opening fill structure comprises:
a semiconductor liner contacting an inner sidewall of the memory film;
a silicon oxide liner contacting an inner sidewall of the semiconductor liner; and
a sacrificial core fill portion located within the silicon oxide liner.

18. The method of claim 17, wherein the material portion within the in-process memory opening fill structure comprises a cylindrical portion of an outer sidewall of the silicon oxide liner.

19. The method of claim 17, wherein removing the sacrificial fill structure selective to the memory film and the epitaxial source semiconductor layer comprises:
removing the sacrificial core fill portion selective to the silicon oxide liner;
removing the silicon oxide liner selective to the semiconductor liner; and
removing the semiconductor liner selective to the memory film.

20. The method of claim 15, further comprising:
forming a source-level layer stack including a source-level sacrificial liner, the source-level sacrificial layer, and a source-level dielectric layer over the single crystalline semiconductor layer, wherein the alternating stack is formed over the source-level layer stack; and
physically exposing a horizontal top surface of the single crystalline semiconductor layer by removing the source-level sacrificial liner after removal of the source-level sacrificial layer, wherein the first epitaxial semiconductor material is grown from the horizontal top surface of the single crystalline semiconductor layer.

* * * * *